(12) United States Patent
Eriguchi et al.

(10) Patent No.: US 6,580,091 B1
(45) Date of Patent: Jun. 17, 2003

(54) APPARATUS AND METHOD FOR OPTICAL EVALUATION, APPARATUS AND METHOD FOR MANUFACTURING SEMICONDUCTOR DEVICE, METHOD OF CONTROLLING APPARATUS FOR MANUFACTURING SEMICONDUCTOR DEVICE, AND SEMICONDUCTOR DEVICE

(75) Inventors: Koji Eriguchi, Osaka (JP); Takayuki Yamada, Osaka (JP); Masanori Okuyama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/610,432

(22) Filed: Jul. 5, 2000

Related U.S. Application Data

(62) Division of application No. 08/965,892, filed on Nov. 7, 1997, now Pat. No. 6,113,733.

(30) Foreign Application Priority Data

| Nov. 8, 1996 | (JP) | 8-296592 |
|---|---|---|
| Dec. 27, 1996 | (JP) | 8-350612 |
| Jan. 29, 1997 | (JP) | 9-015382 |
| Jul. 15, 1997 | (JP) | 9-189841 |

(51) Int. Cl.[7] .................................. H01L 23/58
(52) U.S. Cl. .................. 257/48; 356/302; 356/300; 356/301; 356/303; 356/310; 356/438; 356/16; 356/17; 257/620
(58) Field of Search .......... 257/48, 620; 356/300–334; 438/16, 17

(56) References Cited

U.S. PATENT DOCUMENTS

| 4,157,268 A | * 6/1979 | Bergeron et al. ............ 257/532 |
| 4,211,488 A | 7/1980 | Kleinknecht |
| 4,547,074 A | * 10/1985 | Hinoda et al. ............... 250/226 |

(List continued on next page.)

FOREIGN PATENT DOCUMENTS

| EP | 0655620 | | 11/1994 | |
| EP | 655620 A1 | * | 5/1995 | |
| EP | 0768512 | * | 4/1997 | |
| JP | 60035578 | * | 2/1985 | ............ 356/52 |
| JP | 62119422 | * | 5/1987 | ............ 356/43 |
| JP | 63222473 | * | 9/1988 | ............ 438/80 |

OTHER PUBLICATIONS

"Supervisory Run–To–Run Control of Polysilicon Gate Etch Using In Situ Ellipsometry", by Butlers et al., IEEE Transaction on Semiconductor Manufacturing, vol. 7, No. 2, May 1, 1995, pp. 193–201.

"Measurement of Damage Profile in Semiconductors: A Sensitive Optical Technique", by Shwe et al., Applied Physics Letters, vol. 62, No. 5, Feb. 1, 1993, pp. 516–518.

*Primary Examiner*—Eddie Lee
*Assistant Examiner*—Eugene Lee
(74) *Attorney, Agent, or Firm*—McDermott, Will & Emery

(57) ABSTRACT

A top surface of a wafer is provided with an n-type source region, an n-type drain region, and an n-type semiconductor region. Dry etching using a plasma is performed with respect to an interlayer insulating film deposited on the wafer to form openings reaching the respective regions, followed by light etching for removing a damaged layer. In this case, exciting light is supplied intermittently to the n-type semiconductor region. The progression of the removal of the damaged layer and the stage of development of a newly damaged layer are sensed by monitoring the change rate of the intensity of reflected probe light in the presence and absence of the exciting light, resulting in the formation of a semiconductor device having low and equal contact resistance. In-line control using optical evaluation enables the implementation of semiconductor devices with excellent and consistent properties.

6 Claims, 29 Drawing Sheets

U.S. PATENT DOCUMENTS

| | | |
|---|---|---|
| 4,652,757 A | 3/1987 | Carver |
| 4,750,822 A | 6/1988 | Rosencwaig et al. |
| 5,020,910 A * | 6/1991 | Dunn et al. .................. 356/328 |
| 5,260,772 A * | 11/1993 | Pollak et al. ................ 356/417 |
| 5,293,055 A * | 3/1994 | Hara et al. ................... 257/296 |
| 5,313,044 A | 5/1994 | Massoud et al. |
| 5,314,831 A | 5/1994 | Hirae et al. |
| 5,365,334 A | 11/1994 | Bottka |
| 5,379,109 A | 1/1995 | Gaskill et al. |
| 5,536,936 A | 7/1996 | Drevillon et al. |
| 5,589,695 A * | 12/1996 | Malhi .......................... 257/339 |
| 5,663,657 A | 9/1997 | Lagowski et al. |
| 5,748,318 A * | 5/1998 | Maris et al. ................. 356/381 |
| 5,877,860 A * | 3/1999 | Borden ........................ 356/613 |
| 5,933,034 A * | 8/1999 | Hastings et al. ............... 326/84 |
| 6,087,242 A | 7/2000 | Maris et al. ................. 438/406 |
| 6,128,084 A * | 10/2000 | Nanbu et al. ................ 250/225 |
| 6,141,103 A * | 10/2000 | Pinaton et al. .............. 356/369 |
| 6,175,416 B1 * | 1/2001 | Maris et al. ................. 356/381 |
| 6,395,563 B1 | 5/2002 | Eriguchi ........................ 438/7 |

\* cited by examiner

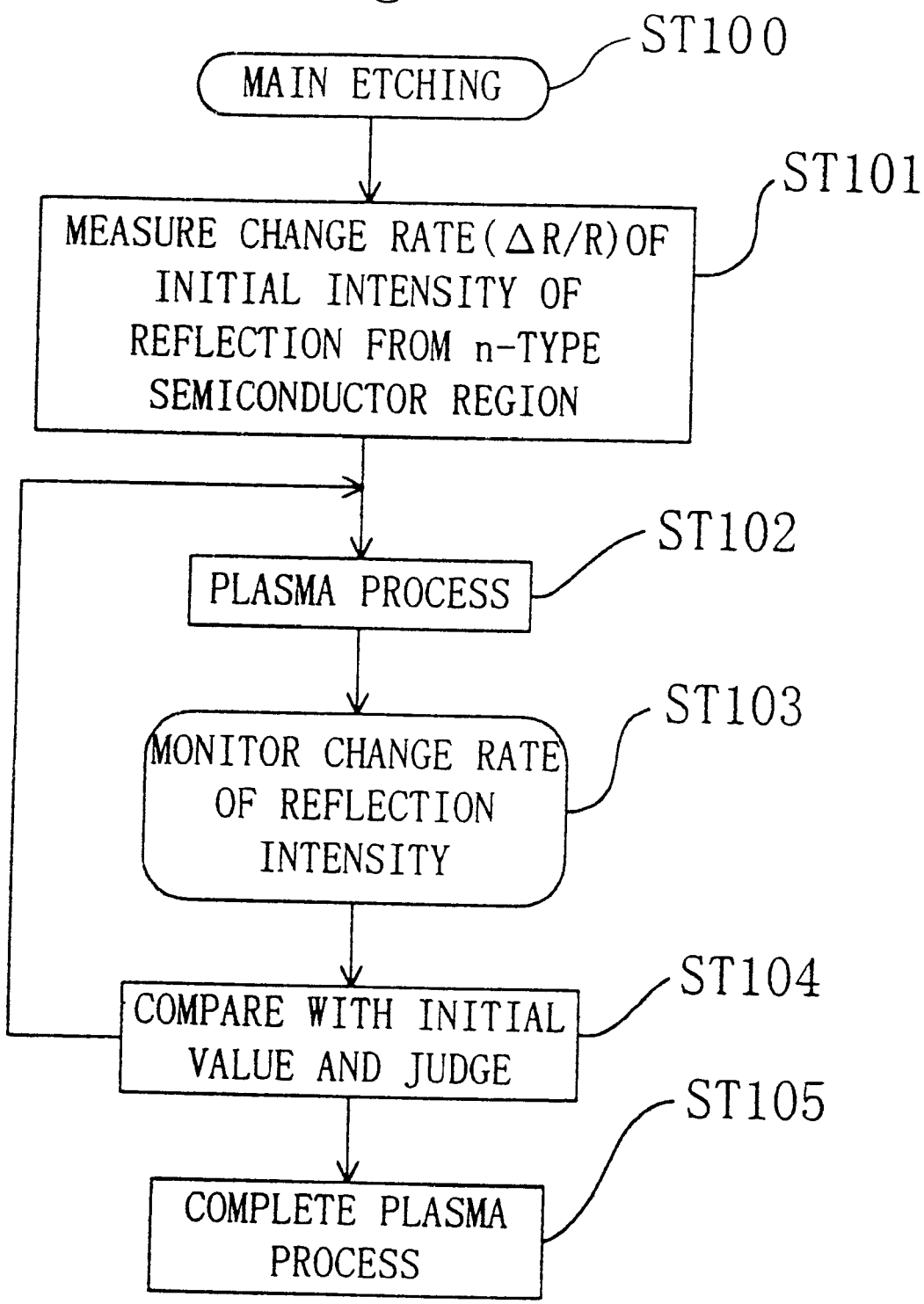

APPARATUS AND METHOD FOR OPTICAL EVALUATION, APPARATUS AND METHOD FOR MANUFACTURING SEMICONDUCTOR DEVICE, METHOD OF CONTROLLING APPARATUS FOR MANUFACTURING SEMICONDUCTOR DEVICE, AND SEMICONDUCTOR DEVICE

This application is a Divisional of application Ser. No. 08/965,892 filed Nov. 7, 1997 U.S. Pat. No. 6,113,733.

BACKGROUND OF THE INVENTION

The present invention relates to an apparatus and method for optical evaluation suitable for use in in-line property evaluation performed in the process of manufacturing a semiconductor device, to an apparatus and method for manufacturing a semiconductor device utilizing optical evaluation, a method of controlling the apparatus for manufacturing a semiconductor device, and a semiconductor device to be subjected to optical evaluation.

As ever-higher integration has been achieved in recent semiconductor integrated circuits, increasing miniaturization and higher performance have been required of a transistor element to be mounted on a MOS semiconductor device. In particular, the increasing miniaturization of the transistor element has created the demand for a MOS device having high reliability. To implement the MOS devices having high reliability, however, each component of the MOS device should have high reliability.

For example, the reliability of a contact portion, which is dependent on a method of forming a contact window, is an important factor in determining the reliability of such a MOS device. When a damaged layer is produced in a semiconductor substrate by dry etching performed to form the contact window, it is removed by wet etching subsequent to the dry-etching process. To estimate the proper amount of removal, a conventional method of manufacturing a semiconductor device has used a wafer for monitoring, not for products, to measure the electric property thereof and thereby determine the depth of the damaged layer produced during the dry-etching process. The wet-etching process for removing the damaged layer is performed under such conditions as a duration of time and a temperature that have been determined based on the electric property. Thus, the conventional method of manufacturing a semiconductor device has optimized processing conditions during the manufacturing process based on the electric property obtained by using the wafer for monitoring.

In the process of forming the individual components of a semiconductor device, the technology of impurity introduction, e.g., plays an important role in determining the operational properties of the semiconductor device. Ion implantation is a predominant method for impurity introduction, whereby impurity ions from ion source are accelerated with the application of an electric field and thereby allowed to enter a semiconductor substrate or an electrode. During the ion implantation, impurity ions are normally accelerated with energy of several tens of kilo-electron volts before entering the semiconductor substrate or the like. However, the implantation of the impurity ions has caused a crystallographically damaged layer in the surface of the semiconductor substrate or the like. In addition, the impurity has not been activated as carriers, while the concentration of the impurity has not optimumly been distributed. For the activation of the impurity, recovery from the damage, and optimization of profiles, a heat treatment (annealing) has typically been performed after ion implantation. Conventionally, the annealing process time, temperature, and the like have been determined through the optimization of design (device simulation) and conditions. In principle, conditions for annealing have been determined empirically. In particular, an annealing process for recovery from the surface damaged layer of the semiconductor substrate has been performed empirically.

As for a gate insulating film used in a MOS device, the thickness thereof has increasingly been reduced at a high pace, so that an extremely thin insulating film with a thickness of 4 nm or less will probably be used in the 21st century. in a MOS device having such an extremely thin insulating film, the properties of the insulating film may determine the properties of the entire CMOS device and hence the electric property of the whole semiconductor integrated circuit. Therefore, the properties of the insulating film are considered to be particularly important.

The properties of such a gate insulating film have conventionally been controlled by forming a MOS capacitor or MOS transistor and evaluating the electric property thereof. The evaluation of the electric property is performed during or after the manufacturing of a MOS device by retrieving a wafer with the MOS device mounted thereon from a chamber.

With the increasing miniaturization of the MOS device as described above, the conventional evaluation method has presented the following problems in the processes of etching, introducing an impurity, and forming a gate insulating film.

First, the etching process has the following problems. While the two-dimensional size (horizontal size) of the contact window has been reduced increasingly, the depth of the contact window has not been reduced, resulting in an increased aspect ratio (ratio of the depth to the horizontal size). To form such a contact window with a high aspect ratio, a high-vacuum/high-density plasma has been used in, e.g., a dry-etching process. The high-vacuum/high-density plasma process has successfully formed a deep contact window by using high-energy ions in vertical directions. However, the bombardment of the high-energy ions has caused a more seriously damaged layer having a greater depth in the semiconductor crystal of the bottom of the contact window than has been caused by conventional dry etching using a comparatively low-vacuum/low-density plasma. In the case of using light of a wavelength in the microwave range (such as an infrared ray) to evaluate a damaged layer, light itself enters the Si substrate and reaches a point at a depth of more than 1 μm from the surface thereof, so that it is impossible to precisely evaluate damage on a level of several tens of nanometer caused actually by the plasma to the Si substrate. In spite of the future trend toward an increasingly miniaturized LSI, it has become substantially impossible to accurately evaluate a thin damaged layer formed only at the surface as well as an extremely miniaturized region.

Hence, it has become difficult to ensure the removal of the damaged layer with excellent controllability by using only the conventional evaluation method.

Next, the impurity introducing process and the annealing process have the following problems. With the miniaturization of individual elements in a semiconductor device, profile control as well as impurity introduction in a miniaturized region has played an increasingly important role. However, in accordance with the conventional method in which annealing conditions are set empirically, optimum profiles cannot be obtained or trouble occurs oftentimes as a result of terminating the process with a defect remaining in a semiconductor substrate. Moreover, a developing efficiency will be reduced significantly if annealing conditions are optimized by the conventional procedure consisting of processing and analysis repeatedly performed in this order, while a shorter period of time is required to develop a desired semiconductor device. Under such circumstances, process control technology using an in-situ observation technique for the annealing process has been in recent demand. In performing heat treatment by using single-wafer heat treatment apparatus, slight variations are observed in the amount of heat treatment performed with respect to different wafers. The variations may be attributed to the properties of the single-wafer heat treatment apparatus which are intrinsically different or have varied with time, unlike conventional heat treatment apparatus for batch processing. Furthermore, it is also difficult to precisely determine an actual dose for impurity introduction and the effective concentration of the impurity introduced into the substrate after heat treatment.

Th process of forming a gate insulating film has the following problem. In the case of controlling the properties of the gate insulating film by the conventional method of evaluating the electric property, even when any trouble occurs in the process of forming the insulating film, the trouble will be discovered only after the wafer is retrieved from the chamber after the completion of the process and the electric property thereof is evaluated. Until then, the gate insulating film having the trouble will have been manufactured without interruption, resulting in a reduced productivity (efficiency).

SUMMARY OF THE INVENTION

It is therefore a first object of the present invention to provide an apparatus and method for optical evaluation which ensure the in-line sensing of the foregoing factors influencing the properties of a semiconductor device in the manufacturing process and implement a semiconductor device having excellent and consistent properties.

A second object of the present invention is to provide a method and apparatus for manufacturing a semiconductor device wherein in-line control is exerted over various types of processing performed with respect to the semiconductor device by focusing attention on the correlation between the optical property of a semiconductor region and the state thereof and using the result of evaluating the optical property.

A third object of the present invention is to provide a method of controlling an apparatus for manufacturing a semiconductor device wherein maintenance is performed with respect to a chamber of the apparatus for manufacturing a semiconductor device by using a varying accuracy with which an optical property is evaluated.

A fourth object of the present invention is to provide a semiconductor device having a structure suitable for the evaluation of optical property.

To attain the first object, the present invention has proposed first and second optical evaluation apparatus as well as an optical evaluation method.

To attain the second object, the present invention has proposed an apparatus for manufacturing a semiconductor device and first to fifth methods of manufacturing semiconductor devices.

To attain the third object, the present invention has proposed a method of controlling an apparatus for manufacturing a semiconductor device.

To attain the fourth object, the present invention has proposed a semiconductor device.

A first optical evaluation apparatus according to the present invention is for use in processing a substrate having a semiconductor region in a chamber, the apparatus comprising: a first light source for generating exciting light; a second light source for generating measurement light; a first light guiding member for intermittently supplying the exciting light generated from the first light source to the semiconductor region of the substrate in the chamber; a second light guiding member for supplying the measurement light generated from the second light source to the semiconductor region; reflectance measuring means for measuring a reflectance of the measurement light supplied to the semiconductor region; a third light guiding member for causing the measurement light reflected from the semiconductor region to be incident upon the reflectance measuring means; and change calculating means for receiving an output from the reflectance measuring means and calculating a change rate of the reflectance of the measurement light by dividing a difference between the respective reflectances of the measurement light in the presence and absence of the exciting light supplied to the semiconductor region by the reflectance of the measurement light in the absence of the exciting light.

The use of the optical evaluation apparatus achieves the following effect. When the semiconductor region is irradiated with the exciting light guided by the first light guiding member, carriers in the semiconductor region are excited to form an electric field. Due to the electric field, the reflectance of the measurement light guided by the second light guiding member to the semiconductor region changes in the presence and absence of the exciting light. The change rate varies depending on the intensity of the electric field and on the wavelength of the measurement light. If the semiconductor region contains a defect forming a center of recombination for carriers, the lifetimes of the excited carriers are reduced so that the electric field formed by the carriers has a reduced intensity. In other words, the change rate of reflectance in the presence and absence of the exciting light changes depending on the number of defects in the semiconductor region or the like, so that the change rate of the reflectance of the measurement light in the semiconductor region which has been calculated from the value measured by the reflectance measuring means reflects the crystallographic state of the semiconductor region or the like. Consequently, it becomes possible to control conditions for processing performed in the chamber based on the result of in-line evaluation performed with respect to the semiconductor region.

Preferably, the second light guiding member causes the measurement light to be incident upon a surface of the substrate in a direction approximately perpendicular thereto.

In the arrangement, since the measurement light is directed to the surface of the semiconductor substrate in a direction approximately perpendicular thereto, a change in the reflectance of light from a small semiconductor region can be evaluated promptly and accurately. The resulting optical evaluation apparatus enables optical evaluation in the process of manufacturing an increasingly miniaturized semiconductor device.

Preferably, the first light guiding member causes the exciting light to be incident upon the surface of the substrate in a direction approximately perpendicular thereto.

There may further be provided optical axis adjusting means for guiding the exciting light and the measurement light onto a common optical axis before the exciting light and the measurement light is supplied to the semiconductor region and the second light guiding member may be composed of a mirror for supplying the measurement light and exciting light, each guided onto the common optical axis by the optical axis adjusting means, to the surface of the substrate in a direction approximately perpendicular thereto and upwardly transmitting the measurement light and exciting light reflected from the semiconductor region.

In the arrangement, the measurement light and the excited light are supplied to the surface of the semiconductor region in a direction approximately perpendicular thereto. Consequently, even when the semiconductor region has an extremely small area, it becomes possible to perform optical evaluation using the change rate of the reflectance of the measurement light. What results is an optical evaluation apparatus particularly suitable for real-time monitoring of processing performed in the semiconductor region.

There may further be provided spectroscopic means for receiving the measurement light reflected from the semiconductor region, separating the measurement light, and sending the separated measurement light to the reflectance measuring means.

This provides information on a wide range of wavelengths of the measurement light and enables the change rate of the reflectance of the measurement light of appropriate wavelengths to be used depending on the type of processing performed in the chamber.

The first and second light sources may be composed of a single common light source for generating a wide spectrum of light of wavelengths including wavelengths of the exciting light and wavelengths of the measurement light, the apparatus may further comprise: a beam splitter for splitting the wide spectrum of light generated from the common light source into the exciting light and the measurement light; and spectroscopic means for receiving the measurement light reflected from the semiconductor region, separating the measurement light, and sending the separated measurement light to the reflectance measuring means, and the first and second light guiding members may be placed in such a position as to receive the light from the splitter.

Since only one light source is sufficient, the optical evaluation apparatus has an extremely simple structure.

The change calculating means may calculate only the change rate of the reflectance of the measurement light at a specified energy value of the measurement light which provides a near extremal value in a spectrum of the change rate of the reflectance of the measurement light.

The arrangement enables the detection of a change in the reflectance of the measurement light of a most desired wavelength, resulting in a highly sensitive optical evaluation apparatus with no noise.

There may further be provided a filter for receiving the measurement light reflected from the semiconductor region, transmitting only the measurement light of a wavelength in a specified range, and sending the transmitted measurement light to the reflectance measuring means.

The arrangement enables the detection of a change in the reflectance of light of desired wavelengths without spectroscopic means, so that the resulting optical evaluation apparatus has a simpler structure and performs low-noise optical evaluation with high sensitivity.

Preferably, the specified energy value of the measurement light is any value included in a range of 3.2 to 3.6 eV.

The reflectance measuring means measures the reflectance of the light of a wavelength of preferably 600 nm or less, and more preferably, 300 to 600 nm.

Preferably, the first light guiding member intermittently emits the exciting light at a frequency of 1 kHz or less.

The apparatus may be constituted by using an ellipsometric spectroscope.

In the arrangement, the components of the ellipsometric spectroscope typically added to the chamber of the apparatus for manufacturing a semiconductor device can be utilized, resulting in an optical evaluation apparatus with less additional cost.

A second optical evaluation apparatus according to the present invention is for evaluating an electric property of an insulating film formed on a semiconductor region of a substrate, the apparatus comprising: a first light source for generating exciting light; a second light source for generating measurement light; a first light guiding member for intermittently supplying the exciting light generated from the first light source and transmitted by the insulating film to the semiconductor region immediately under the insulating film; a second light guiding member for supplying the measurement light generated from the second light source and transmitted by the insulating film to the semiconductor region intermittently supplied with the exciting light; reflectance measuring means for measuring a reflectance of the measurement light supplied to the semiconductor region; a third light guiding member for causing the measurement light reflected from the semiconductor region to be incident upon the reflectance measuring means; change calculating means for receiving an output from the reflectance measuring means and calculating a change rate of the reflectance of the measurement light by dividing a difference between the respective reflectances of the measurement light in the presence and absence of the exciting light supplied to the semiconductor region by the reflectance of the measurement light in the absence of the exciting light; and evaluating means for evaluating the electric property of the insulating film based on the change rate of the reflectance of the measurement light.

With the arrangement, information on an electric defect in an insulating film, particularly a gate insulating film, can be obtained. Specifically, when the semiconductor region is irradiated with the exciting light, carriers are excited and an electric field changes as the number of carriers changes, so that the reflectance of the measurement light of a given wavelength from the semiconductor region changes. If an insulating film is formed on the semiconductor region, however, the change rate of the reflectance of the measurement light is lowered since a defect site for trapping carriers is present in the surface layer of the semiconductor region. However, an increase in the intensity of the electric field in the adjacent semiconductor region is increased, which increases the change rate of the reflectance of the measurement light. Therefore, the electric property of the insulating film can be controlled promptly and reliably by judging the quality of the insulating film if the reflectance of the measurement light falls outside the specified range.

The evaluating means may judge the insulating film to be good only when the change rate of the reflectance of the measurement light at a specified energy value of the measurement light which provides a near extremal value in a spectrum of the change rate of the reflectance of the measurement light corresponds to a proper capacitance value of the insulating film.

The specified energy value of the measurement light may be any value included in a range of 3.2 to 3.6 eV.

In this manner, optical evaluation is performed at a point in the spectrum of the change rate of the reflectance in a characteristic configuration at which a difference in electric property of the insulating film is detected most sensitively.

There may further be provided spectroscopic means for receiving the measurement light reflected from the semiconductor region, separating the measurement light, and transmitting the separated measurement light to the reflectance measuring means.

The arrangement provides a spectrum of the change rate of the reflectance of the measurement light, so that it becomes possible to perform optical evaluation with high precision based on the information on the whole spectral configuration.

There may further be provided a filter for receiving the measurement light reflected from the semiconductor region, transmitting only the measurement light of a wavelength in a specified range corresponding to the specified energy value of the measurement light, and sending the transmitted measurement light to the reflectance measuring means.

The arrangement enables the detection of a change in the reflectance of light of desired wavelengths without spectroscopic means, so that the resulting optical evaluation apparatus has a simpler structure and performs prompt optical evaluation.

The reflectance measuring means measures the reflectance of the measurement light of a wavelength of preferably 600 nm or less, and more preferably 300 to 600 nm.

The arrangement allows optical evaluation to be performed based on the change rate of the reflectance of the measurement light only from the portion of the semiconductor region susceptible to the influence of trapped electrons contained in the insulating film by using the fact that the measurement light of a wavelength in the visible region or a shorter wavelength does not reach a portion deeper than several hundreds of nanometers from the surface of the semiconductor region.

The apparatus may be constituted by using an ellipsometric spectroscope.

The arrangement allows the optical evaluation apparatus to be constituted at low cost by using the ellipsometric spectroscope used to measure the thickness of a gate oxide film or the like.

Preferably, the apparatus is attached to a chamber used to form an oxide film for a semiconductor device.

The arrangement allows the quality of the insulating film to be evaluated without recovering the semiconductor substrate from the manufacturing apparatus, resulting an evaluation apparatus suitable for in-line property evaluation.

The second light source may be an Xe lamp.

The first light source may be an Ar ion laser or a He-Ne laser.

Preferably, the first light guiding member intermittently emits the exciting light at a frequency of 1 kHz or less.

An apparatus for manufacturing a semiconductor device according to the present invention comprises: a chamber for containing a substrate having a semiconductor region; processing means for performing processing with respect to the substrate in the chamber; first light supplying means for intermittently supplying exciting light to the semiconductor region of the substrate placed in the chamber; a second light supplying means for supplying measurement light to the semiconductor region; reflectance measuring means for measuring a reflectance of the measurement light supplied to the semiconductor region; change calculating means for receiving an output from the reflectance measuring means and calculating a change rate of the reflectance of the measurement light by dividing a difference between the respective reflectances of the measurement light in the presence and absence of the exciting light supplied to the semiconductor region by the reflectance of the measurement light in the absence of the exciting light; and processing control means for receiving an output from the change calculating means during the processing performed by the processing means and controlling a condition for the processing based on the change rate of the reflectance.

The use of the apparatus for manufacturing a semiconductor devices achieves the following effect. When the semiconductor region is irradiated with the exciting light supplied by the first light supplying means, carriers are excited to produce an electric field. Due to the electric field, the reflectance of the measurement light supplied by the second light supplying means changes in the presence and absence of the exciting light supplied. The change rate varies depending on the intensity of the electric field and on the wavelength of the measurement light. If the semiconductor region contains a defect forming a center of recombination for carriers, the lifetimes of the excited carriers are reduced so that the electric field formed by the carriers has a reduced intensity. In other words, the change rate of reflectance in the presence and absence of the exciting light changes depending on the number of defects in the semiconductor region or the like, so that the change rate of the reflectance of the measurement light in the semiconductor region which has been calculated from the value measured by the reflectance measuring means reflects the crystallographic state of the semiconductor region or the like. Moreover, since the processing control means controls conditions for processing performed in the chamber based on the result of in-line evaluation performed with respect to the semiconductor region, the resulting semiconductor device has desired properties.

The processing means may generate a plasma in the chamber and perform etching with respect to the semiconductor region by using the generated plasma.

This enables the depth of a damaged layer and the degree of damage caused by etching to be controlled, so that the subsequent removal of the damaged layer is performed smoothly.

The processing means may generate a plasma in the chamber and perform light dry etching by using the generated plasma so as to remove a damaged layer caused by etching performed with respect to the semiconductor region.

This enables the depth of a damaged layer and the degree of damage caused by etching to be controlled and light dry etching to be performed to remove the damaged layer.

The processing means may introduce an impurity into the semiconductor region.

This enables the number of defects caused by the introduction of the impurity and the level of defectiveness to be controlled.

The processing means may perform annealing after impurity ions are implanted in the semiconductor region.

This enables annealing for removing the structural disorder caused by impurity ions completely and efficiently.

The processing means may form a thin insulating film on the semiconductor region.

This enables an insulating film having desired properties such as a gate oxide film to be formed.

When a thin insulating film has been formed on the semiconductor region, the processing means may perform dry etching to remove the insulating film from a top surface of the semiconductor region.

This enables the progression of the process of removing the insulating film to be controlled based on the result of in-line optical evaluation by using the fact that the change rate of the reflectance of the measurement light from the semiconductor region is influenced by the thickness of the insulating film.

Preferably, an angle formed between the measurement light supplied by the second light supplying means and a surface of the substrate is larger than an angle formed between the exciting light supplied by the first light supplying means and the surface of the substrate.

This enables the measurement light to be supplied to a smaller area. As a result, the area of the semiconductor region necessary for measuring the reflectance of the measurement light can be reduced.

The second light supplying means may supply the measurement light to a surface of the substrate in a direction approximately perpendicular thereto.

In the arrangement, the measurement light is supplied to the semiconductor wafer in a direction approximately perpendicular thereto. Consequently, even when the semiconductor region has an extremely small area, it is possible to easily perform optical evaluation, which reduces a useless space for optical monitoring and improves sensitivity, resulting in a significantly reduced time required to evaluate an optical property.

Preferably, the first light supplying means supplies the exciting light to the surface of the substrate in a direction approximately perpendicular thereto.

Preferably, the first light supplying means intermittently emits the exciting light at a frequency of 1 kHz or less.

The second light supplying means and the reflectance measuring means may be constituted by using an ellipsometric spectroscope.

In the arrangement, the components of the ellipsometric spectroscope typically added to the chamber of the apparatus for manufacturing a semiconductor devices can be utilized, so that it becomes possible to control processing based on the result of in-line optical evaluation, while suppressing an increase in cost.

An optical evaluation method according to the present invention is for evaluating processing performed with respect to a substrate having a semiconductor region in a chamber, the method comprising the steps of: supplying measurement light to the semiconductor region of the substrate in the chamber; intermittently supplying exciting light to the semiconductor region; and calculating a change rate of a reflectance of the measurement light by dividing a difference between the respective reflectances of the measurement light in the presence and absence of the exciting light supplied to the semiconductor region by the reflectance of the measurement light in the absence of the exciting light.

In accordance with the method, carriers in the semiconductor region are excited when the semiconductor region is irradiated with the exciting light and produce an electric field. Due to the electric field, the reflectance of the measurement light supplied to the semiconductor region changes in the presence and absence of the exciting light. The change rate varies depending on the intensity of the electric field and on the wavelength of the measurement light. If the semiconductor region contains a defect forming a center of recombination for carriers, the lifetimes of the excited carriers are reduced so that the electric field formed by the carriers has a reduced intensity. In other words, the change rate of reflectance in the presence and absence of the exciting light changes depending on the number of defects in the semiconductor region or the like, so that the change rate of the reflectance of the measurement light in the semiconductor region which has been calculated reflects the crystallographic state of the semiconductor region or the like. Consequently, it becomes possible to control conditions for processing performed in the chamber based on the result of in-line evaluation performed with respect to the semiconductor region.

Preferably, the measurement light is supplied to a surface of the substrate in a direction approximately perpendicular thereto in the step of supplying the measurement light.

The method allows optical-modulation reflectance spectrophotometry to be performed also with respect to a semiconductor region having a small area.

Preferably, the exciting light is supplied to the surface of the substrate in a direction approximately perpendicular thereto in the step of supplying the exciting light.

The processing may be a plasma etching process performed with respect to the semiconductor region.

This enables the depth of a damaged layer and the degree of damage caused by etching to be controlled, so that the subsequent removal of the damaged layer is performed smoothly.

The processing may be a light dry etching process for removing a damaged layer caused by plasma etching performed with respect to the semiconductor region.

This enables the depth of a damaged layer and the degree of damage caused by etching to be controlled and light dry etching to be performed to remove the damaged layer.

The processing may be a process of introducing an impurity into the semiconductor region.

This enables the number of defects and the level of defectiveness caused by the introduction of the impurity to be controlled.

The processing may be an annealing process performed after impurity ions are implanted in the semiconductor region.

This enables annealing to be performed to remove the structural disorder caused by impurity ion implantation completely and efficiently.

The processing may be a process of forming an insulating film on the semiconductor region.

This enables an insulating film having desired properties, such as a gate oxide film, to be formed.

The processing may be a dry etching process for removing an insulating film from a top surface of the semiconductor region.

This enables the progression of the process of removing the insulating film to be controlled based on the result of in-line optical evaluation by using the fact that the change rate of the reflectance of the measurement light from the semiconductor region is influenced by the thickness of the insulating film.

Preferably, the semiconductor region is composed of n-type silicon.

Preferably, the exciting light is intermittently emitted at a frequency of 1 kHz or less in the step of supplying the exciting light.

A first method of manufacturing a semiconductor device according to the present invention comprises: a first step of forming a substrate having a semiconductor region; a second step of evaluating an optical property of the semiconductor region; a third step of performing an etching process with respect to the semiconductor region; and a fourth step of controlling a condition for the etching process based on an optical property of the semiconductor region evaluated in the second step.

In accordance with the method, information on a structural disorder developed in the vicinity of the surface of the semiconductor region can be obtained by using the fact that light entering the semiconductor substrate reaches only a shallow portion. Based on the information, the depth of a damaged layer caused by etching in the semiconductor region and the degree of damage can be measured. Therefore, the manufacturing method of the present invention allows the properties of a semiconductor device to be set at desired values more precisely and with smaller variations than the conventional manufacturing method wherein an electric property is examined after the completion of the etching process and feedbacked to the conditions for etching.

The second step may include the steps of: supplying measurement light to the semiconductor region; intermittently supplying exciting light to the semiconductor region; and calculating a change rate of a reflectance of the measurement light by dividing a difference between the respective reflectances of the measurement light in the presence and absence of the exciting light supplied to the semiconductor region by the reflectance of the measurement light in the absence of the exciting light.

The method achieves the following effect. When the semiconductor region is irradiated with the exciting light, carriers are excited to produce an electric field. Due to the electric field, the reflectance of the measurement light changes in the presence and absence of the exciting light. The change rate varies depending on the intensity of the electric field and on the wavelength of the measurement light. If the semiconductor region contains a defect forming a center of recombination for carriers, the lifetimes of the excited carriers are reduced so that the electric field formed by the carriers has a reduced intensity. In other words, the change rate of reflectance in the presence and absence of the exciting light changes depending on the number of defects in the semiconductor region or the like, so that the change rate of the reflectance of the measurement light in the semiconductor region reflects the crystallographic state of the semiconductor region or the like. If a damaged layer is caused by etching, therefore, the depth thereof and the degree of damage can be obtained from the change rate of the reflectance of the measurement light. As a result, conditions for etching can be controlled properly.

The change rate of the reflectance of the measurement light of a wavelength of preferably 600 nm or less, and more preferably 300 to 600 nm, may be calculated in the step of calculating the change rate of the reflectance.

In accordance with the method, the damaged layer can be removed from the semiconductor region based on the information on the region of concern of a semiconductor device by using the fact that the measurement light of a wavelength in the visible region has the property of reaching a portion at a depth of several tens of nanometers from a surface of a semiconductor.

Preferably, the change rate of the reflectance of the measurement light at a specified energy value of the measurement light which provides a near extremal value in a spectrum of the change rate of the reflectance of the measurement light is calculated in the step of calculating the change rate of the reflectance.

Preferably, the specified energy value of the measurement light is any value included in a range of 3.2 to 3.6 eV.

Preferably, the exciting light is intermittently emitted at a frequency of 1 kHz or less in the step of supplying the exciting light.

Dry etching using a plasma may be performed in the third step.

This allows the degree of damage caused in the semiconductor region by the bombardment of ions during plasma processing to be obtained by optical evaluation performed with respect to the semiconductor region. The resulting semiconductor device has excellent properties due to processing using a plasma, which is generally used in the process of manufacturing a semiconductor device.

Prior to the second step, there may further be performed the steps of: depositing an interlayer insulating film on the semiconductor region of the substrate; and selectively removing the interlayer insulating film by plasma etching to form an opening reaching the semiconductor region, the second step may include evaluating an optical property of the semiconductor region exposed at a bottom surface of the opening, the third step may include performing light dry etching with respect to the semiconductor region exposed at the bottom surface of the opening to remove a damaged layer caused by the plasma etching, and the fourth step may include controlling a condition for the etching process based on a result of evaluating the optical property of the semiconductor region.

This ensures the removal of a damaged layer produced in the semiconductor region in forming the opening as the contact hole and prevents new damage from being caused by excessive light dry etching.

Regions of the semiconductor region to be formed with an element may be source/drain regions of an FET and the opening may be a contact hole reaching either of the source/drain regions.

In accordance with the method, the structural disorder in the source/drain regions is minimized, resulting in a FET with excellent properties.

A relationship between the optical property of the semiconductor region and a depth of the damaged layer may be predetermined by experiment and the fourth step may include obtaining the depth of the damaged layer from the optical property of the semiconductor region evaluated in the second step and performing light dry etching to remove a portion of the semiconductor region corresponding to the depth.

The method allows easy and prompt removal of the damaged layer from the semiconductor region by only one optical evaluation.

The fourth step may include controlling the condition for the etching process by reevaluating the optical property of the semiconductor region which varies with the progression of the light dry etching and comparing a result of reevaluation with a result of evaluation performed in the second step.

The method ensures the removal of a damaged layer produced in the semiconductor region in forming the opening as the contact hole and prevents new damage from being caused by excessive light dry etching.

Regions of the semiconductor region to be formed with an element may be source/drain regions of a FET and the opening may be a contact hole reaching either of the source/drain regions.

Prior to the second step, there may be performed the steps of: introducing an impurity at a high concentration into the semiconductor region of the substrate and depositing an interlayer insulating film on the semiconductor region; and selectively removing the interlayer insulating film by plasma etching to form an opening reaching the semiconductor region, the third step may include performing light dry etching with respect to the semiconductor region exposed at a bottom surface of the opening to remove a damaged layer caused by the plasma etching and predetermining a proper range of the change rate of the reflectance of the measurement light when an electric property of the semiconductor region is proper and the fourth step may include performing the light dry etching such that the change rate of the reflectance falls within the proper range.

This also ensures the removal of the damaged layer caused by dry etching.

The first step may include forming, as the semiconductor region, a first semiconductor region forming a part of a semiconductor element and a second semiconductor region to be subjected to optical evaluation, the second step may include evaluating the optical property of the second semiconductor region, the third step may include performing the etching process with respect to the first and second semiconductor regions simultaneously, and the fourth step may include controlling the condition for the etching process based on the result of evaluating the optical property of the second semiconductor region.

In accordance with the method, the area and impurity concentration of the second semiconductor region to be subjected to optical evaluation are optimized for optical evaluation, while the properties of the first semiconductor region to be formed with a semiconductor element are not practically affected thereby, which enables more accurate optical evaluation.

The first step may include adjusting an impurity concentration in the second semiconductor region to be higher than an impurity concentration in the first semiconductor region.

The method increases the sensitivity with which optical evaluation is performed so that higher-accuracy optical evaluation is performed more promptly.

Prior to the second step, there may be performed the step of introducing an impurity at a high concentration into the second semiconductor region of the substrate and depositing a gate insulating film and a conductive film for a gate electrode on the first and second semiconductor regions, the third step may include patterning the conductive film for a gate electrode and the gate insulating film by plasma etching and predetermining a proper range of a change rate of a reflectance of the measurement light when an electric property of the semiconductor region is proper and the fourth step may include performing the light dry etching such that the change rate of the reflectance falls within the proper range.

The method provides a FET with excellent properties, while removing damage caused to the source/drain regions in forming the gate electrode of the FET.

A silicon oxide film may be formed as the gate insulating film.

Preferably, the first step includes composing a portion of the semiconductor region to be subjected to optical evaluation of n-type silicon.

The second step may include evaluating the change rate of the reflectance of measurement light by using an ellipsometric spectroscope.

In accordance with the method, processing by etching can be controlled based on the result of in-line optical evaluation by using the ellipsometric spectrometer typically added to an apparatus for manufacturing a semiconductor device for measuring the thickness of an oxide film.

A second method of manufacturing a semiconductor device according to the present invention is for manufacturing a semiconductor device having a semiconductor region with a structural disorder developed therein, the method comprising the steps of: evaluating an optical property of the semiconductor region; and performing a heat treatment for recovering the semiconductor region from the structural disorder, while controlling a condition for the heat treatment based on the optical property of the semiconductor region evaluated in the foregoing step.

In accordance with the method, information on a structural disorder developed in the vicinity of the surface of the semiconductor region can be obtained by using the fact that light entering the semiconductor substrate reaches only a shallow portion. The heat treatment process can be controlled based on the information. Therefore, the semiconductor region can recover normal properties under optimum conditions for processing which will not adversely affect the properties of the semiconductor device. This is achieved by accurately sensing the structural disorder such as a crystallographic defect and a deviation from the normal state of electronic structure, without incurring lower sensitivity or increased noise due to the information from inside the semiconductor region.

The step of evaluating the optical property may include the steps of: supplying measurement light to the semiconductor region; intermittently supplying exciting light to the semiconductor region; and calculating a change rate of a reflectance of the measurement light by dividing a difference between the respective reflectances of the measurement light in the presence and absence of the exciting light supplied to the semiconductor region by the reflectance of the measurement light in the absence of the exciting light.

The method achieves the following effect. When the semiconductor region is irradiated with the exciting light, carriers are excited to produce an electric field. Due to the electric field, the reflectance of the measurement light changes in the presence and absence of the exciting light. The change rate varies depending on the intensity of the electric field and on the wavelength of the measurement light. If the semiconductor region contains a defect forming a center of recombination for carriers, the lifetimes of the excited carriers are reduced so that the electric field formed by the carriers has a reduced intensity. In other words, the change rate of reflectance in the presence and absence of the exciting light changes depending on the number of defects in the semiconductor region or the like, so that the change rate of the reflectance of the measurement light in the semiconductor region reflects the crystallographic state of the semiconductor region or the like. As a result, the range and degree of the structural disorder in the semiconductor region can be obtained from the change rate of the reflectance of the measurement light, which enables conditions for the heat treatment to be controlled properly.

The change rate of the reflectance of the measurement light of a wavelength of preferably 600 nm or less, and more preferably 300 to 600 nm, may be calculated in the step of calculating the change rate of the reflectance.

In accordance with the method, the recovery of the semiconductor region can be controlled based on the information on the region of concern of a semiconductor device by using the fact that the measurement light of a wavelength in the visible region has the property of reaching a portion at a depth of several tens of nanometers from a surface of a semiconductor.

Preferably, the change rate of the reflectance of the measurement light at a specified energy value of the measurement light which provides a near extremal value in a spectrum of the change rate of the reflectance of the measurement light is calculated in the step of calculating the change rate of the reflectance.

In accordance with the method, the recovery of the semiconductor region can be controlled easily, promptly, and precisely by using the characteristic configuration of the spectrum indicative of the change rate of the reflectance which is increased or decreased depending on the wavelength of the measurement light.

Preferably, the specified energy value of the measurement light is any value included in a range of 3.2 to 3.6 eV.

Preferably, the exciting light is intermittently emitted at a frequency of 1 kHz or less in the step of supplying the exciting light.

A proper range of the change rate of the reflectance of the measurement light when an electric property of the semiconductor region is proper may be predetermined and the heat treatment may be performed in the step of performing the heat treatment with respect to the semiconductor region such that the change rate of the reflectance of the measurement light falls within the proper range.

The method minimizes variations in the properties of the semiconductor region from lot to lot after the heat treatment.

A relationship between the change rate of the reflectance of the measurement light in the semiconductor region and an impurity concentration in the semiconductor region may be predetermined and the heat treatment may be performed with respect to the semiconductor device in the step of performing the heat treatment till the change rate of the reflectance of the measurement light in the semiconductor region reaches a value corresponding to a desired impurity concentration.

The method minimizes variations in impurity concentration and impurity diffusion in the semiconductor region from lot to lot. The resulting semiconductor device has an impurity concentration excellently distributed. Moreover, variations in the properties of individual wafers are negligible.

A first semiconductor region forming a part of a semiconductor element and a second semiconductor region to be subjected to optical evaluation may be preliminarily formed as the semiconductor region, the optical property of the second semiconductor region may be evaluated in the step of evaluating the optical property, and the first and second semiconductor regions may be simultaneously subjected to the heat treatment in the step of performing the heat treatment, while a condition for the heat treatment is controlled based on the result of evaluating the optical property of the second semiconductor region.

In accordance with the method, the area and impurity concentration of the second semiconductor region to be subjected to optical evaluation are optimized for optical evaluation, while the properties of the first semiconductor region to be formed with a semiconductor element are not practically affected thereby, which allows more accurate optical evaluation to be performed.

The first step may include adjusting an impurity concentration in the second semiconductor region to be higher than an impurity concentration in the first semiconductor region.

The method increases the sensitivity with which optical evaluation is performed so that higher-accuracy optical evaluation is performed more promptly.

Preferably, a portion of the semiconductor region to be subjected to optical evaluation is composed of n-type silicon.

Regions of the semiconductor region to be formed with a semiconductor element may be source/drain regions.

In accordance with the method, the heat treatment is performed to remove the structural disorder from the source/drain regions of a FET, thereby forming the FET with excellent properties.

The second step may include evaluating the change rate of the reflectance of the measurement light by using an ellipsometric spectroscope.

In accordance with the method, processing by etching can be controlled based on the result of in-line optical evaluation by using the ellipsometric spectrometer typically added to an apparatus for manufacturing a semiconductor device for measuring the thickness of an oxide film.

A third method of manufacturing a semiconductor device according to the present invention is for manufacturing a semiconductor device having a semiconductor region, the method comprising the steps of: evaluating an optical property of the semiconductor region; and introducing an impurity into the semiconductor region, while controlling a condition for the impurity introduction based on the optical property of the semiconductor region evaluated in the foregoing step.

In accordance with the method, information on a structural disorder developed in the vicinity of the surface of the semiconductor region can be obtained by using the fact that light entering the semiconductor substrate reaches only a shallow portion. Based on the information, the process of introducing an impurity can be controlled. Therefore, the semiconductor region can recover normal properties under optimum conditions for processing which will not adversely affect the properties of the semiconductor device. This is achieved by accurately sensing the structural disorder such as a crystallographic defect and a deviation from the normal state of electronic structure, without incurring lower sensitivity or increased noise due to the information from inside the semiconductor region.

The step of evaluating the optical property may include the steps of: supplying measurement light to the semiconductor region; intermittently supplying exciting light to the semiconductor region; and calculating a change rate of a reflectance of the measurement light by dividing a difference between the respective reflectances of the measurement light in the presence and absence of the exciting light supplied to the semiconductor region by the reflectance of the measurement light in the absence of the exciting light.

The method achieves the following effect. When the semiconductor region is irradiated with the exciting light, carriers are excited to produce an electric field. Due to the electric field, the reflectance of the measurement light changes in the presence and absence of the exciting light. The change rate varies depending on the intensity of the electric field and on the wavelength of the measurement light. If the semiconductor region contains a defect forming a center of recombination for carriers, the lifetimes of the excited carriers are reduced so that the electric field formed by the carriers has a reduced intensity. In other words, the change rate of reflectance in the presence and absence of the exciting light changes depending on the number of defects in the semiconductor region or the like, so that the change rate of the reflectance of the measurement light in the semiconductor region reflects the crystallographic state of the semiconductor region or the like. As a result, the range and degree of the structural disorder in the semiconductor region can be obtained from the change rate of the reflectance of the measurement light, which enables conditions for impurity introduction to be controlled properly.

The change rate of the reflectance of the measurement light of a wavelength of preferably 600 nm or less, and more preferably 300 to 600 nm, may be calculated in the step of calculating the change rate of the reflectance.

In accordance with the method, the introduction of the impurity into the semiconductor region can be controlled based on the information on the region of concern of a semiconductor device by using the fact that the measurement light of a wavelength in the visible region has the property of reaching a portion at a depth of several tens of nanometers from a surface of a semiconductor.

The change rate of the reflectance of the measurement light at a specified energy value of the measurement light which provides a near extremal value in a spectrum of the change rate of the reflectance of the measurement light may be calculated in the step of calculating the change rate of the reflectance.

In accordance with the method, the recovery of the semiconductor region can be controlled easily, promptly, and precisely by using the characteristic configuration of the spectrum indicative of the change rate of the reflectance which is increased or decreased depending on the wavelength of the measurement light.

Preferably, the specified energy value of the measurement light is any value included in a range of 3.2 to 3.6 eV.

Preferably, the exciting light is intermittently emitted at a frequency of 1 kHz or less in the step of supplying the exciting light.

A relationship between an amount of introduced impurity and the change rate of the reflectance of the measurement light may be predetermined by experiment and the impurity may be introduced in the step of introducing the impurity into the semiconductor region such that the change rate of the reflectance of the measurement light reaches a value corresponding to a desired amount of introduced impurity.

The method minimizes variations in impurity concentration and impurity diffusion in the semiconductor region from lot to lot. The resulting semiconductor device has an impurity concentration excellently distributed. Moreover, variations in the properties of individual wafers are negligible.

A first semiconductor region forming a part of a semiconductor element and a second semiconductor region to be subjected to optical evaluation may be preliminarily formed as the semiconductor region, the optical property of the second semiconductor region may be evaluated in the step of evaluating the optical property, and the impurity may be introduced into the first and second semiconductor regions simultaneously in the step of introducing the impurity, while a condition for the impurity introduction is controlled based on the result of evaluating the optical property of the second semiconductor region.

In accordance with the method, the area and impurity concentration of the second semiconductor region to be subjected to optical evaluation are optimized for optical evaluation, while the properties of the first semiconductor region to be formed with a semiconductor element are not practically affected thereby, which allows more accurate optical evaluation to be performed.

The third step may include introducing the impurity by plasma doping.

In accordance with the method, the change rate of reflectance gradually increases or decreases as the amount of introduced impurity increases in the case of plasma doping, so that controllability over the process of impurity introduction is improved.

Preferably, the impurity is an n-type impurity.

Regions of the semiconductor region to be formed with a semiconductor element may be source/drain regions.

In accordance with the method, respective impurity concentrations in the source/drain regions of a FET can be controlled with high precision, so that the resulting FET has excellent properties.

The second step may include evaluating the change rate of the reflectance of the measurement light by using an ellipsometric spectroscope.

In accordance with the method, processing by etching can be controlled based on the result of in-line optical evaluation by using the ellipsometric spectrometer typically added to an apparatus for manufacturing a semiconductor device for measuring the thickness of an oxide film.

A fourth method of manufacturing a semiconductor device according to the present invention comprises: a first step of forming a substrate having a semiconductor region; a second step of evaluating an optical property of the semiconductor region; a third step of forming a thin insulating film on the semiconductor region; and a fourth step of controlling a condition for the formation of the insulating film based on the optical property of the semiconductor region evaluated in the second step.

In accordance with the method, information on the properties of the insulating film overlying the semiconductor region can be obtained by using the fact that light entering the semiconductor substrate reaches only a shallow portion. The formation of the insulating film can be controlled based on the information. Therefore, the insulating film can be formed under optimum conditions without incurring lower sensitivity or increased noise due to the information from inside the semiconductor region. This is achieved by accurately judging the properties of the insulating film to be good or no good in the process of forming the insulating film.

The second step may include the steps of: supplying measurement light to the semiconductor region; intermittently supplying exciting light to the semiconductor region; and calculating a change rate of a reflectance of the measurement light by dividing a difference between the respective reflectances of the measurement light in the presence and absence of the exciting light supplied to the semiconductor region by the reflectance of the measurement light in the absence of the exciting light.

The method provides information on electric defects in the insulating film. Specifically, when the semiconductor region is irradiated with the exciting light, carriers are excited and the electric field changes as the number of carriers changes, so that the reflectance of the measurement light of specified wavelengths from the semiconductor region changes. In this case, if the insulating film has been formed on the semiconductor region, a defective layer for trapping the carriers is present in the surface layer of the semiconductor region, resulting in a reduced change rate of the reflectance of the measurement light. However, if a large number of defects (trapped electrons) are present in the insulating film, an increase in the intensity of the electric field in the adjacent semiconductor region is increased, so that the change rate of the reflectance of the measurement light is increased. Therefore, the insulating film is judged to be good or no good promptly and reliably based on the change rate of the reflectance of the measurement light.

The change rate of the reflectance of the measurement light of a wavelength of preferably 600 nm or less, and more preferably 300 to 600 nm, may be calculated in the step of calculating the change rate of the reflectance.

The method uses the measurement light of wavelengths shorter than those of visible light, thereby limiting the entering of the light into the semiconductor region to only a shallow portion and preventing degraded sensitivity due to information from the inside.

The change rate of the reflectance of the measurement light at a specified energy value of the measurement light which provides a near extremal value in a spectrum of the change rate of the reflectance of the measurement light may be calculated in the step of calculating the change rate of the reflectance.

In accordance with the method, the formation of the insulating film can be controlled easily, promptly, and precisely by using the characteristic configuration of the spectrum indicative of the change rate of the reflectance which is increased or decreased depending on the wavelength of the measurement light.

Preferably, the specified energy value of the measurement light is any value included in a range of 3.2 to 3.6 eV.

Preferably, the exciting light is intermittently emitted at a frequency of 1 kHz or less in the step of supplying the exciting light.

A proper range of the change rate of the reflectance of the measurement light when an electric property of the insulating film is proper may be predetermined by experiment and the fourth step may include forming the insulating film such that the change rate of the reflectance of the measurement light measured in the second step falls within the proper range.

The method minimizes variations in the electric property of the insulating films from lot to lot.

The second step may include measuring the change rate of the reflectance of the measurement light in the semiconductor region before the insulating film is formed thereon and the fourth step may include controlling a condition for the formation of the insulating film by remeasuring the change rate of the reflectance of the measurement light in the semiconductor region which varies with the progression of the formation of the insulating film and comparing a result of remeasurement with a result of measurement performed in the second step.

The method facilitates the formation of the insulating film having a desired electric property.

The first step may include forming, as the semiconductor region, a first semiconductor region forming a part of a semiconductor element and a second semiconductor region to be subjected to optical evaluation, the second step may include evaluating the optical property of the second semiconductor region, the third step may include forming the insulating film on the first and second semiconductor regions simultaneously, and the fourth step may include controlling a condition for the formation of the insulating film based on the result of evaluating the optical property of the second semiconductor region.

In accordance with the method, the area and impurity concentration of the second semiconductor region to be subjected to optical evaluation are optimized for optical evaluation, while the properties of the first semiconductor region to be formed with a semiconductor element are not practically affected thereby, which enables more accurate optical evaluation.

The first step may include adjusting an impurity concentration in the second semiconductor region to be higher than an impurity concentration in the first semiconductor region.

The method increases the sensitivity with which optical evaluation is performed so that higher-accuracy optical evaluation is performed more promptly.

Preferably, the first step may include composing a portion of the semiconductor region to be subjected to optical evaluation of n-type silicon.

After the fourth step, there may further be performed the step of judging the formed insulating film to be good or no good based on a relationship predetermined by experiment between the change rate of the reflectance of the measurement light and an electric property of the insulating film.

When the substrate is formed with a faulty insulating film, the method allows a new insulating film to be formed or the subsequent steps to be halted.

Preferably, a silicon oxide film is formed as the insulating film in the third step.

A gate insulating film may be formed as the insulating film in the third step.

The method improves the electric property of the gate insulating film which mainly determine the performance of the FET.

The second step may include evaluating the change rate of the reflectance of the measurement light by using an ellipsometric spectroscope.

In accordance with the method, the formation of the insulating film can be controlled based on the result of in-line optical evaluation by using the ellipsometric spectrometer typically added to an apparatus for manufacturing a semiconductor device for measuring the thickness of an oxide film.

A fifth method of manufacturing a semiconductor device according to the present invention comprises: a first step of forming a substrate having a semiconductor region and a thin insulating film overlying the semiconductor region; a second step of evaluating an optical property of the semiconductor region; a third step of removing the insulating film by dry etching; and a fourth step of controlling a condition for the removal of the insulating film based on the optical property of the semiconductor region evaluated in the second step.

In accordance with the method, information on the presence or absence of the insulating film on the semiconductor region can be obtained by using the fact that light entering the semiconductor substrate reaches only a shallow portion. Based on the information, the process of removing the insulating film can be controlled. Therefore, etching for removing the insulating film can be terminated with proper timing that does not damage the semiconductor region seriously without incurring lower sensitivity or increased noise due to the information from inside the semiconductor region.

The second step may include the steps of: supplying measurement light to the semiconductor region through the insulating film; intermittently supplying exciting light to the semiconductor region through the insulating film; and calculating a change rate of a reflectance of the measurement light by dividing a difference between the respective reflectances of the measurement light in the presence and absence of the exciting light supplied to the semiconductor region by the reflectance of the measurement light in the absence of the exciting light.

In accordance with the method, when the semiconductor region is irradiated with the exciting light, carriers are excited and the electric field changes as the number of carriers changes, so that the reflectance of the measurement light of given wavelengths from the semiconductor region changes. However, if the insulating film has been formed on the semiconductor region, a defective layer for trapping the carriers is present in the surface layer of the semiconductor region, resulting in a lower change rate of the reflectance of the measurement light. As a result, the progression of etching can be sensed promptly and reliably based on the change rate of the reflectance of the measurement light.

The change rate of the reflectance of the measurement light of a wavelength of preferably 600 nm or less, and more preferably 300 to 600 nm, may be calculated in the step of calculating the change rate of the reflectance.

The method uses the measurement light having wavelengths shorter than those of visible light, thereby limiting the entering of the light into the semiconductor region to only a shallow portion and preventing degraded sensitivity due to information from the inside.

The change rate of the reflectance of the measurement light at a specified energy value of the measurement light which provides a near extremal value in a spectrum of the change rate of the reflectance of the measurement light may be calculated in the step of calculating the change rate of the reflectance.

In accordance with the method, the formation of the insulating film can be controlled easily, promptly, and precisely by using the characteristic configuration of the spectrum of the change rate of the reflectance which is increased or decreased depending on the wavelength of the measurement light.

Preferably, the specified energy value of the measurement light is any value included in a range of 3.2 to 3.6 eV.

Preferably, the exciting light is intermittently emitted at a frequency of 1 kHz or less in the step of supplying the exciting light.

A proper range of the change rate of the reflectance of the measurement light when the removal of the insulating is properly completed may be predetermined and the fourth step may include performing dry etching with respect to the insulating film such that the change rate of the reflectance of the measurement light measured in the second step falls within the proper range.

The method minimizes variations in the damaged layers of the insulating films from lot to lot.

The second step may include measuring the change rate of the reflectance of the measurement light in the semiconductor region when the insulating film is formed thereon and the fourth step may include controlling a condition for the removal of the insulating film by remeasuring the change rate of the reflectance of the measurement light in the semiconductor region which varies with the progression of the removal of the insulating film and comparing a result of remeasurement with a result of measurement performed in the second step.

The method minimizes the damaged layer formed in the semiconductor region.

The first step may include forming, as the semiconductor region, a first semiconductor region forming a part of a semiconductor element and a second semiconductor region to be subjected to optical evaluation, the second step may include evaluating the optical property of the second semiconductor region, the third step may include performing an etching process with respect to the first and second semiconductor regions simultaneously, and the fourth step may include controlling a condition for the etching process based on the result of evaluating the optical property of the second semiconductor region.

In accordance with the method, the area and impurity concentration of the second semiconductor region to be subjected to optical evaluation are optimized for optical evaluation, while the properties of the first semiconductor region to be formed with a semiconductor element are not practically affected thereby, which enables more accurate optical evaluation.

The first step may include adjusting an impurity concentration in the second semiconductor region to be higher than an impurity concentration in the first semiconductor region.

Preferably, first step includes composing a portion of the semiconductor region to be subjected to optical evaluation of n-type silicon.

Preferably, a silicon oxide film is formed as the insulating film in the first step.

A gate insulating film may be formed as the insulating film in the first step.

The method minimizes the damaged layer formed in the semiconductor region which is to serve as the source/drain regions mainly determining the performance of the FET.

The first step may include forming a conductive film for a gate electrode on the gate insulating film and the third step may include sequentially pattering the conductive film for a gate electrode and the gate insulating film.

The method controls the removal of the insulating film and thereby minimizes the damaged layer formed in the semiconductor region which is to serve as the source/drain regions mainly determining the performance of the FET.

The second step may include evaluating the change rate of the reflectance of the measurement light by using an ellipsometric spectroscope.

In accordance with the method, the removal of the insulating film can be controlled based on the result of inline optical evaluation by using the ellipsometric spectrometer typically added to an apparatus for manufacturing a semiconductor device for measuring the thickness of an oxide film.

A method of controlling an apparatus for manufacturing a semiconductor device according to the present invention is a method of controlling an apparatus for manufacturing a semiconductor device comprising a chamber for containing a substrate having a semiconductor region, processing means for performing processing with respect to the substrate in the chamber, first light supplying means for intermittently supplying exciting light to the semiconductor region of the substrate placed in the chamber, a second light supplying means for supplying measurement light to the semiconductor region, and reflectance measuring means for measuring a reflectance of the measurement light supplied to the semiconductor region, the method comprising: a first step of supplying the measurement light to the semiconductor region; a second step of intermittently supplying the exciting light to the semiconductor region; a third step of calculating a change rate of the reflectance of the measurement light by dividing a difference between the respective reflectances of the measurement light in the presence and absence of the exciting light supplied to the semiconductor region by the reflectance of the measurement light in the absence of the exciting light; a fourth step of operating the processing means for a specified time till the change rate of the reflectance calculated in the third step reaches a specified value; and a fifth step of monitoring the specified time in the fourth step and outputting a signal for causing maintenance to be performed with respect to the apparatus for manufacturing the semiconductor device when the specified time exceeds a limit value.

The method allows monitoring of the processing time elapsed before the change rate of reflectance reaches a specified value, which is increased by the degradation of the components in the chamber. When the components in the chamber are degraded, therefore, effective maintenance can be performed with proper timing. The maintenance properly performed ensures optimum processing time and prevents the occurrence of a defect in the semiconductor region resulting from the excessive processing time.

The processing means may generate a plasma in the chamber and perform etching with respect to the semiconductor region by using the generated plasma.

The method enables proper maintenance of the chamber if the sensitivity with which the change rate of the reflectance of the measurement light is measured is reduced by a material deposited on the wall faces of the chamber during, e.g., plasma processing, while permitting plasma etching to be performed continuously in the chamber.

The processing means may generate a plasma in the chamber and perform light dry etching by using the generated plasma so as to remove a damaged layer caused by etching performed with respect to the semiconductor region.

The method enables proper maintenance of the chamber if the sensitivity with which the change rate of the reflectance of the measurement light is measured is reduced by a material deposited on the wall faces of the chamber during, e.g., plasma processing, while permitting dry etching for removing the damaged layer caused by plasma etching to be performed continuously in the chamber.

The processing means may introduce an impurity into the semiconductor region.

The method enables proper maintenance of the chamber if the sensitivity with which the change rate of the reflectance of the measurement light is measured is reduced by a material deposited on the wall faces of the chamber during the process of introducing the impurity, while permitting the process of introducing the impurity to be performed continuously.

The processing means may perform annealing after impurity ions are implanted in the semiconductor region.

The method enables proper maintenance of the chamber even if the components of the chamber are degraded by annealing performed at a high temperature, while permitting the annealing process for removing the structural disorder caused by ion implantation to be performed continuously.

The processing means may form a thin insulating film on the semiconductor region.

The method enables proper maintenance of the chamber if the sensitivity with which the change rate of the reflectance of the measurement light is measured is reduced by the degraded components of the chamber during, e.g., thermal oxidation, while permitting the insulating film to be formed continuously by thermal oxidation, CVD, or the like.

When a thin insulating film has been formed on the semiconductor region, the processing means may perform dry etching for removing the insulating film from a top surface of the semiconductor region.

The method enables proper maintenance of the chamber if the sensitivity with which the change rate of the reflectance of the measurement light is measured is reduced by a material deposited on the wall faces of the chamber during, e.g., plasma processing, while permitting dry etching for removing the damaged layer caused by plasma etching to be performed continuously.

The reflectance measuring means measures the reflectance of the measurement light of a wavelength of preferably 600 nm or less, and more preferably 300 to 600 nm.

The change rate of the reflectance of the measurement light at a specified energy value of the measurement light which provides a near extremal value in a spectrum of the change rate of the reflectance of the measurement light may be calculated in the step of calculating the change rate of the reflectance.

Preferably, the reflectance measuring means measures the reflectance of the reflected light of a specified wavelength by using an optical filter.

Preferably, the semiconductor region is composed of n-type silicon.

Preferably, exciting light is intermittently emitted at a frequency of 1 kHz or less in the step of supplying the exciting light.

A semiconductor device according to the present invention comprises: a substrate; a first semiconductor region provided in a top surface of the substrate to form a part of a semiconductor element to be formed on the substrate; and a second semiconductor region having an optical property monitored during processing performed in the first semiconductor region.

The arrangement allows monitoring of the state of the first semiconductor region varying with the progression of a variety of processing performed in the first semiconductor region with respect to a semiconductor wafer by using the optical property of the second semiconductor region. What results is a semiconductor device in which conditions and time for the variety of processing can be determined properly.

The second semiconductor region may be provided in a region other than a region to be formed with a semiconductor chip including the semiconductor element or, alternatively, in the region to be formed with the semiconductor chip including the semiconductor element.

The second semiconductor region may be composed of a semiconductor material to be used for monitoring by optical-modulation reflectance spectrophotometry.

Preferably, the second semiconductor region is composed of n-type silicon.

BRIEF DESCRIPTION OF THE DRAWINGS

FIG. 1 is a flow chart illustrating a method of manufacturing a semiconductor device according to a first embodiment;

DETAILED DESCRIPTION OF THE INVENTION (First Embodiment)

A description will be given to a first embodiment of the present invention.

Figure 4:
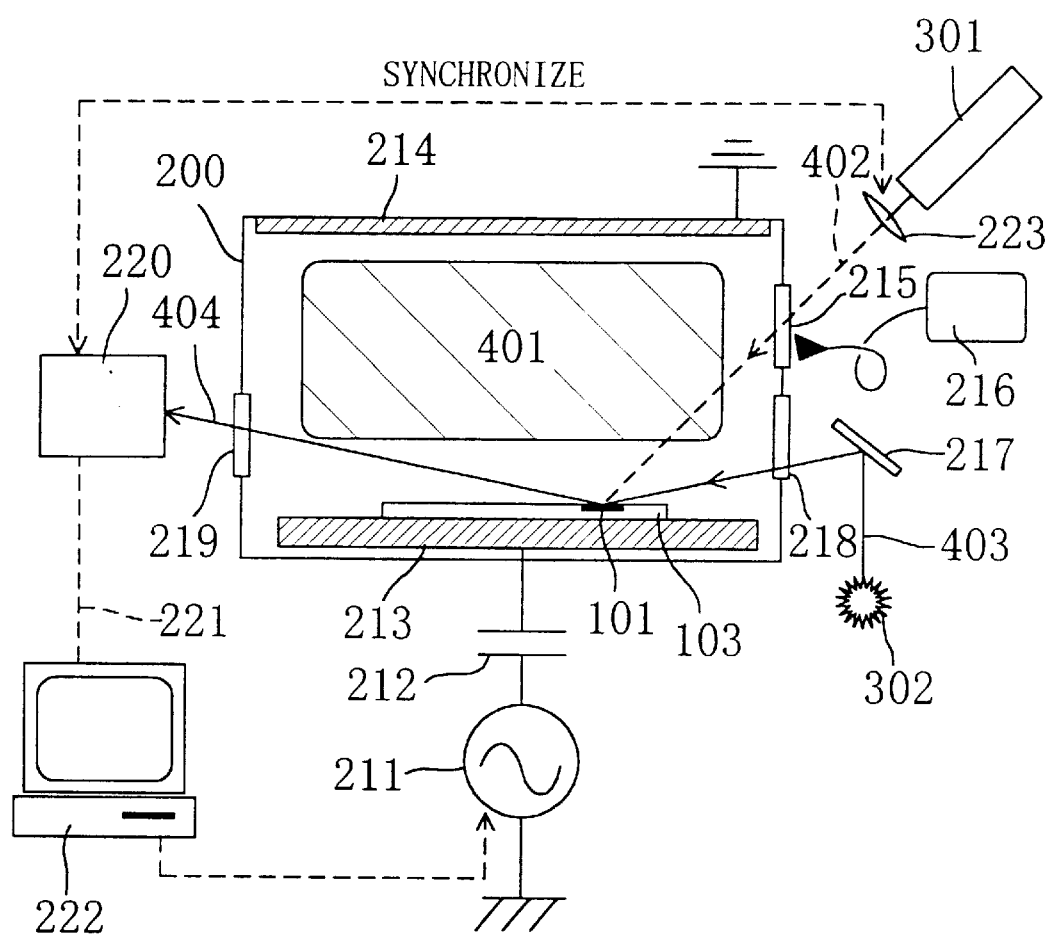
FIG. 4 is a cross-sectional view showing a plasma processing apparatus as an apparatus for manufacturing the semiconductor device according to the first embodiment.

FIG. 4 is a cross-sectional view schematically showing the structure of an etching apparatus including means for monitoring a reflection intensity R according to the first embodiment. As shown in the drawing, a reaction/processing chamber 200 is internally provided with an anode electrode 213 as a lower electrode and a cathode electrode 214 as an upper electrode. A wafer 103 made of p-type silicon has been placed as an object to be processed on the anode electrode 213. When RF power is supplied from an RF power source 211 to the space between the two electrodes 213 and 214 via a coupling capacitor 212, a plasma 401 is generated in the reaction/processing chamber 200. Additionally, an end-point detection window 215, an incident probe light window 218, and a reflected-light monitoring window 219 are provided in the wall faces of the reaction/processing chamber 200.

On the other hand, an end-point detection system 216 and a member for monitoring the reflection intensity R are provided outside the reaction/processing chamber 200. An Xe lamp 302 is provided to generate probe light 403 to be supplied to an n-type semiconductor region 101. The probe light 403 generated from the Xe lamp 302 is reflected by a mirror 217 and sent to the n-type semiconductor region 101 of the wafer 103 disposed in the reaction/processing chamber 200 through the incident probe light window 218. Reflected probe light 404 from the n-type semiconductor region 101 is guided out of the reaction/processing chamber 200 through the reflected-light monitoring window 219 such that the intensity thereof (particularly with a wavelength of 376 nm and energy of 3.3 eV) is measured by the reflection-intensity monitor system 220. Data on the reflection intensity measured by the reflection-intensity monitor system 220 is transmitted to an etching control system 222 via a signal path 221. There is also provided an Ar ion laser 301 for generating exciting light to be supplied to the n-type semiconductor region 101. The exciting light 402 generated from the Ar ion laser 301 is chopped by a chopper 223 with a frequency of 200 Hz and supplied intermittently. The exciting light 402 is introduced into the reaction/processing chamber 200 through the end-point detection window 215 and supplied intermittently to the n-type semiconductor region 101. As described above, the reflection-intensity monitor system 220 measures, as the change rate of reflection intensity, a value (ΔR/R) obtained by dividing the difference ΔR between respective reflection intensities of the probe light 403 (i.e., intensities of reflected probe light 404) in the presence and absence of the exciting light 402 by the reflection intensity R in the absence of the exciting light 402. The arrangement monitors variations in the change rate of reflection intensity. It is to be noted that a polarizer and an analyzer are generally disposed on the incident and reflected sides of the probe light, respectively, in each of the optical systems according to the present and other embodiments which will be described later.

The occurrence of the change rate (ΔR/R) of reflection intensity may be attributed to the following action. In general, when a semiconductor is irradiated with light, an increased number of carriers are excited thereby. Thereafter, the carriers are extinguished while emitting light to return to the original energy levels. The change in the number of carriers changes an electric field so that different reflection intensities are obtained in the presence and absence of exciting light. However, if numerous defects exist in the semiconductor, it follows that interface state densities at lower energy levels are present. Since the defects having such interface state densities at lower energy levels function as layers for trapping carriers, the carriers may be trapped by the defects so that they are not excited to sufficiently high energy levels even when exposed to light. If carriers excited to high energy levels are trapped by the defects, the intensity of light emitted by the excited carriers while returning to the original low energy levels is reduced, which changes the electric field. Accordingly, the change rate (ΔR/R) of reflection intensity becomes lower as the depth of the damaged layer and the degree of damage become larger. Hence, information on the damaged layer can be obtained by monitoring the change rate of reflection intensity.

The frequency for chopping mentioned above is assumed to be related to a time required by the electric field to change due to the recombination of the carriers. Experiments have proved that the frequency for chopping is preferably 1 kHz or less and, more preferably, 500 Hz or less. Preferably, the energy of photons in the exciting light is larger than a band gap in the semiconductor region. In the case of using a silicon substrate, it is preferred to use exciting light at a wavelength at which the energy of photons is 1.1 eV or more. The foregoing description similarly apply to the individual embodiments which will be described later.

Since the present embodiment has assumed that the radiated measurement light has a constant intensity (in each wavelength range), it has substituted the measurement of reflection intensity for the measurement of reflectance. Specifically, the change rate of the reflection intensity of the probe light 403 is measured by intermittently irradiating the n-type semiconductor region 101 with an Ar ion laser beam as the exciting light 402, while continuously irradiating the n-type semiconductor region 101 with light from an Xe lamp as the probe light 403 in another direction. In summary, the value (ΔR/R) obtained by dividing the difference ΔR between respective reflection intensities in the presence and absence of the exciting light 402 by the reflection intensity R in the absence of the exciting light 402 is used as the difference between the reflection intensities, i.e., reflectance.

Figure 22:
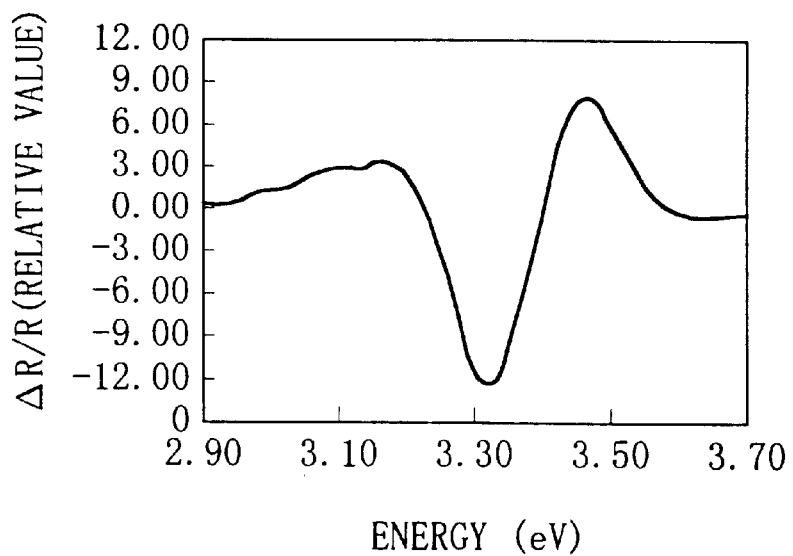
FIG. 22 shows a spectral line of the change rate of reflectance after arsenic ions have been introduced at a dose of $1 \times 10^{15}$ cm$^{-2}$ and subjected to heat treatment.

The process of alternately emitting and not emitting the exciting light, while varying the wavelength of the probe light, and measuring the change rate of reflectance at each wavelength (value of light energy) to examine the spectral configuration thereof is termed optical-modulation reflectance spectrophotometry. For example, FIG. 22 shows a spectral line showing the relationship between an energy value directly proportional to the reciprocal of the wavelength λ of the probe light incident upon a silicon layer as the semiconductor region and the change rate (ΔR/R) of reflectance. In FIG. 22, the change rate (ΔR/R) of reflectance is expressed in relative values in which 0 represents the initial state. The present embodiment uses the probe light of a wavelength of 376 nm corresponding to an energy value of 3.30 eV (energy value which provides an extremal value) at which the change rate (ΔR/R) of reflectance varies most sensitively.

Figure 3:
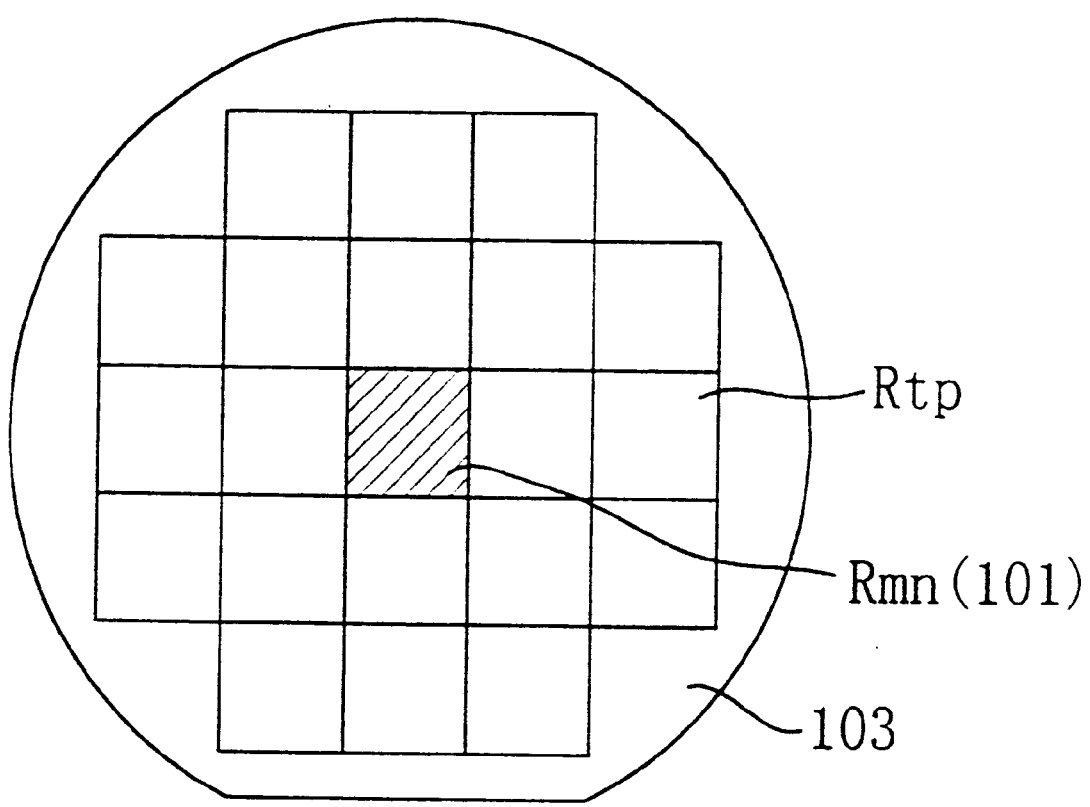
FIG. 3 is a top view of the wafer according to the first embodiment.

FIG. 3 is a top view schematically showing the structure of a wafer according to the present embodiment. As shown in the drawing, the top face of the wafer 103 made of p-type silicon is provided with a chip region Rtp eventually cut out of the wafer and forming a semiconductor chip and a region for monitoring Rmn to be subjected to optical evaluation.

Figure 2A:
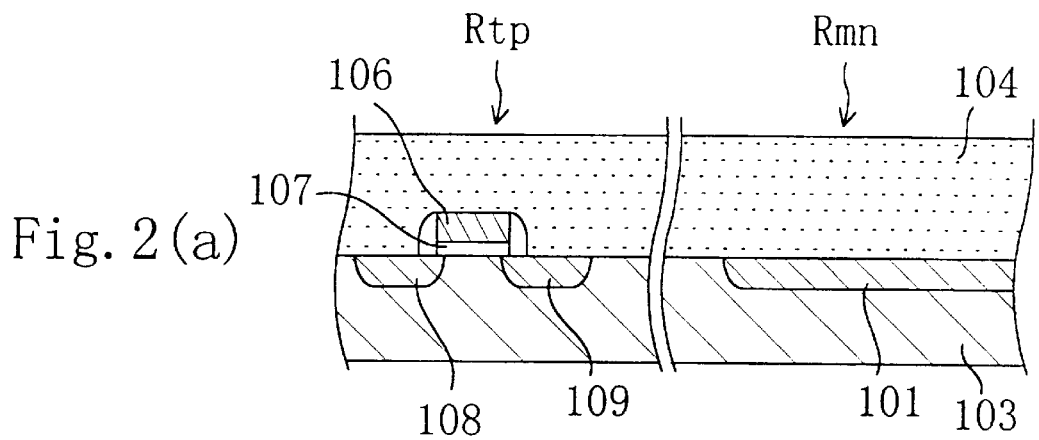
FIGS. 2(a) to 2(c) are cross-sectional views of a wafer during the process of manufacturing the semiconductor device according to the first embodiment.
Figure 2B:
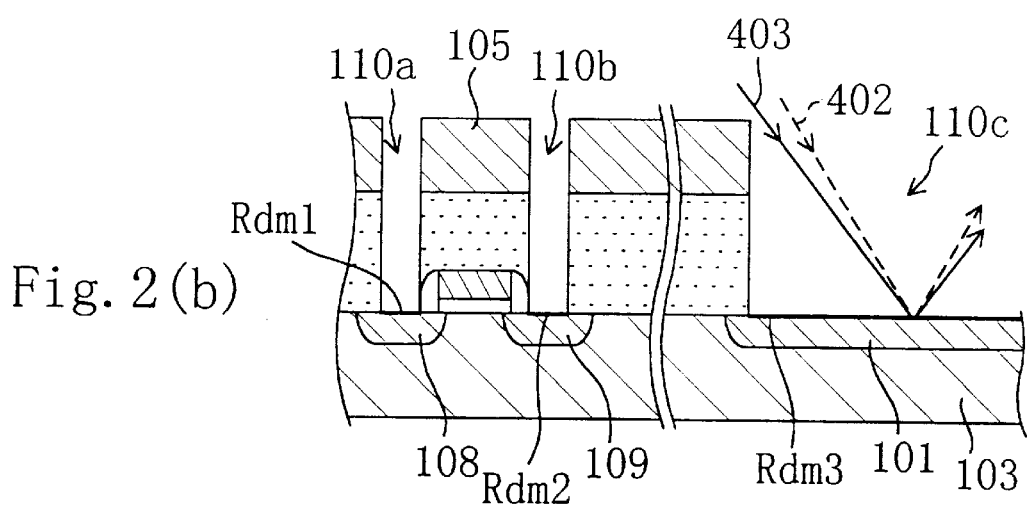
Figure 2C:
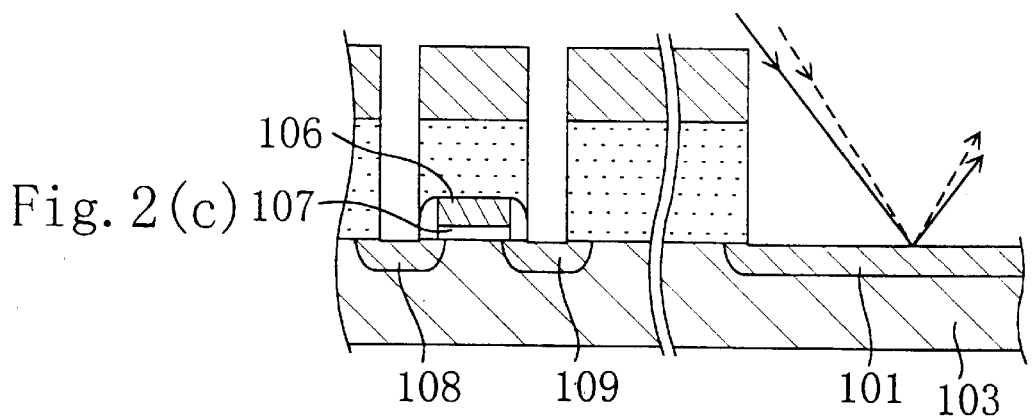

Next, the relationship between the progression of the etching process and the measurement of the change rate (ΔR/R) of reflection intensity in the present embodiment will be described with reference to the cross-sectional structure of the wafer. FIGS. 2(a) to 2(c) are cross-sectional views of the wafer during the process of manufacturing the semiconductor device according to the present embodiment.

Prior to the step illustrated in FIG. 2(a), the n-type semiconductor region (with a resistivity of about 0.02 Ωcm) 101 having an area of, e.g., 13×13 μm² has been formed in the region for monitoring Rmn provided in the top face of the wafer 103. On the other hand, various semiconductor elements have been formed in the chip region Rtp, including a MOS transistor having a gate electrode 106 made of polysilicon, a gate oxide film 107 with a thickness of, e.g., 6 nm, an n-type source region 108, and an n-type drain region 109, as shown in FIG. 2(a). An interlayer insulating film 104 is deposited over the entire surface of the wafer. Although the impurity with which the n-type semiconductor region 101 is doped is of the same conductivity type and at the same concentration as the impurity with which the n-type source/drain regions 108 and 109 are doped in the present embodiment, the impurity with which the semiconductor region inside the region for monitoring Rmn is doped may be of the conductivity type opposite to and at a concentration different from the impurity with which the source/drain regions in a semiconductor element to be monitored are doped, as will be described later. In particular, the completion of the removal of the etching damage can be detected with higher sensitivity by increasing the impurity concentration in the region for monitoring Rmn.

Next, in the step illustrated in FIG. 2(b), a photoresist mask 105 for the formation of contact holes is formed on the interlayer insulating film 104. Subsequently, dry etching is performed to selectively remove the interlayer insulating film 104 by using the photoresist mask 105. As will be described later, the dry-etching process uses a mixture of Ar gas, CHF₃ gas, and CF₄ gas which is introduced into a plasma under the following conditions. The respective flow rates of the Ar gas, CHF₃ gas, and CF₄ gas are 80 sccm, 45 sccm, and 20 sccm. The overall gas pressure is adjusted to be 80 mTorr to cause an RF discharge with power of 400 W. The dry-etching process allows the formation of respective openings 110a and 110b which are contact holes reaching the n-type source/drain regions 108 and 109 of the MOS transistor simultaneously with the formation of an opening for monitoring 110c reaching the n-type semiconductor region 101. At the time at which the completion of the formation of the openings 110a to 110c is detected by the plasma emission method, respective damaged layers Rdm1, Rdm2, and Rdm3 are formed in the n-type source region 108, n-type drain region 109, and n-type semiconductor region 101 of the wafer.

Next, in the process illustrated in FIG. 2(c), light etching (dry etching) is performed to remove the damaged layers Rdm1 to Rdm3 resulting from dry etching. Under the conditions adopted in the present embodiment, the gas flow rates and pressure are unchanged, while the power is reduced to 200 W.

FIG. 1 is a flow chart illustrating the typical procedure for optical monitoring during plasma processing.

First, main etching is performed in a step ST100. After main etching is completed, the initial change rate ($\Delta R/R$) of reflection intensity from the n-type semiconductor region 101 is measured in a step ST101. The present embodiment uses the value measured for the n-type semiconductor region 101 after the completion of main etching as the initial change rate ($\Delta R/R$) of reflection intensity.

Next, plasma processing is performed in a step ST102. In a step ST103, the change rate ($\Delta R/R$) of reflection intensity during plasma processing is monitored. The present embodiment performs light etching as plasma processing and monitors the change rate ($\Delta R/R$) of reflection intensity during light etching.

In a step ST104, the change rate ($\Delta R/R$) during plasma processing (light etching in the present embodiment) is compared with the initial change rate ($\Delta R/R$) of reflection intensity. The steps ST102 to ST104 are repeatedly performed till a standard value preliminarily obtained by experiment such that plasma processing is judged to be completed based on the standard value is reached. When plasma processing is judged to be completed, plasma processing is terminated in a step ST105. The present embodiment terminates light etching in the step ST105 when the removal of the damaged layers is judged to be completed.

Figure 5:
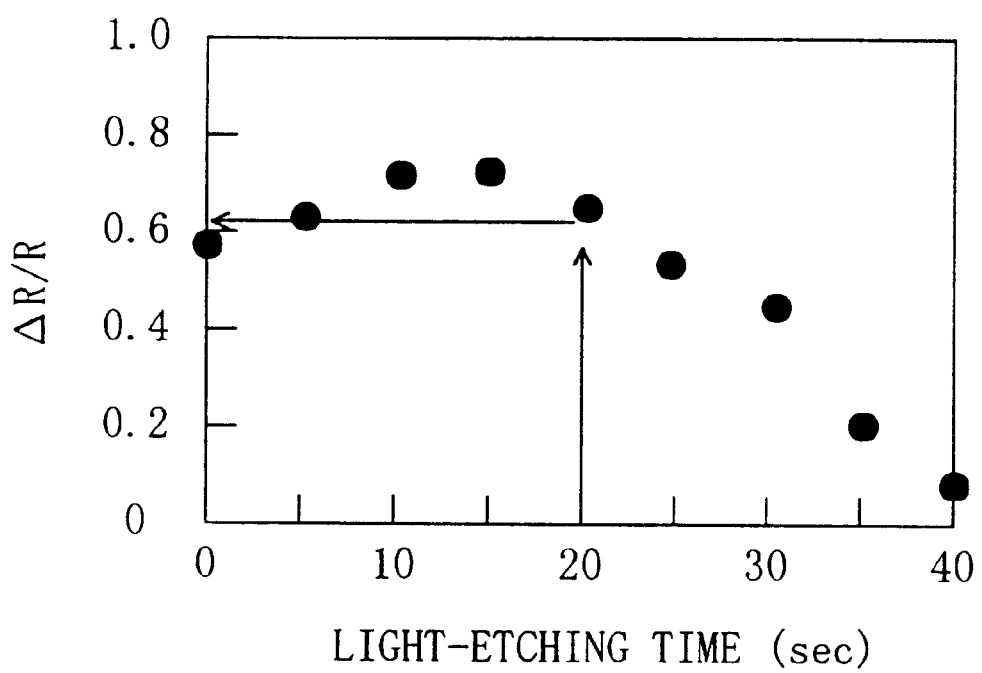
FIG. 5 is a graph showing the relationship between an etching time and the change rate of the intensity of reflected probe light in the first embodiment.

A description will be given to the relationship between the change rate of reflection intensity and the state of the damaged layer in the present embodiment. FIG. 5 shows the time-varying ratio of the change rate ($\Delta R/R$) of reflection intensity at a wavelength of 376 nm (with energy of 3.3 eV) to the initial value thereof. As shown in the drawing, the change rate ($\Delta R/R$) of reflection intensity immediately after the initiation of light etching (between 0 to 20 seconds) is larger than the value at the completion of dry etching in the main step and closer to the initial value thereof, which indicates that the damaged layers have been removed. However, as the light etching time is elongated (after 20 seconds has elapsed), the ratio of the change rate ($\Delta R/R$) of reflection intensity to the initial value thereof becomes smaller than the value at the initiation of light etching (about 0.6 in the example shown in FIG. 5), which indicates that excessive light etching has caused a serious damage to a Si crystal (substrate).

Figure 6:
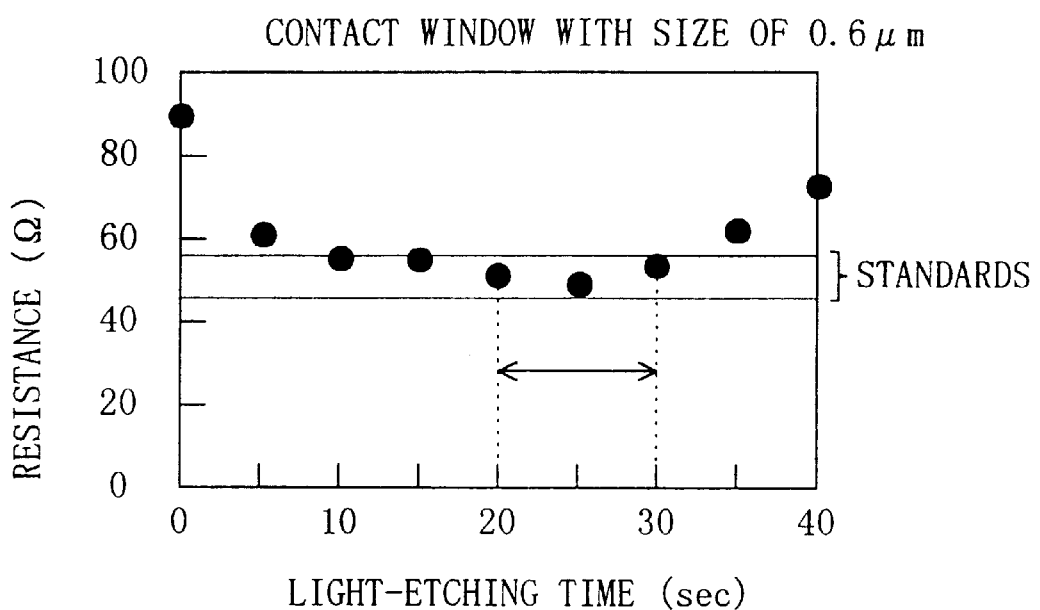
FIG. 6 is a graph showing the relationship between the etching time and contact resistance in the first embodiment.

As shown in FIG. 6, the correlation between the light etching time and the resistance (contact resistance) of a contact portion can be obtained previously by experiment. As shown in the drawing, the contact resistance is high at the initial stage of light etching because an organic polymer generated by the main etching has been deposited on the bottom faces of the contact holes and their vicinities. From the drawing, it can be seen that the deposit of the organic polymer is gradually removed by the subsequent light etching. A comparison between FIGS. 5 and 6 shows that there is a correlation between the contact resistance and the change rate ($\Delta R/R$) of reflection intensity. From the correlation, it will be understood that the change rate ($\Delta R/R$) of reflection intensity should have a value corresponding to 60% or more of the initial value in order to achieve the standard value of the contact resistance (50±5Ω when the size of the contact window is 0.6 μm in cross section). By terminating the light-etching step at the time at which the change rate ($\Delta R/R$) of reflection intensity becomes 60%, therefore, new damage which might be caused by the subsequent light etching can be prevented, while the damaged layers resulting from the main etching are substantially removed, which implements a semiconductor device having excellent contact.

Figure 7:
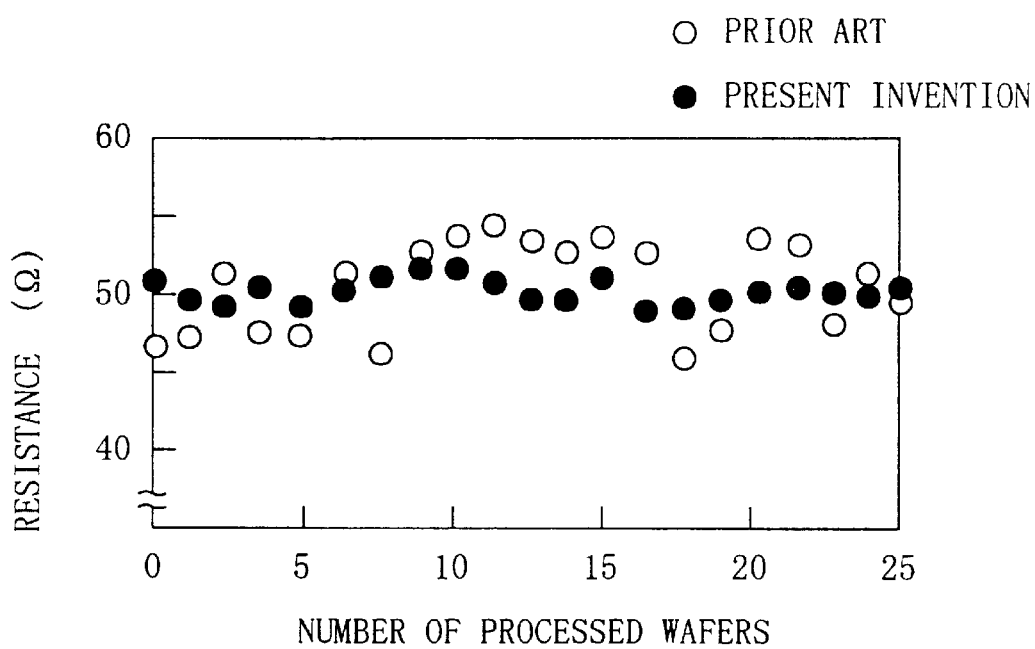
FIG. 7 shows different variations in contact resistance of respective semiconductor devices formed by using a light etching method according to the first embodiment and by using a conventional light etching method.

FIG. 7 shows data for caparison between the contact resistance of a MOS transistor formed by light etching involving optical monitoring for obtaining information on the damaged layers according to the present invention and the contact resistance of a MOS transistor formed by conventional light etching not involving optical monitoring. Compared with the conventional method, the method of manufacturing a semiconductor device according to the present embodiment suppresses variations in contact resistance and enables the manufacturing of a semiconductor device having improved quality and reliability, as shown in the drawing.

A description will be given next to an advantage achieved by monitoring the damaged layers by the optical-modulation reflectance spectrophotometry as achieved in the present embodiment. In general, a depth reached by ions in a semiconductor substrate during plasma processing is on the order of several tens of nanometers. Since a depth reached by a microwave such as an infrared ray in the semiconductor substrate is 1 μm or more, information obtained from reflectance includes not only information on the damaged layers but also plenty of information on the region other than the damaged layers, so that it is difficult to reliably extract information only on the damaged layers. Hence, the method using the microwave is not appropriate for monitoring such an extremely small region as a portion damaged by etching. In the case of using light of a wavelength smaller than those of visible light to perform optical monitoring, a maximum depth reached by the light in the semiconductor substrate is on the order of several hundreds of nanometers, so that the damaged layers each having a depth of several tens of nanometers are detected with considerably high sensitivity. Moreover, the irradiation of the surface of the semiconductor wafer being etched with light provides information directly on the damaged layers. By performing such optical monitoring using the light of wavelengths smaller than those of visible light, information extremely useful for in-line evaluation and process control can be obtained. In view of the foregoing, measurement light of a wavelength equal to or less than 600 nm is preferably used by selecting a light source for the measurement light or by attaching a filter in accordance with the optical-modulation reflectance spectrophotometry used in the present and other embodiments which will be described later, and more preferably, measurement light of a wavelength of 300 to 600 nm is used.

Although the present embodiment has provided the region for monitoring Rmn distinct from the chip region Rtp, the present invention is not limited thereto. The same effects as achieved in the present embodiment can also be achieved even when an optical evaluation pattern is provided in the chip region Rtp.

By controlling a variation in the change rate ($\Delta R/R$) of reflection intensity caused by the light etching process performed during a given period of time, an abnormal condition in the device can promptly be detected, which prevents the device from incurring trouble.

Although the etching process performed in the present embodiment is dry etching using a plasma, the present invention is not limited thereto. The present invention is also applicable to dry etching not using a plasma such as performed by sputtering or even to wet etching.

The present invention is applicable not only to etching performed with respect to a semiconductor region initially having a seriously damaged layer to remove the damaged layer therefrom but also to etching performed with respect to a semiconductor region having substantially no damaged layer.

Although each of the source/drain regions 108 and 109 as the first semiconductor region in the chip region Rtp has the same impurity concentration and depth as the n-type semiconductor region 101 in the region for monitoring Rmn as the second semiconductor region in the present embodiment, the present invention is not limited to the embodiment. The first and second semiconductor regions may have different impurity concentrations and different conductivity types. This is because an optical property (contact resistance in the present embodiment) in the second semiconductor region for achieving proper contact resistance in the first semiconductor region can be predetermined by experiment. For example, it is also possible to particularly increase the impurity concentration of the region for monitoring Rmn in advance to measure the change rate of reflection intensity with higher sensitivity.

Although the angle of incidence of the probe light 403 has been set smaller than the angle of incidence of the exciting light 402 in the present embodiment, the angle of incidence of the probe light 403 of which the measurement of reflection intensity is required is preferably set large in terms of reducing the area of the second semiconductor region to be monitored.

(Second Embodiment)

Figure 8:
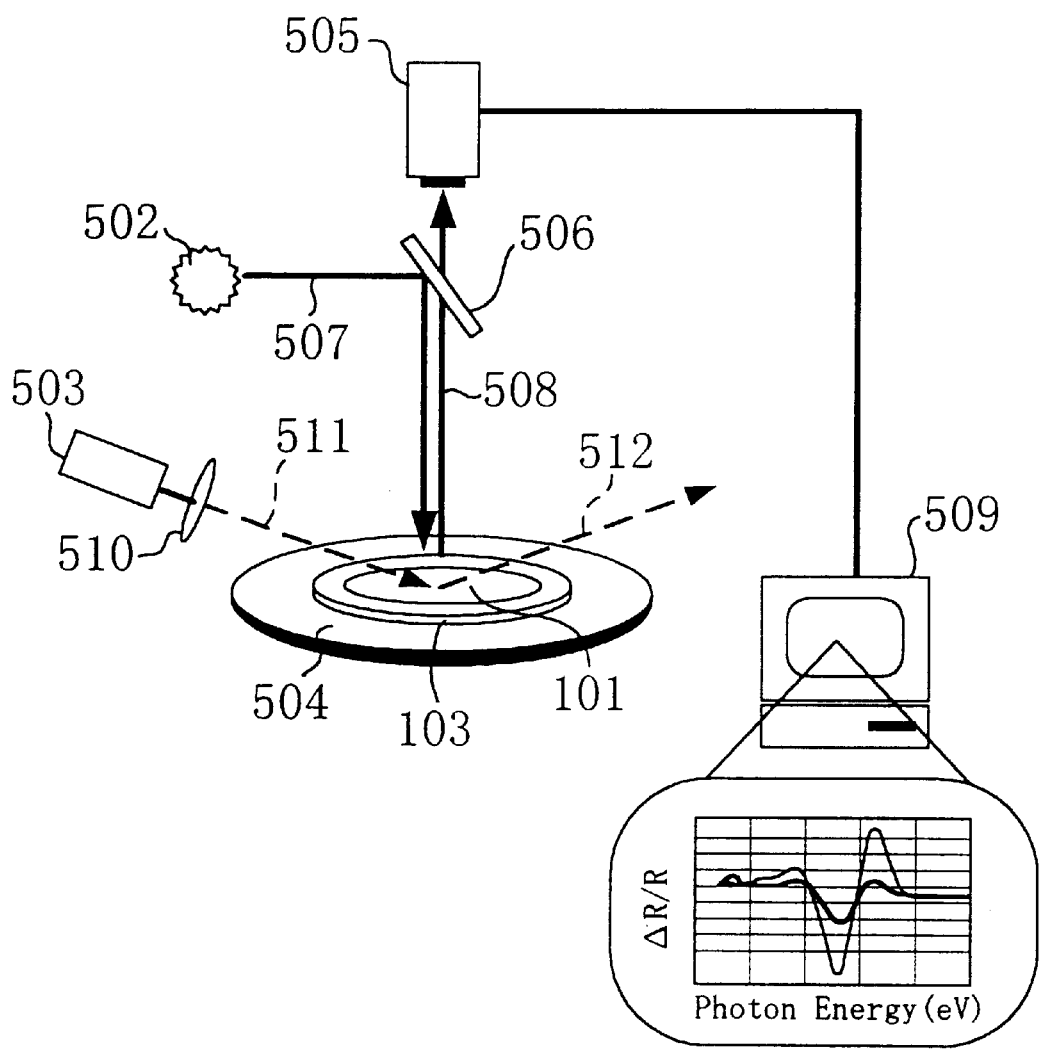
FIG. 8 is a perspective view schematically showing an optical monitor system for a semiconductor device according to a second embodiment.

FIG. 8 shows an optical monitor system according to a second embodiment of the present invention. As shown in the drawing, there is provided an Xe lamp 502 for generating probe 507 light as measurement light to be supplied to an n-type semiconductor region 101. The probe light 507 generated from the Xe lamp 502 is reflected by a mirror 506 and transmitted to the n-type semiconductor region 101 provided in the top face of a wafer 103 placed on a wafer stage 504. Reflected probe light 508 from the n-type semiconductor region 101 is sent to a microscopic system 505 through the mirror 506 such that the intensity thereof (particularly with a wavelength of 376 nm) is measured by a measuring/analyzing system 509. The present embodiment is characterized in that the irradiation of the region for monitoring with the probe light 507 and the extraction of the reflected probe light 508 can be performed in a direction perpendicular to the surface of a sample owing to the microscopic system 505 and the mirror 506 used in combination, which is primarily different from the first embodiment. The probe light 507 can be converged to have a diameter of 10 $\mu m\phi$ by means of a lens 510. Data on the reflection intensity measured by the measuring/analyzing system 509 is transmitted to an etching control system (not shown) via a signal line.

There is also provided an Ar ion laser 503 having power of 5 W to generate exciting light 511 to be supplied to the n-type semiconductor region 101. The exciting light 511 generated from the Ar ion laser 503 is chopped by a chopper 510 with a frequency of 100 Hz and supplied intermittently to the n-type semiconductor region 101. As described above, the difference $\Delta R$ between respective reflection intensities of the probe light 507 in the presence and absence of the exciting light 511 (i.e., intensities of reflected probe light 508) is measured as the change rate of reflection intensity by the measuring/analyzing system 509. The arrangement monitors variations in the change rate of the reflection intensity of the probe light. There is also provided a reflected-exciting-light monitor system for measuring the intensity of reflected exciting light 512 from the semiconductor region 101. Information on the intensity of the reflected exciting light 512 is transmitted to the measuring/analyzing system 509 via a signal line. The chopper 510 has been adapted to operate in synchronization with a detector for measuring the intensity of the reflected light.

As shown in FIG. 3, the top face of the wafer 103 made of p-type silicon is also provided with a chip region Rtp eventually cut out of the wafer and forming a semiconductor chip and a region for monitoring Rmn for optical evaluation in the present embodiment, similarly to the first embodiment.

Figure 9A:
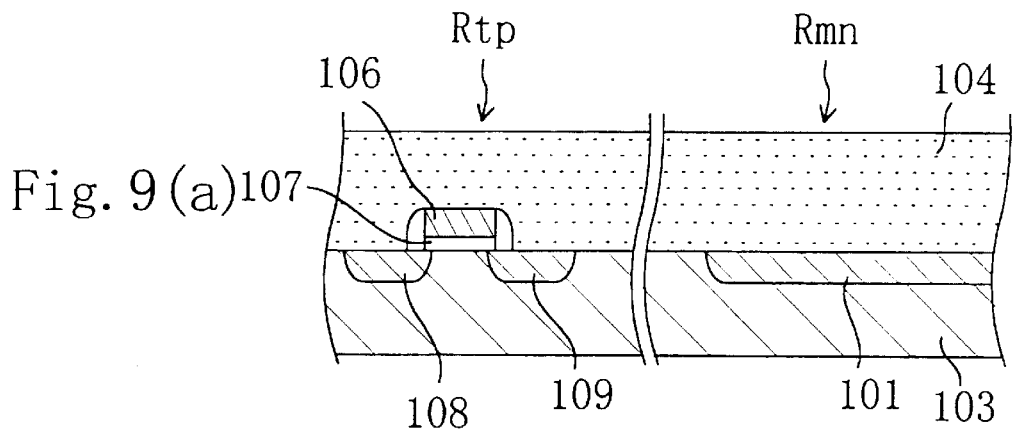
FIGS. 9(a) to 9(c) are cross-sectional views of a wafer during the process fo manufacturing the semiconductor device according to the second embodiment.
Figure 9B:
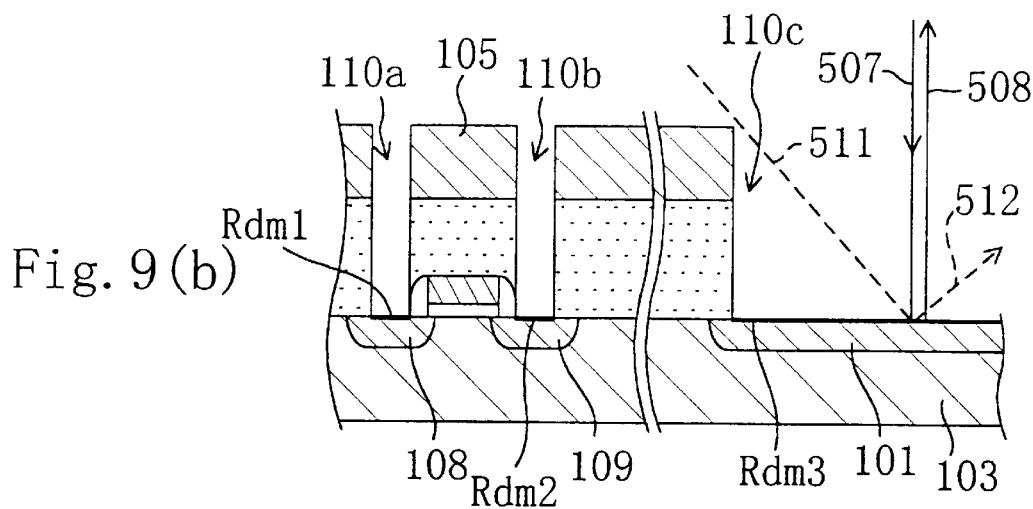
Figure 9C:
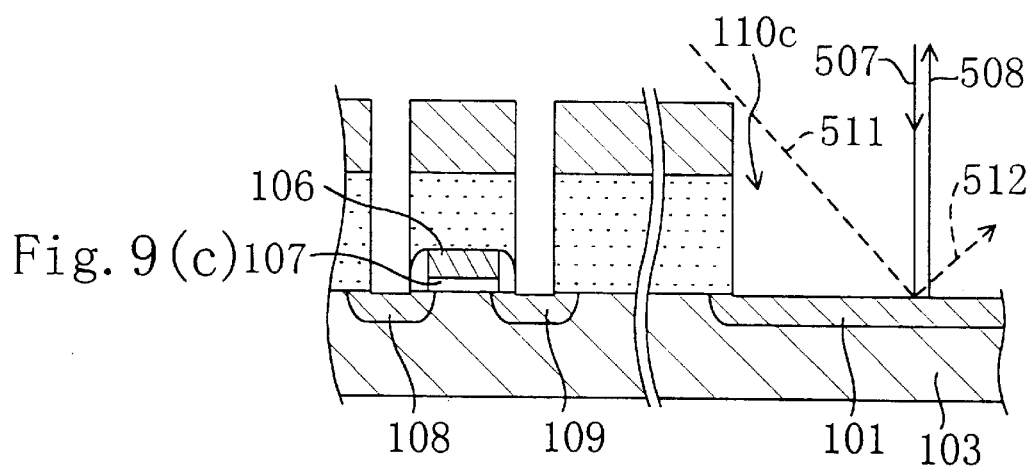

Referring next to FIGS. 9(a) to 9(c), a method of plasma etching according to the present embodiment will be described.

Prior to the step illustrated in FIG. 9(a), the n-type semiconductor region (with a resistivity of about 0.02 $\Omega$/cm) 101 having an area of, e.g., 13×13 $\mu m^2$ has been formed in the region for monitoring Rmn provided in the top face of the wafer 103. On the other hand, various semiconductor elements have been formed in the chip region Rtp, including a MOS transistor having a gate electrode 106 made of polysilicon, a gate oxide film 107 with a thickness of, e.g., 6 nm, an n-type source region 108, and an n-type drain region 109, as shown in FIG. 9(a). An interlayer insulating film 104 is deposited over the entire surface of the wafer. Although the impurity with which the n-type semiconductor region 101 is doped is of the same conductivity type and at the same concentration as the impurity with which the n-type source/drain regions 108 and 109 are doped in the present embodiment, the impurity with which the semiconductor region inside the region for monitoring Rmn is doped may be of the conductivity type opposite to and at a concentration different from the impurity with which the source/drain regions in a semiconductor element to be monitored are doped, as will be described later.

Next, in the step illustrated in FIG. 9(b), a photoresist mask 105 for the formation of contact holes is formed on the interlayer insulating film 104. Subsequently, dry etching is performed to selectively remove the interlayer insulating film 104 by using the photoresist mask 105. The dry-etching process uses a mixture of Ar gas, $CHF_3$ gas, and $CF_4$ gas which is changed into a plasma under the following conditions. The Ar gas, $CHF_3$ gas, and $CF_4$ gas are introduced into a chamber (not shown) at respective flow rates of 80 sccm, 45 sccm, and 20 sccm. The overall gas pressure is adjusted to be 80 mTorr to cause an RF discharge with power of 400 W. The dry-etching process allows the formation of respective openings 100a and 110b which are contact holes reaching the n-type source/drain regions 108 and 109 of the MOS transistor simultaneously with the formation of an opening for monitoring 110c reaching the n-type semiconductor region 101. At the time at which the completion of the formation of the openings 110a to 110c is detected by the plasma emission method, respective damaged layers Rdm1, Rdm2, and Rdm3 are formed in the n-type source region 108, n-type drain region 109, and n-type semiconductor region 101 of the wafer.

Next, in the process illustrated in FIG. 9(c), light etching (dry etching) is performed to remove the damaged layers Rdm1 to Rdm3 resulting from dry etching. Under the conditions adopted in the present embodiment, the gas flow rates and pressure are unchanged, while the power is reduced to 200 W.

Figure 10:
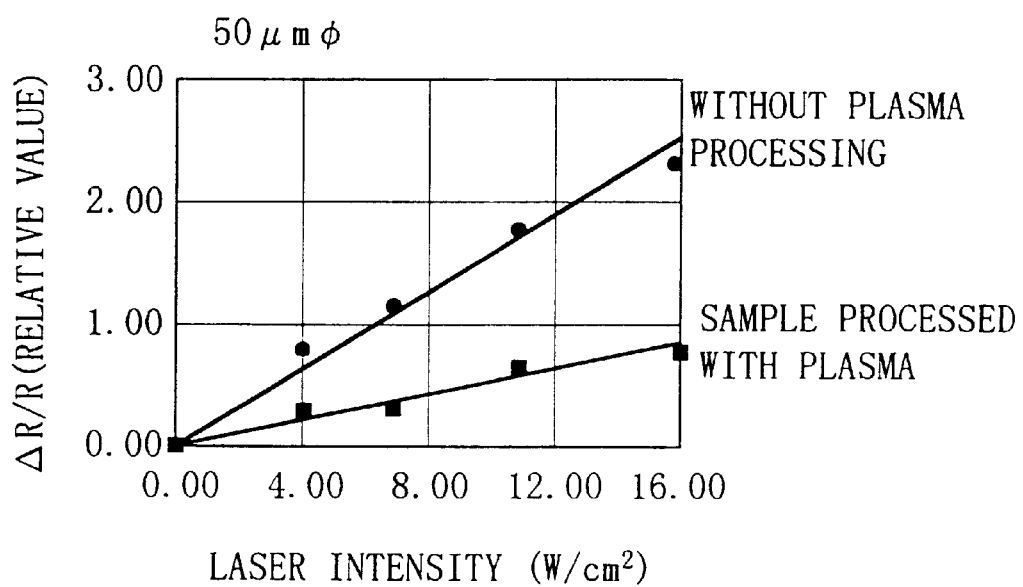
FIG. 10 is a graph showing a difference between the change rate of the reflectance of probe light plotted against the intensity of exciting light for a sample processed with plasma according to the second embodiment and that for a sample without plasma pressing.

FIG. 10 is a graph showing the change rate of the reflectance of probe light plotted as a function of the intensity of exciting light for a sample processed with plasma and that for a sample without plasma processing. As can be understood from the drawing, the change rate (ΔR/R) of the reflection intensity of the probe light for the sample processed with plasma is smaller than that for the sample without plasma processing.

Hence, the present embodiment can also perform a desired amount of light etching by using optical-modulation reflectance spectrophotometry to form source/drain regions composed of low-resistance semiconductor regions, similarly to the first embodiment.

In particular, a Si damaged layer in a miniaturized region can be evaluated more easily in the case of causing the probe light 507 to be incident upon the surface of the wafer in a direction perpendicular thereto and measuring the reflection intensity thereof, as in the present embodiment, than in the case of causing the probe light to be incident upon the surface of the substrate in a direction tilted therefrom. Accordingly, the present embodiment has the advantage of the region for monitoring Rmn reduced in area, which is a useless space.

In the case of causing the probe light 507 to be incident in a perpendicular direction, the reflection intensity along with sensitivity is increased. To conduct high-accuracy measurement in practice, data obtained by performing choppings several times at one measuring point to increase the S/N ratio should be multiplied. In the case of causing the probe light 507 to be incident upon the surface of the wafer in a direction perpendicular thereto, by contrast, a sufficiently high S/N ratio is achieved by only one chopping performed for measurement. Consequently, the number of choppings can be reduced and an evaluation time is reduced. Specifically, in the case of causing the probe light 507 to be incident upon the surface of the wafer in a direction perpendicular thereto, the evaluation time required for one wafer is only 3 minutes, which indicates a significant reduction in evaluation time compared with the case of causing the probe light to be incident upon the surface of the wafer in a 45° tilted direction, where the evaluation time required for one wafer is 15 minutes. In the case of performing in-line evaluation of the damaged layer caused by etching, the reduction in evaluation time is remarkably advantageous.

Although the present embodiment has provided the region for monitoring Rmn distinct from the chip region Rtp, the present invention is not limited thereto. The same effects as achieved in the present embodiment can also be achieved even when an optical evaluation pattern is provided in the chip region Rtp. In the case of irradiating the surface of the substrate with the probe light in a direction perpendicular thereto, it is also possible to directly observe the contact window without providing an additional optical evaluation pattern.

By controlling a variation in the change rate (ΔR/R) of reflection intensity caused by the light etching process performed during a given period of time, an abnormal condition in the device can promptly be detected, which prevents the device from incurring a trouble.

Although the etching process performed in the first and second embodiments is dry etching using a plasma, the present invention is not limited thereto. The present invention is also applicable to dry etching not using a plasma such as performed by sputtering or even to wet etching.

The second invention is applicable not only to etching performed with respect to a semiconductor region initially having a seriously damaged layer to remove the damaged layer therefrom but also to etching performed with respect to a semiconductor region having substantially no damaged layer. The optical evaluation method according to the present invention can also be used extensively to obtain information on the structure of a semiconductor region by measuring the thickness of a silicon oxide film being formed or removed or measuring the degree of recovery of the crystallographic property of the semiconductor substrate during the annealing process.

Although each of the source/drain regions 108 and 109 as the first semiconductor region in the chip region Rtp has the same impurity concentration and depth as the n-type semiconductor region 101 in the region for monitoring Rmn as the second semiconductor region in the first and second embodiments, the present invention is not limited to the embodiments. The first and second semiconductor regions may have different impurity concentrations and different conductivity types. This is because an optical property (contact resistance in the present embodiment) in the second semiconductor region for achieving proper contact resistance in the first semiconductor region can be predetermined by experiment. For example, it is also possible to particularly increase the impurity concentration of the region for monitoring Rmn in advance to measure the change rate of the reflection intensity with higher sensitivity.

(Third Embodiment)

An optical monitor system will be described in a third embodiment of the present invention. It is to be noted that a method of processing a semiconductor device can be implemented similarly to the first and second embodiments and the above-mentioned variations thereof.

Figure 11:
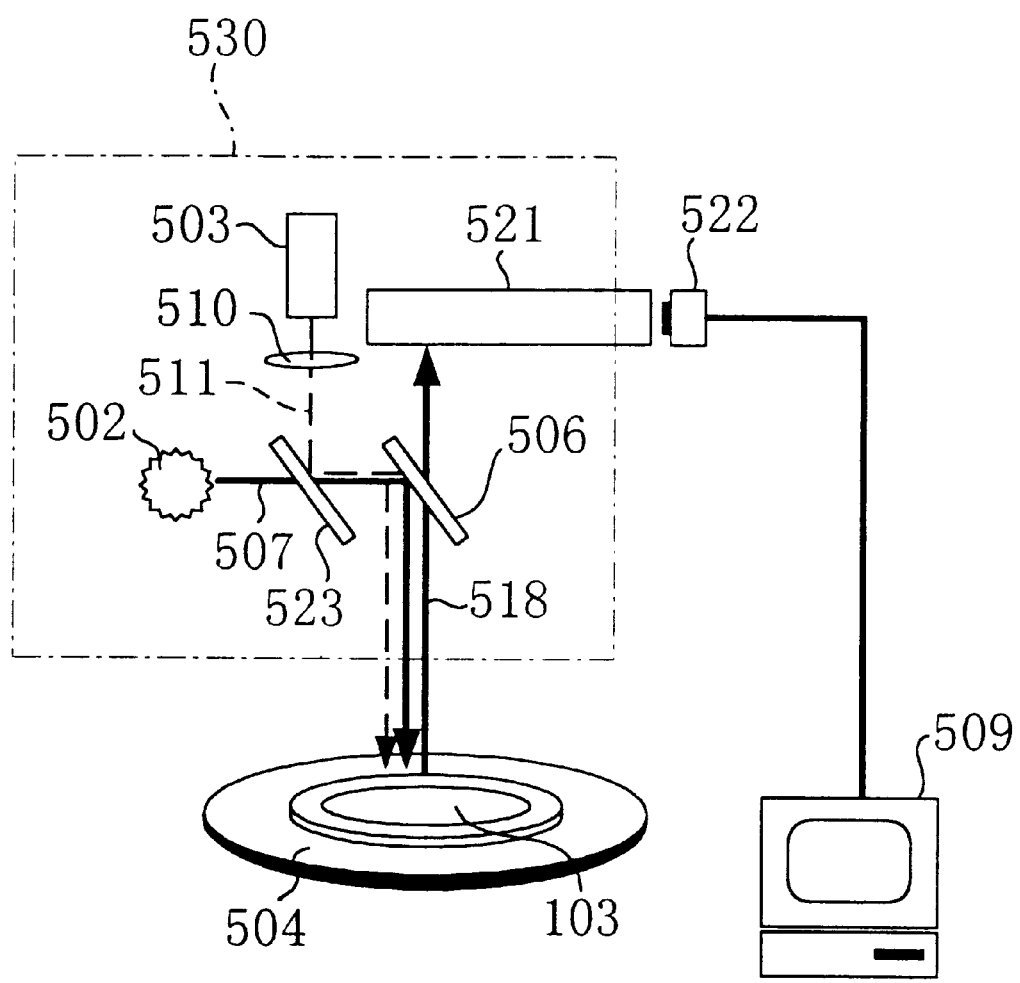
FIG. 11 is a perspective view schematically showing an optical monitor system for a semiconductor device according to a third embodiment.

FIG. 11 is a perspective view of an optical evaluation apparatus according to the present embodiment. In the drawing, the same components as shown in FIG. 8 are designated at the same reference numerals. In the present embodiment, there are provided: a wafer stage 504; an Xe lamp 502; a mirror 506; an Ar ion laser 503; a chopper 510; and a measuring/analyzing system 509, similarly to the second embodiment. The present embodiment is characterized by the provision of a mirror 523 for coaxially guiding exciting light 511 and probe light 507, a spectroscope 521 for separating reflected light 518 containing each of the exciting light and probe light reflected from an n-type semiconductor region of a wafer 103, and a detector 522 for measuring the intensity of light at each wavelength separated by the spectroscope. The Xe lamp 502, the mirrors 506 and 523, the Ar ion laser 503, the chopper 510, and the spectroscope 521 constitute an optical system 530.

In the optical evaluation apparatus according to the present embodiment, the probe light 507 generated from the Xe lamp 502 and the exciting light 511 generated from the Ar ion laser 503 are guided coaxially by the mirror 523, reflected by the mirror 506, and then supplied to the n-type semiconductor region 101 provided in the top face of the wafer 103 placed on the wafer stage 504. The reflected light 518 containing each of the reflected probe light and reflected exciting light from the n-type semiconductor region is sent to the spectroscope 521 through the mirror 506. After the intensity of the reflected light 518 is measured by the detector 522, a change in the intensity thereof is analyzed by the measuring/analyzing system 509.

In this manner, a sample processed with plasma can be evaluated by using the optical evaluation apparatus according to the present embodiment in accordance with a method similar to that shown in the second embodiment. Moreover, since the present embodiment is so constituted as to coaxially guide the probe light and the exciting light and then causing them to be incident upon the n-type semiconductor region provided in the top face of the wafer 103 as the monitoring point, alignment with the monitoring point can be performed with much ease, while the structure of the apparatus is simplified.

The arrangement of the present embodiment allows easier evaluation of the Si damaged layer in a further miniaturized semiconductor region than in accordance with the method shown in the second embodiment. Moreover, since the exciting light is also incident in the perpendicular direction, the beam can be converged to have a diameter of about 30 µm, which allows the evaluation of a sample at a further miniaturized monitoring point than in the case of causing the exciting light to be incident in the 45° tilted direction. On the other hand, the evaluation time can also be reduced to about 20% of the evaluation time required in the second embodiment.

Consequently, it becomes possible to measure damage caused by plasma processing by utilizing a rather large semiconductor region in an LSI of a wafer without providing an additional region for monitoring in the wafer.

(Fourth Embodiment)

Figure 12:
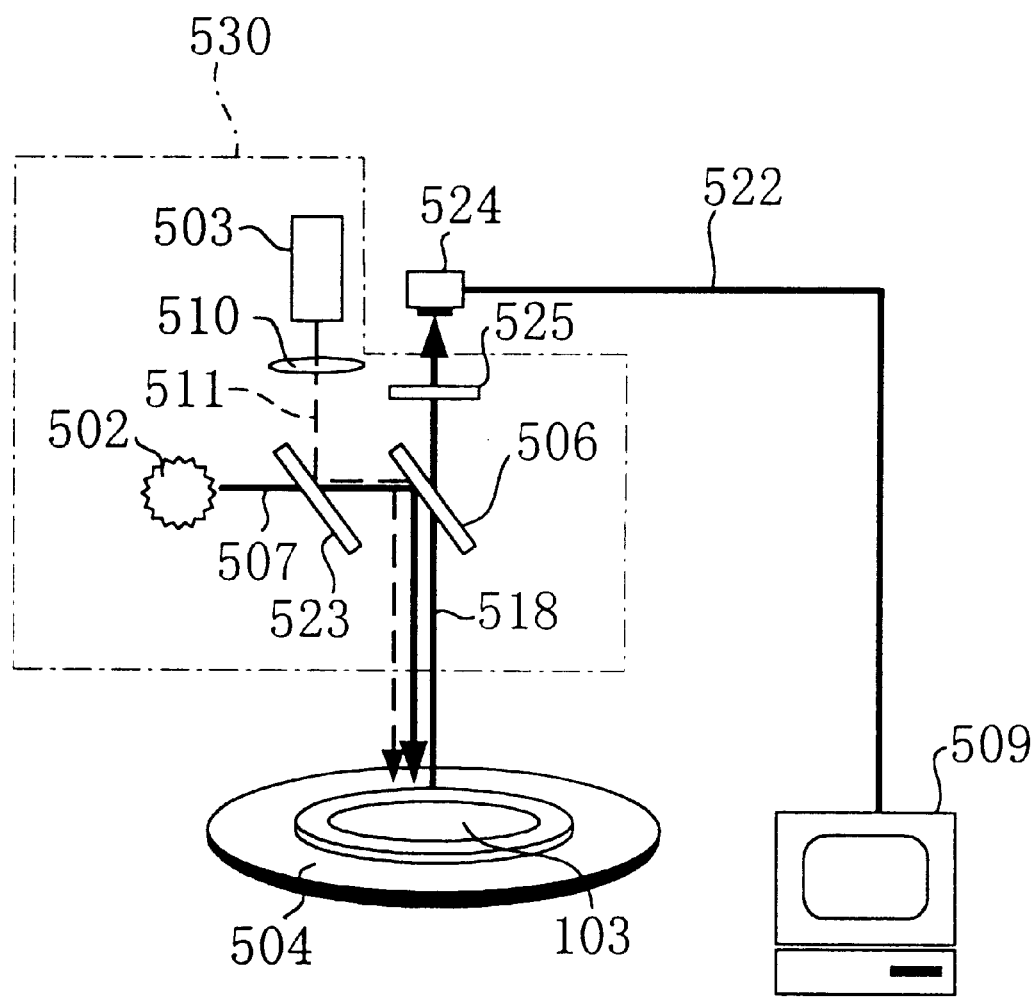
FIG. 12 is a perspective view schematically showing an optical monitor system for a semiconductor device according to a fourth embodiment.

FIG. 12 is a perspective view of an optical evaluation apparatus according to a fourth embodiment of the present invention. In the drawing, the same components as shown in FIG. 11 are designated at the same reference numerals. In the present embodiment, there are provided: a wafer stage 504; an Xe lamp 502; mirrors 506 and 523; an Ar ion laser 503; a chopper 510; and a measuring/analyzing system 509, similarly to the third embodiment. The present embodiment is characterized by the provision of a filter 525 (having a peak wavelength of 350 nm) for selectively transmitting light of a wavelength in a specified region of reflected light 518 containing each of probe light and exciting light reflected from an n-type semiconductor region of a wafer 103 and a detector 524 for measuring the intensity of the light transmitted by the filter 525. The Xe lamp 502, the mirrors 506 and 523, the Ar ion laser 503, the chopper 510, and the filter 525 constitute an optical system 530.

The optical evaluation apparatus according to the present embodiment is different from each of the foregoing embodiments in that the change rate of the reflection intensity of the probe light of a wavelength in a specified range can be measured without performing a spectroscopic process. The method reduces a time required for evaluation to the order of several seconds.

Figure 13:
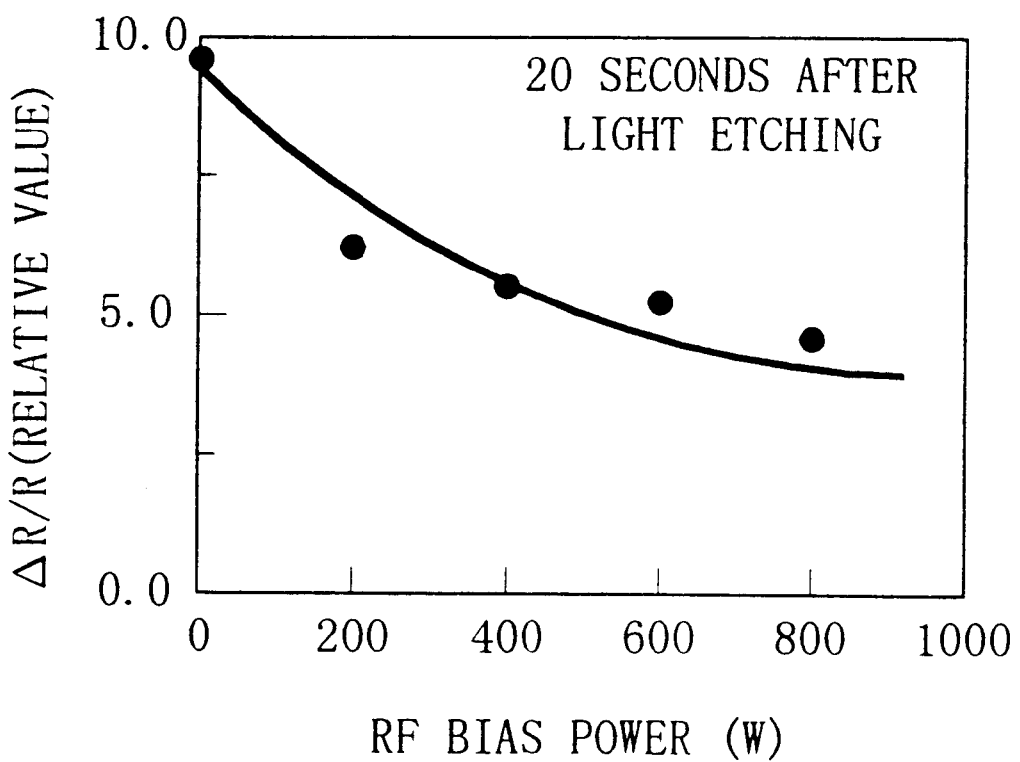
FIG. 13 is a graph obtained by plotting the change rate of the intensity of reflected probe light as a function of RF power when light etching is performed for 20 seconds by using the optical monitor system according to the fourth embodiment.

FIG. 13 shows the result of measuring the change rate ($\Delta R/R$) of the intensity of the reflected probe light plotted as a function of RS bias power after light etching was performed for 20 seconds. From the properties of the filter, it can be considered that the result shown in the drawing was obtained by calculating the integral of the intensity of light of a wavelength in a range of 350 to 390 nm, since, in this case, the light transmitted by the filter 525 is monitored by the detector 524 and the reflected probe light is not separated for spectral analysis. As can be seen from FIG. 13, the change rate ($\Delta R/R$) of the reflection intensity of the probe light becomes lower as the plasma intensity becomes higher. This indicates that the processed region has been damaged more seriously. Thus, the method of the present embodiment has also proved that the change rate of the reflectance of measurement light varies depending on different degrees of plasma processing. As described above, since the present embodiment does not require spectral analysis, the evaluation time can be reduced to the order of several seconds.

(Fifth Embodiment)

Figure 14:
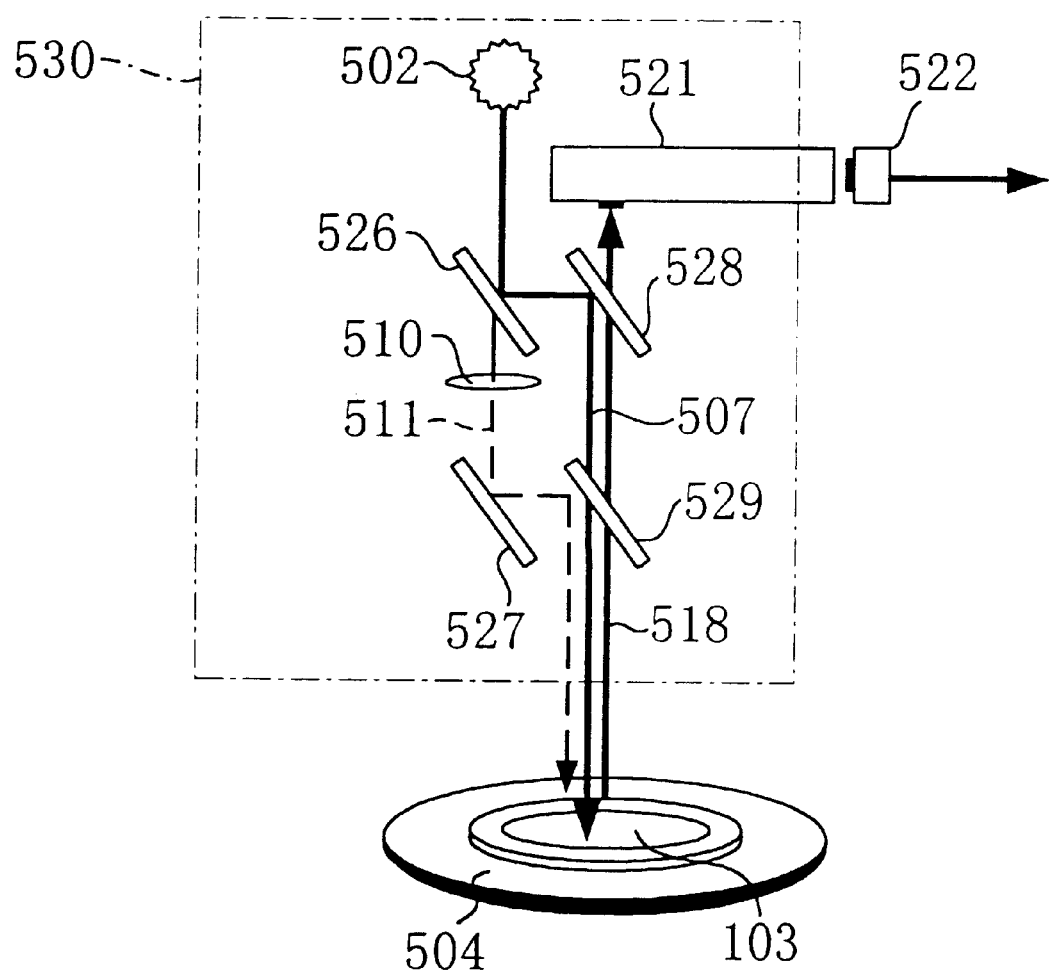
FIG. 14 is a perspective view schematically showing an optical monitor system for a semiconductor device according to a fifth embodiment.

FIG. 14 is a perspective view of an optical evaluation apparatus according to a fifth embodiment of the present invention. In the drawing, the same components as shown in FIG. 11 are designated at the same reference numerals. In the present embodiment, there are provided: a wafer stage 504; an Xe lamp 502; a chopper 510; a spectroscope 521; and a detector 522, similarly to the third embodiment. The present embodiment is characterized in that a beam splitter 526 for splitting light generated from the Xe lamp 502 into probe light 507 and exciting light 511, a mirror 527 for reflecting the exciting light 511, a mirror 528 for reflecting the probe light 507 and transmitting the reflected light 518 from a wafer 103 therethrough, and a combinational mirror 529 for transmitting the probe light 507 therethrough and reflecting the exciting light 511 so that they are guided to the wafer, while transmitting the reflected light therethrough are provided in an optical system 530. The Xe lamp 502, the chopper 521, the beam splitter 526, the mirrors 527 and 528, the combinational mirror 529, and the spectroscope 521 constitute the optical system 530. The present embodiment is different from each of the foregoing embodiments in that the light from the Xe lamp 502 as a single light source is split into the probe light 507 and the exciting light 511 and then optical-modulation reflectance spectrophotometry is performed similarly to each of the foregoing embodiments. Since only one light source is sufficient in the present embodiment, the optical system 530 can be miniaturized as shown in FIG. 14. Moreover, since it is not necessary to use a laser, lower cost as well as improved maintenance efficiency can be achieved.

Figure 15:
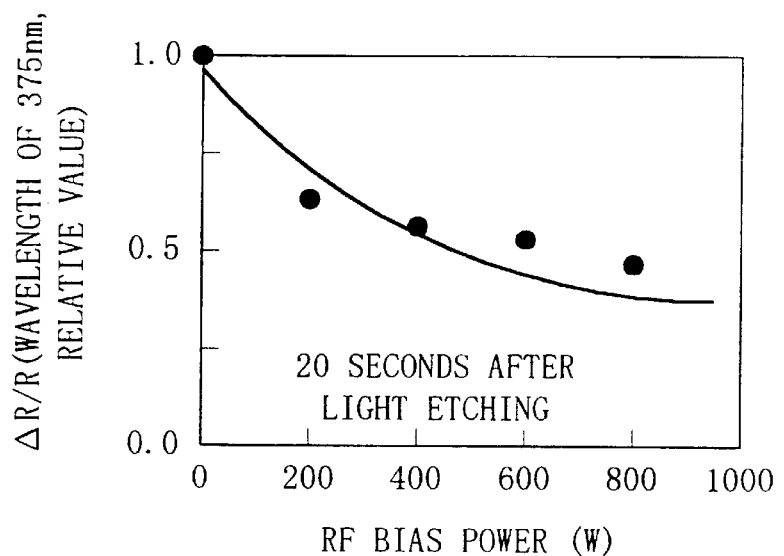
FIG. 15 is a graph obtained by plotting the change rate of the intensity of reflected probe light as a function of RF power when light etching is performed for 20 seconds by using the optical monitor system according to the fifth embodiment.

FIG. 15 shows the result of measuring the change rate ($\Delta R/R$) of the reflection intensity of the probe light plotted as a function of RS bias power after light etching was performed for 20 seconds. As can be seen from FIG. 15, the change rate ($\Delta R/R$) of the reflection intensity of the probe light becomes lower as the plasma intensity becomes higher. This indicates that the processed region has been damaged more seriously. Thus, the method of the present embodiment has also proved that the change rate of the reflectance of measurement light varies depending on different degrees of plasma processing.

Figure 16:
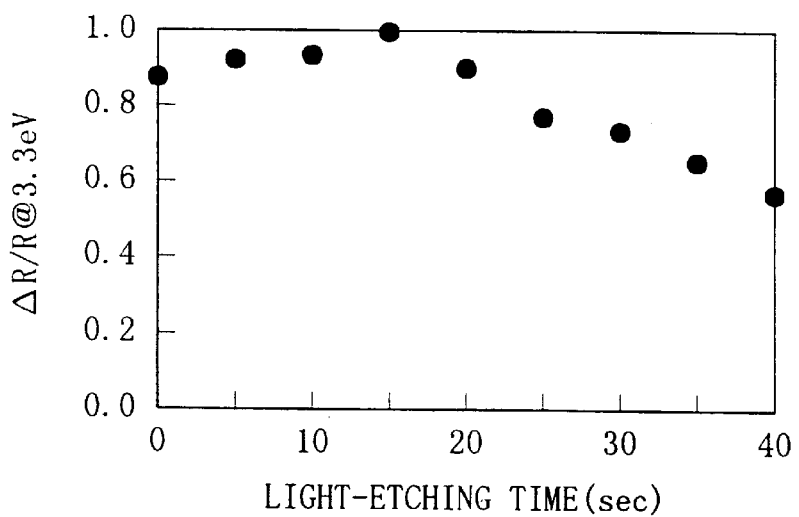
FIG. 16 is a graph showing the relationship between an etching time and the change rate of the intensity of reflected probe light in the fifth embodiment.

FIG. 16 shows the result of measuring the time-varying ratio of the change rate ($\Delta R/R$) of the reflection intensity of the probe light at a wavelength of 376 nm (with energy of 3.3 eV) to the initial value thereof by using the optical evaluation apparatus according to the present embodiment. As shown in the drawing, the change rate ($\Delta R/R$) of the reflection intensity of the probe light varies with the progression of light etching in basically the same manner as illustrated in FIG. 5. In the present embodiment, however, the change rate of the reflection intensity ($\Delta R/R$) itself is larger in value than in FIG. 5. This indicates that sensitivity has been increased by causing the exciting light to be incident also from above.

(Plasma Processing Apparatus Commonly Used in Second to Fifth Embodiments)

Figure 17:
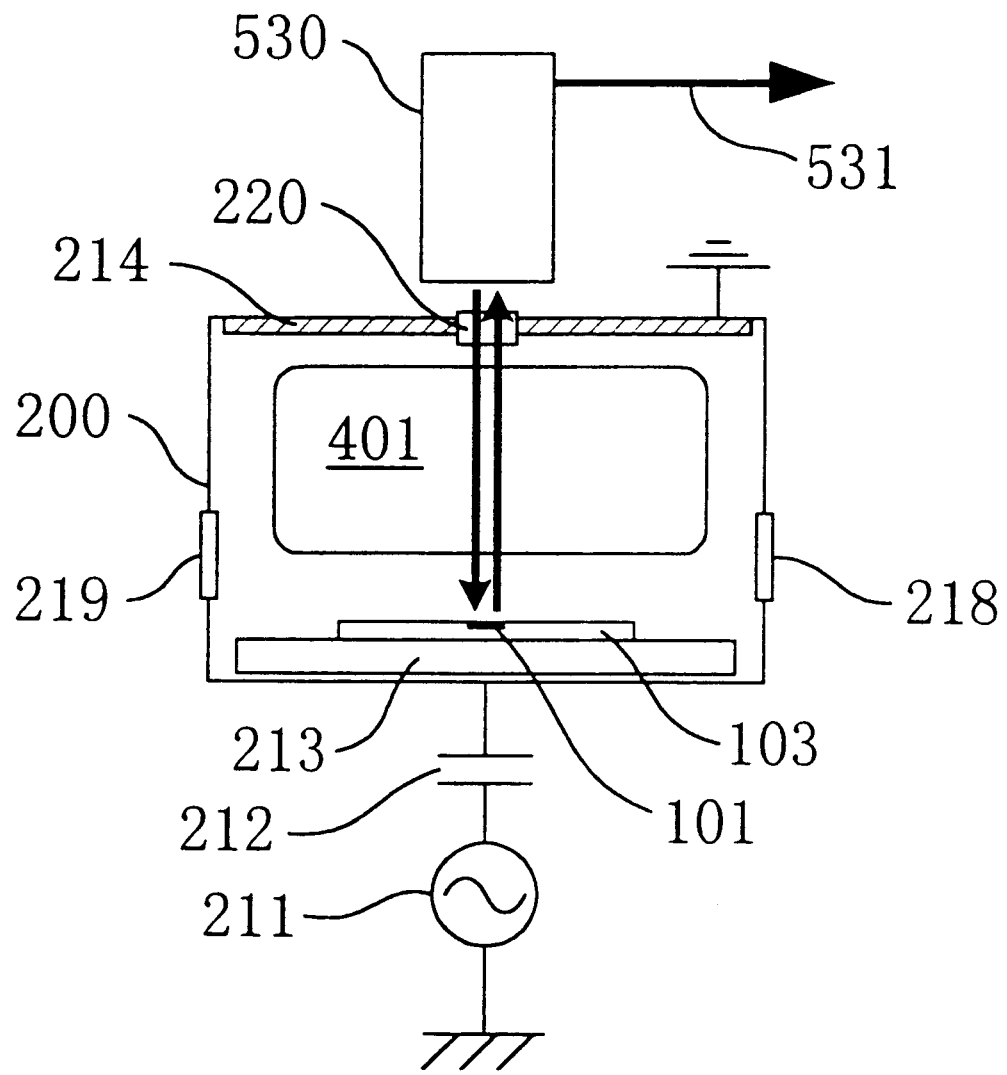
FIG. 17 is a cross-sectional view schematically showing the optical monitor system according to any of the third to fifth embodiments that has been attached to the plasma processing apparatus.

FIG. 17 is a cross-sectional view schematically showing the structure of a plasma processing apparatus commonly used in the second to fifth embodiments. As shown in the drawing, the plasma processing apparatus comprises: a chamber 200; an RF power source 211 for supplying RF power to generate a plasma; a coupling capacitor 212; a lower electrode 213 disposed on the bottom portion of the chamber 200 internally thereof; an upper electrode 214 disposed on the ceiling portion of the chamber 200 internally thereof; sight windows 218 and 219 formed in the side walls of the chamber 200; and a monitoring window 220 formed in the ceiling portion of the chamber 200 approximately centrally thereof. It is to be noted that the drawing of a wafer stage is omitted in FIG. 17. A plasma region 401 is produced between the upper and lower electrodes 214 and 213 with RF power supplied from the RF power source 211 so that an n-type semiconductor region 101 provided in a wafer 103 placed on the lower electrode 213 is processed thereby.

As shown in FIG. 17, the optical system 530 can be positioned collectively above the monitoring window 220 of the chamber 200 in the third to fifth embodiments. In the second embodiment, however, only the optical system for probe light is positioned above the monitoring window 220, while the optical system for exciting light is positioned laterally of the sight windows 218 and 219.

The structure of the plasma processing apparatus allows at least the probe light to be incident upon the surface of the wafer in a direction perpendicular thereto. By monitoring the change of the reflectance of the probe light, real-time process monitoring can be performed. Feedback to processing conditions or the like can also be accomplished by using a signal 531 from the optical system.

(Sixth Embodiment)

Figure 18:
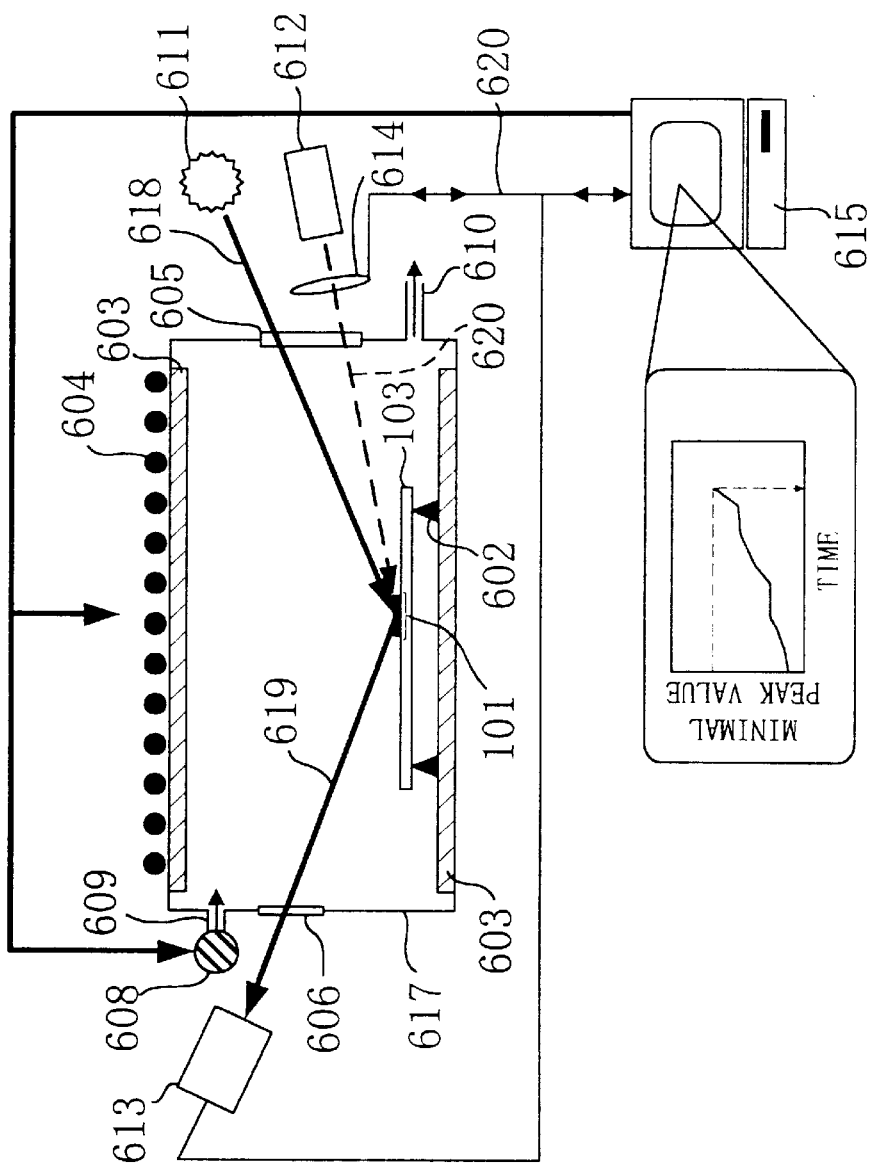
FIG. 18 is a cross-sectional view schematically showing the structure of a semiconductor heat treatment apparatus according to a sixth embodiment.

FIG. 18 is a cross-sectional view schematically showing the structure of a heat treatment apparatus (annealing processing apparatus) for a semiconductor device according to a sixth embodiment of the present invention. As shown in the drawing, a quartz tube 603 has been attached to the inner wall of a reaction vessel 617. A wafer 103 has been placed on the inner side face of the reaction tube 603 via wafer susceptors 602. On the outer side face of the quartz tube 603, there has been mounted heaters 604 using an infrared ray. The heaters 604 heat the wafer 103 in the quartz tube 603. The reaction vessel 617 is formed with an inlet 609 for reaction gas and an outlet 610 for reaction gas. The flow rate of the reaction gas can properly be adjusted by using a flow-rate control meter 608. The side faces of the reaction vessel 617 are formed with two respective quartz windows 605 and 606 for monitoring which are opposed to each other. The wafer 103 is partially provided with an n-type semiconductor region 101 (with a resistivity of about 0.02 $\Omega$cm) such that light caused to be incident upon the n-type semiconductor region 101 provided in the top face of the wafer 103 through the quartz window 605 for monitoring is guided out through the other quartz window 606. A pattern (having an area of 13×13 $\mu m^2$) for optical evaluation has been provided in the n-type semiconductor region 101 of the wafer 103, though the drawing thereof is omitted in FIG. 18.

Outside the reaction vessel 617, there are provided: an Xe lamp 611 for generating probe light 618 as measurement light which is incident upon the inside of the reaction vessel 617; an Ar ion laser 612 (providing an output of 1 W) for generating exciting light 620 in the reaction vessel 617; a chopper 614 for chopping the exciting light 620 with a wavelength of 200 Hz; and a detector 613 for receiving reflected probe light 619 from the n-type semiconductor region 101 provided in the top face of the wafer 103 and measuring the intensity thereof. In short, the heat treatment apparatus according to the present embodiment supplies the probe light 618 generated from the Xe lamp 611 as well as the exciting light 620 generated from the Ar ion laser 612 and chopped by the chopper 614 with a frequency of 200 Hz to the n-type semiconductor region 101 provided in the top face of the wafer 103 as the evaluation pattern and monitors a reflectance variation based on the changing intensity of the reflected probe light 619 from the ntype semiconductor region 101 due to the presence or absence of the exciting light 620. A control-system computer 615 controls the operations of the heaters 604, chopper 614, and flow-rate control meter 608. The heat treatment apparatus also latches a measurement signal from the detector 613 to monitor the optical property of the n-type semiconductor region 101. The chopper 614 has been adapted to operate in synchronization with the detector 613 for measuring the intensity of the reflected light.

Next, a description will be given to the principle of the optical evaluation method using the change of the reflectance.

The change rate of the reflectance of the measurement light is a value ($\Delta R/R$) obtained by dividing the difference $\Delta R$ between respective reflectances of the measurement light in the presence and absence of the exciting light supplied to the semiconductor region as the object of evaluation by the reflectance R of the measurement light in the absence of the exciting light. The changing of the reflectance of the measurement light may be attributed to the following action. In general, when a semiconductor is irradiated with light, an increased number of carriers are excited thereby. Thereafter, the carriers are extinguished while emitting light to return to the original energy levels. The change in the number of carriers increases or decreases the intensity of an electric field so that the reflection intensity of the measurement light differs in the presence and absence of exciting light. When the structure of the semiconductor region is in the crystallographically complete state, the change rate of the reflectance varies with the wavelength of the measurement light.

A spectrum obtained by plotting the change rate of the reflectance of the measurement light at each wavelength exhibits characteristic properties in accordance with an energy gap which is a difference between the bottom of the conduction band and the top of the balance band of a semiconductor composing the semiconductor region.

Figure 24:
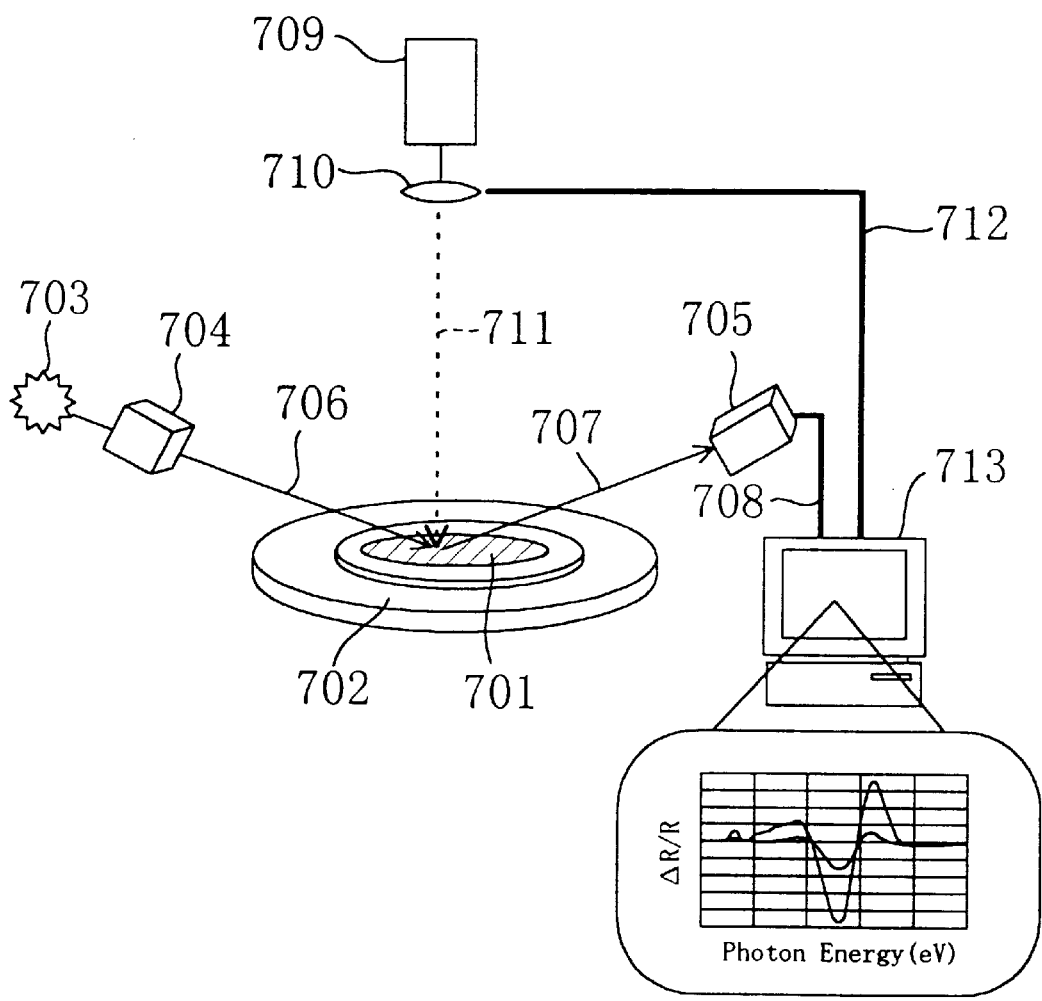
FIG. 24 is a block diagram partially showing in perspective the structure of an optical evaluation apparatus according to an eighth embodiment.

FIG. 24 shows an example of the spectrum, in which the change rate ($\Delta R/R$) of reflectance reaches a minimal value (an extremal value) in a wavelength range corresponding to energy of 3.3 eV and reaches a maximal value (extremal value) in a wavelength range corresponding to energy of 3.5 eV. Of the two extremal values of the change rate ($\Delta R/R$) of reflectance, the minimal value has an absolute value larger than that of the maximal value.

However, if numerous structural disorders such as a crystallographical defect and a deviation from the normal state of the electric structure exist in a semiconductor, it follows that a trap energy level lower in energy level exists in that region. Since the low-energy region produced by the structural disorders functions as a layer for trapping carriers, an increase in the number of carriers decreases, resulting in a reduced difference in the intensity of the electric field. Accordingly, the change rate ($\Delta R/R$) of the reflectance of the measurement light is lower as the portion of the semiconductor region structurally disordered by the implantation of impurity ions is at a greater depth and the level of disorder incurred thereby is more serious. In the case where the structural disorder is considerably serious, the reflectance of the measurement light does not substantially change on exposure to the exciting light. In this case, the spectrum obtained by plotting the change rate of the reflectance of the measurement light at each wavelength has a substantially constant and small value.

Thus, by monitoring the change rate of the reflectance of the measurement light, there can be obtained information on the degree of recovery of the semiconductor region in the annealing process after the implantation of impurity ions.

Figure 19:
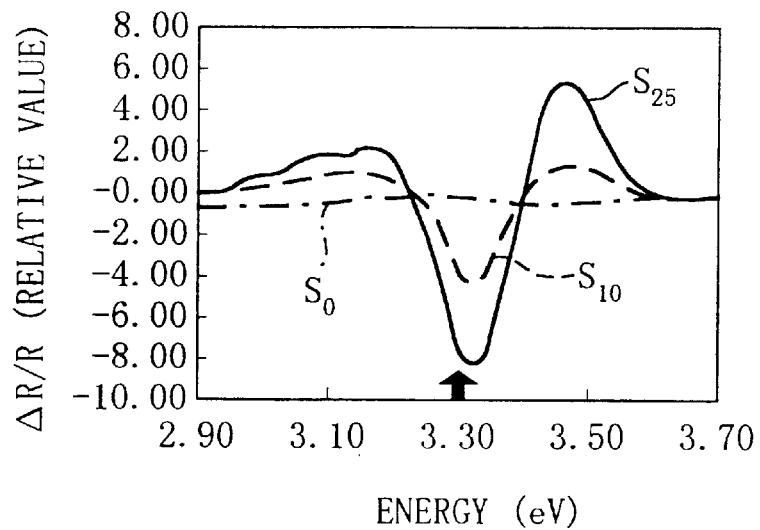
FIG. 19 shows spectral lines of the change rates of reflectance differing in configurations depending on the annealing time.
Figure 20:
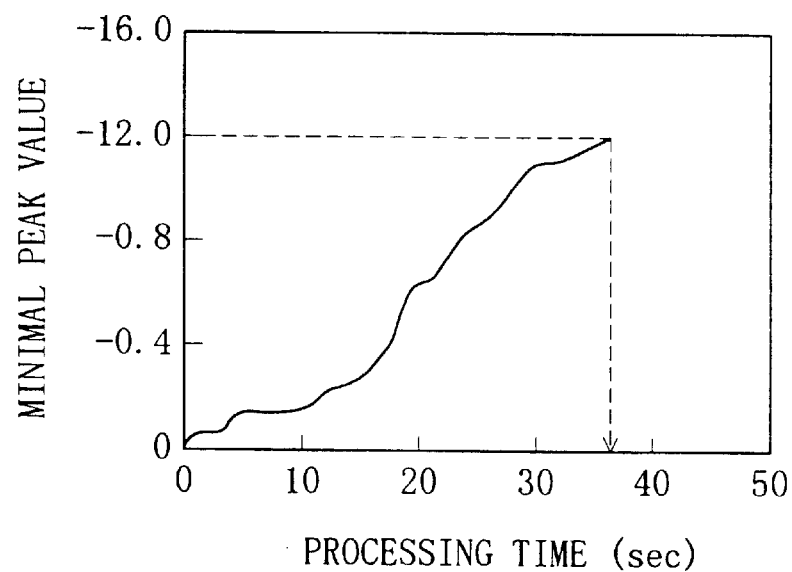
FIG. 20 shows a minimal peak value varying with the annealing time in the sixth embodiment.

Referring next to FIGS. 19 and 20, a description will be given to time-dependent variations in the spectrum of the change rate of the reflectance of the probe light in the annealing process after ion implantation.

FIG. 19 shows spectral lines each representing a relationship between an energy value directly proportional to the reciprocal of a wavelength λ of the probe light and the change rate (ΔR/R) of reflectance. However, since the horizontal axis in FIG. 19 substantially represents the varying wavelengths of the measurement light, FIG. 19 practically shows spectra of the change rate (ΔR/R) of the reflectance plotted against the varying wavelength. Moreover, since the intensity of the probe light 618 is constant in the present embodiment, the change rate (ΔR/R) of the reflectance has been calculated by dividing the difference ΔR between respective intensities of the reflected probe light 619 in the presence and absence of the exciting light 620 by the intensity R of the exciting light 620 in the absence of the exciting light 620. The change rate (ΔR/R) of reflectance is expressed in relative values in which 0 represents the initial state.

In the state prior to the initiation of the heat treatment process, arsenic (As) had already been introduced into the n-type semiconductor region 101 provided in the top face of the wafer 103 contained in the reaction vessel 607 by the process of implanting the impurity ions at a dose of $1 \times 10^{15}$ cm$^{-2}$ with implantation energy of about 35 keV. The spectral line $S_0$ shown in FIG. 19 represents the spectrum of the change rate (ΔR/R) of reflectance immediately after the implantation of impurity ions.

The spectral line $S_{10}$ shown in FIG. 19 represents the spectrum of the change rate (ΔR/R) of reflectance when the wafer 103 has been annealed in an atmosphere of $N_2$ gas at 900° C. for 10 seconds by using the apparatus shown in FIG. 18. The spectral line $S_{25}$ shown in FIG. 19 represents the spectrum of the change rate (ΔR/R) of reflectance when the wafer 103 has been annealed in an atmosphere of $N_2$ gas at 900° C. for 25 seconds by using the apparatus shown in FIG. 18. As shown in FIG. 19, the spectral configuration representing the change rate (ΔR/R) of reflectance has changed significantly with the progression of the annealing process. In short, the spectral configuration represents the degree of recovery of the crystallographic property of Si from damage caused by the annealing process. It will be understood that, as recovery proceeds, the maximal peak value in the spectral line representing the change rate (ΔR/R) of reflectance shifts upwardly and the minimal peak value thereof shifts downwardly.

In view of the foregoing, the present embodiment has focused attention on the minimal peak value in the spectral line which has changed more greatly than the maximal peak value thereof and judged the degree of recovery in the annealing process after the implantation of impurity ions from the minimal peak value in the spectral line. Since the spectral line has the minimal peak value at the point at which energy is about 3.3 eV (at a wavelength of 376 nm), as shown in FIG. 19, it is assumed here that the change rate of reflectance at a wavelength corresponding to energy of 3.3 eV of the reflected probe light 619 provides the minimal peak value in the spectral line.

FIG. 20 shows the time-varying minimal peak intensity of the spectral line in the process of annealing the wafer 103 on the assumption that the change rate of reflectance at a wavelength corresponding to energy of 3.3 eV of the reflected probe light 619 provides the minimal peak value in the spectral line. As shown in the drawing, since the recovery of the crystallographic property of the semiconductor region from damage proceeds with the passage of time in the annealing process, the minimal peak value increases with elapsed time. It was proved by the Raman spectroscopy that, even when the annealing process was terminated at the time at which the minimal peak value becomes −12.0 (35 seconds), the crystallographic property of the semiconductor region (Si crystal in the present embodiment) had recovered satisfactorily.

By thus controlling the annealing process based on the minimal peak value in the spectral line varying in the actual annealing process obtained by preliminary experiment or the like performed with respect to the wafer for monitoring, not on the period of the annealing process determined with a certain degree of allowance, the present embodiment can manufacture a device with a stable crystallographic property as well as stable impurity profiles. Specifically, by monitoring the change rate (ΔR/R) of the reflectance in a specified wavelength region (energy region) during the annealing process, a device with excellent properties can be manufactured through a stable annealing process.

Figure 23:
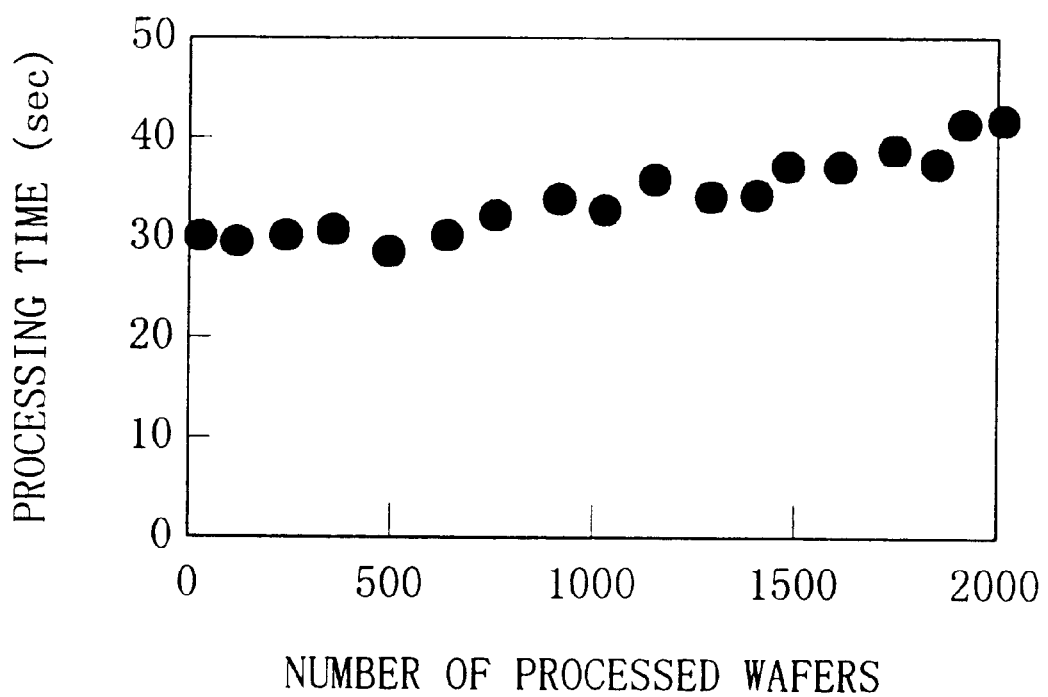
FIG. 23 shows variations in time required by the minimal peak value to reach a specified value during heat treatment, which has been plotted against the number of wafers processed in the sixth embodiment.

Furthermore, the present embodiment has controlled the time required by the minimal peak value to become −12.0 and performed periodical maintenance with respect to the heat treatment apparatus according to the present embodiment at a time at which the time exceeds 40 seconds. FIG. 23 shows variations in annealing time required by the minimal peak value in the spectral line to reach −12.0, which has been plotted against the number of processed wafers. As shown in the drawing, the time required by the minimal peak value to reach −12.0 is increased with the number of processed wafers, which may be attributed to the degraded components of the apparatus. Although trouble such as faulty contact resistance in the semiconductor region has occurred in accordance with the conventional control method when annealing is performed for more than 40 seconds, the control technique according to the present invention can suppress the occurrence of such trouble. Since the optical control technique has been combined with a process-time control technique in the present embodiment, the heat treatment process which has been difficult to control by the conventional method can also be controlled, which achieves stable operation.

Instead of the optical monitor system shown in FIG. 18, the sixth embodiment can use the optical monitor system shown in FIG. 8 according to the second embodiment, the optical monitor system shown in FIG. 9 according to the third embodiment, the optical monitor system shown in FIG. 12 according to the fourth embodiment, or the optical monitor system shown in FIG. 14 according to the fifth embodiment.

(Seventh Embodiment)

A method of measuring an impurity concentration will be described in a seventh embodiment of the present invention.

The present embodiment uses the optical monitor system shown in FIG. 8 which has been used in the second embodiment.

In the present embodiment, however, exciting light 511 is chopped by a chopper 510 with a frequency of 100 Hz and supplied intermittently to the n-type semiconductor region 103a of a wafer 103. Data on the reflection intensity measured by a measuring/analyzing system 509 is transmitted to a heat-treatment control system (not shown) via a signal line. The chopper 510 has been adapted to operate in synchronization with a detector for measuring the intensity of reflected probe light.

Figure 21:
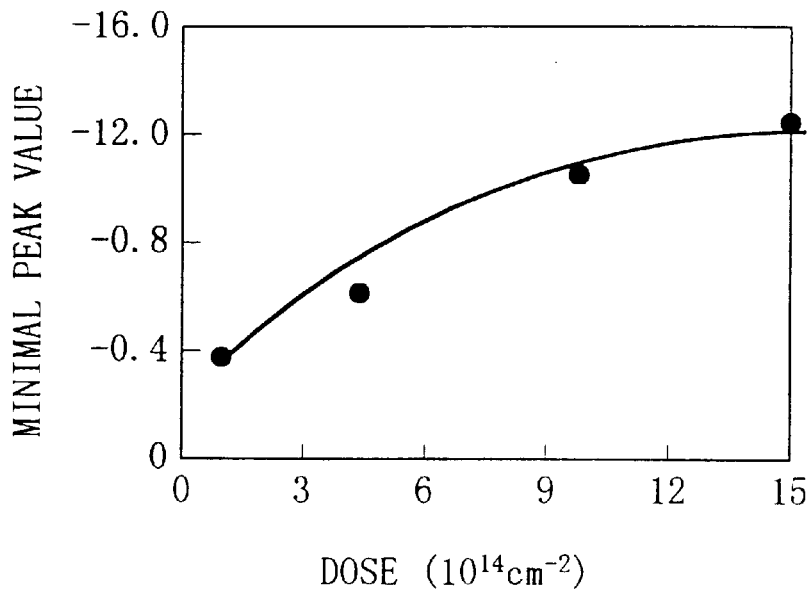
FIG. 21 shows the relationship between a dose for ion implantation and a minimal peak value in a seventh embodiment.

FIG. 21 shows a relationship between the minimal peak value in the spectral line of the change rate of reflectance obtained by actual monitoring and the dose for impurity introduction. Arsenic was used as the impurity in an experiment at respective doses of $1.0\times10^{15}$ cm$^{-2}$, $5.0\times10^{15}$ cm$^{-2}$, $5.0\times10^{14}$ cm$^{-2}$, and $1.0\times10^{14}$ cm$^{-2}$. In either case, energy for accelerating ions was 150 keV. The heat treatment was performed in an atmosphere of N$_2$ gas at 850° C. for 1 hour. FIG. 22 shows a spectrum of the change rate ($\Delta R/R$) of reflectance when the does is $1.0\times10^{15}$ cm$^{-2}$.

As can be seen from FIG. 21, the absolute value of a negative minimal peak value of the change rate of reflectance obtained from a sample with the impurity introduced thereto becomes larger with an increase in dose. This indicates that the impurity concentration is reflected in the change rate ($\Delta R/R$) of reflectance and hence the final impurity concentration in the substrate after heat treatment can be obtained by monitoring the change rate ($\Delta R/R$) of reflectance. By performing the implantation of impurity ions and heat treatment for diffusion till a given minimal peak value is reached, the impurity concentration in the n-type semiconductor region 101 can be adjusted precisely to a desired value.

Although the sixth and seventh embodiments have described the heat treatment process for recovery from a structural disorder resulting from a defect caused by the implantation of impurity ions, the heat treatment of the present invention is not limited thereto. The present invention is also applicable to a heat treatment process for recovery from a structural disorder resulting from a defect caused by etching or the like.

Instead of the optical monitor system shown in FIG. 8, the seventh embodiment can also use the optical monitor system shown in FIG. 11, according to the third embodiment, the optical monitor system shown in FIG. 12 according to the fourth embodiment, or the optical monitor system shown in FIG. 14 according to the fifth embodiment.

(Eighth Embodiment)

An apparatus and method for optically evaluating a semiconductor device (insulating film) according to an eight embodiment of the present invention will be described with reference to FIGS. 24 to 29.

FIG. 24 is a perspective view schematically showing the structure of a system for optically monitoring an insulating film according to the present embodiment. In the drawings are shown: a semiconductor substrate 701 as a wafer formed with a silicon oxide film; a wafer stage 702; an Xe lamp 703 as a second power source providing an output of 150 W; a polarizer 704; a detector 705 including an analyzer; probe light (measurement light) 706 from the Xe lamp 703; reflected probe light 707; a signal line 708 for transmitting a signal from the detector 705; an Ar ion laser 709 as a first light source providing an output of 5 W; a chopper 710 for modulating exciting light; exciting light 711 modulated by the chopper 710; a signal line 712 for transmitting a synchronizing signal for achieving synchronization with the modulation of the exciting light; and a control system 713. The detector 705 has been adapted to measure the intensity of the reflected probe light 707 of each wavelength to produce a continuous spectrum. The exciting light 711 is chopped by the chopper 710 with a frequency of 500 Hz and intermittently to a region under measurement of the semiconductor substrate 701 in a direction perpendicular to the surface of the semiconductor substrate 701. The chopper 710 has been adopted to operate in synchronization with the detector 705 for measuring the intensity of the reflected light.

Figure 25:
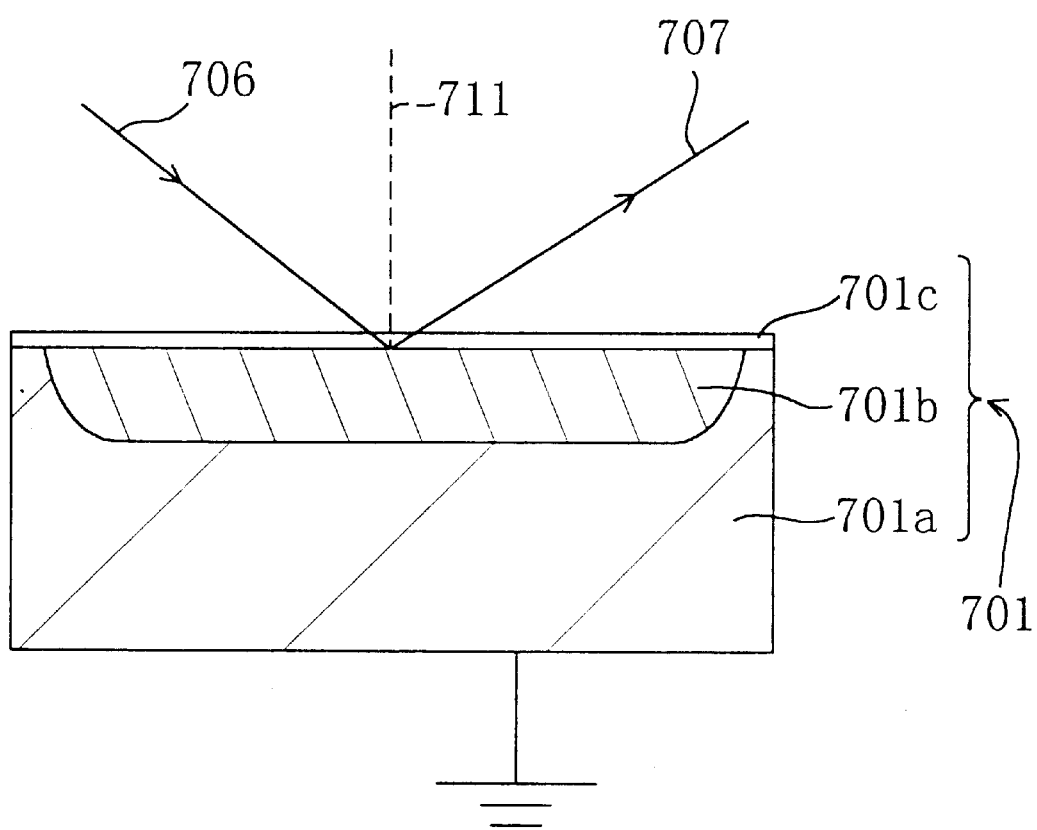
FIG. 25 is a a cross-sectional view showing the structure of an object under measurement used to perform optical evaluation in the eighth embodiment.

On the other hand, a silicon oxide film 701c has been formed by thermal oxidation at a temperature of, e.g., 850° C. on an n-type semiconductor region 701b as the region under measurement of the semiconductor substrate 701, as shown in FIG. 25. The probe light 706 passes through the silicon oxide film 701c to be incident upon the n-type semiconductor region 701b immediately under the silicon oxide film 701c and reflected by the surface of the n-type semiconductor region 701b. The reflected probe light 707 passes through the silicon oxide film 701c and emitted to the outside.

A chamber for performing thermal oxidation having a structure similar to that shown in FIG. 18 has been installed, though the drawings thereof is omitted in FIG. 24. The wafer stage 702 is disposed in the chamber formed with windows for transmitting the probe light 706, the reflected probe light 707, and the exciting light 711 therethrough.

A description will be given to the fundamental principle of optical-modulation reflectance spectrophotometry and to a method of measuring the change rate ($\Delta R/R$) of the intensity of the reflected probe light 707 according to the present embodiment.

In general, when a semiconductor is irradiated with light, an increased number of carriers are excited thereby. Thereafter, the carriers are extinguished while emitting light to return to the original energy levels. The change in the number of carriers changes a surface electric field in a semiconductor region so that the rate at which measurement light is reflected from the surface of the semiconductor region, i.e., the reflectance of the measurement light differs in the presence and absence of exciting light. If the magnitude of the change that should be caused in the electric field by irradiation with the exciting light varies depending on any property of the region under measurement, the property of the region under measurement can be evaluated by measuring the change rate of the reflectance of the measurement light. The present invention presumes the use of the technology of optical-modulation reflectance spectrophotometry.

In the present embodiment, therefore, a change in the intensity of the reflected probe light 707 is detected by intermittently irradiating the n-type semiconductor region 701b immediately under the silicon oxide film 701c on the semiconductor substrate 701 as the region under measurement with the exciting light 711 transmitted by the silicon oxide film 701c, while consistently irradiating the n-type semiconductor region 701b immediately under the silicon oxide film 701c with the probe light 706 in another direction transmitted by the silicon oxide film 701c. The value ($\Delta R/R$) obtained by dividing the difference $\Delta R$ between the respective intensities of the reflected probe light 707 in the presence and absence of the exciting light 711 by the reflection intensity R in the absence of the exciting light 711 is measured as the change rate of reflection intensity by the analyzing system 713. Since the change rate ($\Delta R/R$) of the reflection intensity has been used in place of reflectance based on the premise that the probe light 706 has a constant intensity, it is the change rate of reflectance that has a technical significance. The foregoing arrangement monitors variations in the change rate of the intensity of the reflected probe light. The display of the analyzing system 731 shown in FIG. 24 displays the spectrum of the change rate ($\Delta R/R$) of the intensity of the reflected measurement light as shown in the drawing.

Figure 26:
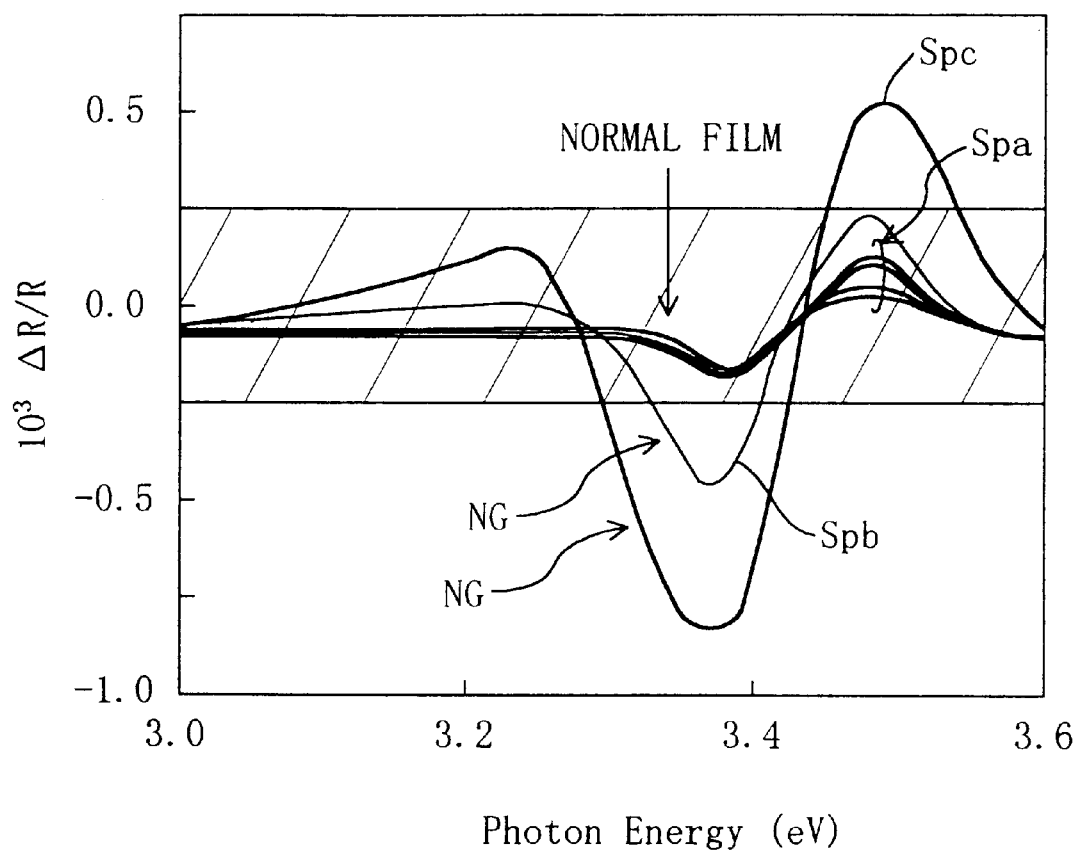
FIG. 26 shows spectra of individual signals each representing the change rate of the intensity of reflected probe light from a semiconductor region in the eight embodiment.
Figure 27:
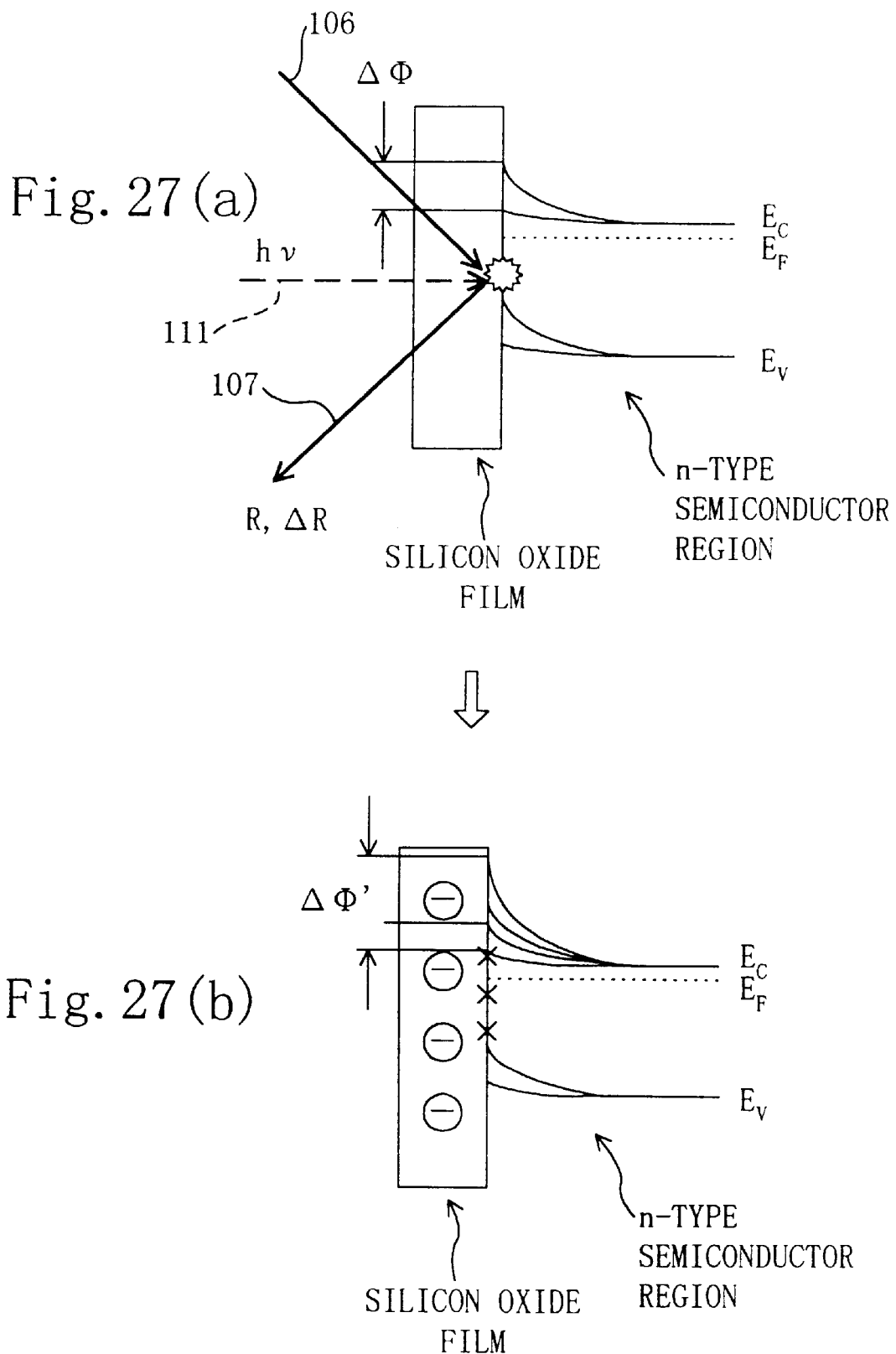
FIGS. 27(a) to 27(b) show energy bands in a silicon oxide film and in an n-type semiconductor region when exciting light has been supplied thereto and when no exciting light has been supplied thereto.

FIG. 26 shows the spectrum of the change rate ($\Delta R/R$) of reflection intensity measured by the detector 705. In the drawing, the curve Spa represents the spectrum of the change rate ($\Delta R/R$) of reflection intensity from the semiconductor substrate having a normal silicon oxide film and the curves Spb and Spc represent respective spectra of the change rates ($\Delta R/R$) of reflection intensities from semiconductor substrates having faulty silicon oxide films. The different configurations of the spectra of the change rates ($\Delta R/R$) of reflection intensities show that the change rate ($\Delta R/R$) of reflection intensity from the satisfactory semiconductor substrate is within a given range (the hatched region in FIG. 26), while the change rates ($\Delta R/R$) of reflection intensities from the semiconductor substrates having the faulty silicon oxide films have such large absolute values that they are not within the given range. The production of the different configurations of the spectra may be attributed to the following action.

As shown in FIG. 27(a), when the n-type semiconductor region immediately under the silicon oxide film is irradiated with the exciting light 711 transmitted by the silicon oxide film, carriers are generated in the n-type semiconductor region and the intensity of the surface electric field increases by $\Delta\Phi$ with the change in the number of carriers. As described above, the change $\Delta\Phi$ in the intensity of the surface electric field produces a difference between respective reflection intensities in the presence and absence of the exciting light. Since the silicon oxide film has been formed on the n-type semiconductor region, a defective layer for trapping the carriers is formed in the surface layer of the n-type semiconductor region. Accordingly, the variation in the reflectance of the measurement light should be reduced.

However, if trapped electrons exist in the silicon oxide film as shown in FIG. 27(b), the electrons causes a larger change $\Delta\Phi'$ in the intensity of the surface electric field in the n-type semiconductor region. As a result, the change rate ($\Delta R/R$) of the reflection intensity obtained from the n-type semiconductor region immediately under the silicon oxide film which contains numerous trapped electrons may have a value larger than the value of the change rate ($\Delta R/R$) of the reflection intensity obtained from the n-type semiconductor region immediately under the silicon oxide film which contains a reduced number of trapped electrons. Hence, numerous trapped electrons are present in the silicon oxide films on the semiconductor substrates providing the spectra Spb and Spc of the change rates ($\Delta R/R$) of reflection intensities which exhibit greater variations as shown in FIG. 26. It is known that more trapped electrons exist as a silicon oxide film has more defects. With a larger number of trapped electrons, a carrier path resulting from a dielectric breakdown are more likely to occur, resulting in an insulating film with a shorter lifetime.

Figure 28:
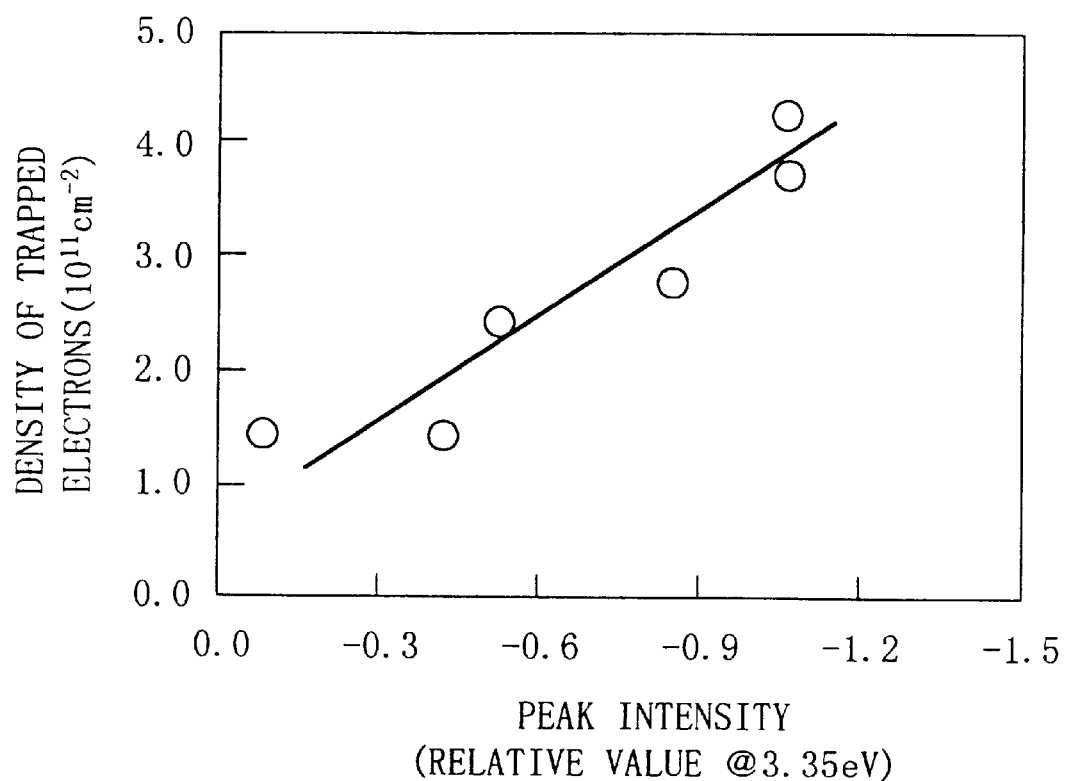
FIG. 28 shows the relationship between the peak intensity of a spectrum of the change rate of the intensity of reflected probe light and the density of trapped electrons in an oxide film.

To endorse the foregoing inference, the present inventors conducted an experiment in which electric stresses having various magnitudes were applied to a silicon oxide film with a thickness of about 2 to 4 nm to obtain data shown in FIG. 28. FIG. 28 shows the relationship between the peak intensity in the spectrum of the change rate ($\Delta R/R$) of reflection intensity and the density of trapped electrons in each of the oxide films obtained by measuring respective capacitances with the use of a mercury prober. In the drawing, the vertical axis indicates the density of trapped electrons ($\times 10^{11}$ cm$^2$) and the horizontal axis indicates the minimal peak signal intensity expressed in relative values (corresponding to a wavelength around 375 nm) in the spectrum of the change rate ($\Delta R/R$) of reflection intensity at a value in the vicinity of 3.35 eV. As shown in FIG. 28, the density of trapped electrons becomes higher as the absolute value of the peak signal intensity becomes higher, which allows judgment of the silicon oxide film to be no good (i.e., having numerous trapped electrons therein) when the absolute value of the change rate ($\Delta R/R$) of reflection intensity is not within the given range.

The judgment of a gate oxide film to be no good when the change rate ($\Delta R/R$) (absolute value) of the reflection intensity is equal to or more than a specified value is consistent with a cause-and-effect relation empirically obtained, whether the foregoing inference is theoretically correct or not. Hence, the quantity of trapped electrons can be specified by monitoring the change rate ($\Delta R/R$) of reflection intensity, which allows optical control of the electric property of an insulating film.

Next, a description will be given to an example of process control executed over the process of manufacturing a semiconductor device based on the result of such optical evaluation.

Figure 29:
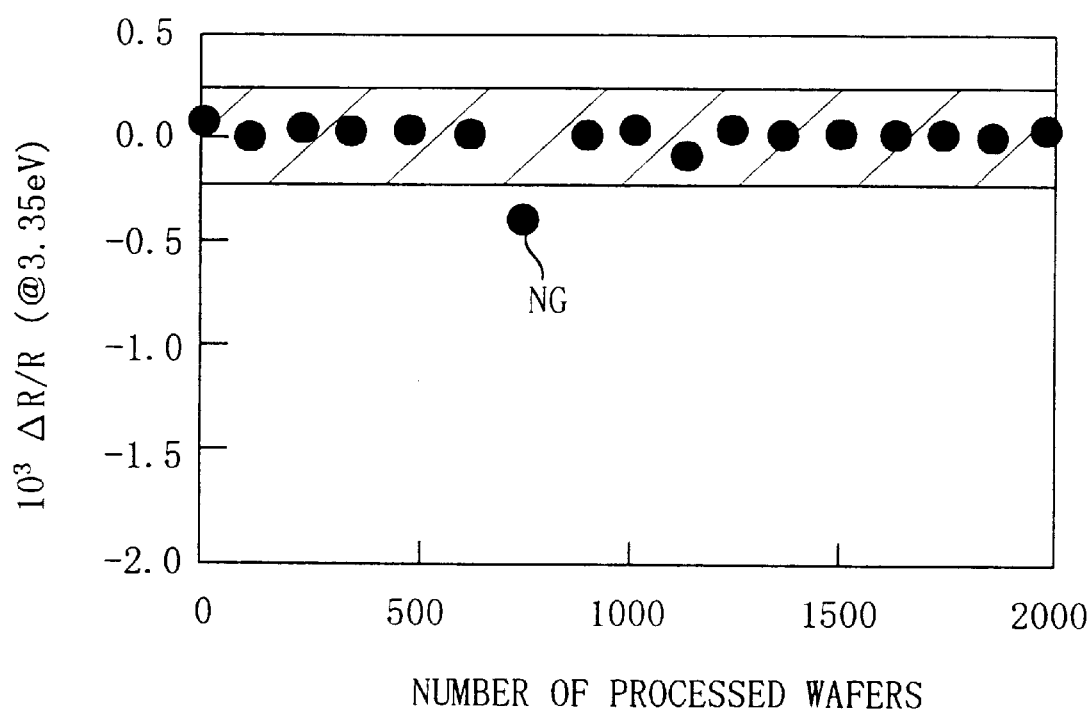
FIG. 29 shows the relationship between the number of processed wafers and the change rate of reflection intensity in the vicinity of 3.35 eV when an optical evaluation method according to the eight embodiment is used to control an oxidation process for forming a prototype.

As shown in FIG. 29, process control is executed over the process of forming the prototype of a silicon oxide film on a semiconductor substrate (wafer) by thermal oxidation by judging the resulting silicon oxide film to be good when the peak value in the spectrum of the change rate ($\Delta R/R$) of reflection intensity is within a range of $-0.25 \times 10^{-3}$ to $0.25 \times 10^{-3}$ or to be no good if it is not within the range. In the drawing, the horizontal axis indicates the number of processed wafers and the vertical axis indicates the peak value of the change rate ($\Delta R/R$) of reflection intensity at a value in the vicinity of 3.35 eV. When monitoring was performed once for every 125 oxide films, a signal changed remarkably in monitoring the 750th wafer, which was sporadic trouble. The time tbd (lifetime value) during which a voltage Vg of $-6.6$ V was constantly applied to the gate till a gate oxide film was destroyed, which is the property indicative of the reliability of the gate oxide film, was about 100 seconds. Since a normal lifetime value tbd is $10^4$ seconds or more, the lifetime value of about 100 seconds is extremely low. In this case, the cause of trouble was removed by prompt troubleshooting, which had prevented the occurrence of a potential defect. By thus controlling the manufacturing process through evaluation of an optical property, the present invention can perform prompter troubleshooting than the conventional embodiment that has controlled the manufacturing process through evaluation of an electric property. In the process of forming the prototype of a sample and in the process of manufacturing a MOS device, the degradation of production yield can be prevented effectively.

It is to be noted that, if the relationship between a proper range of capacitances (electric property) corresponding to a proper density of trapped electrons and a proper range of change rates ($\Delta R/R$) of reflection intensity corresponding to the proper range of capacitances, manufacturing conditions can be controlled such that the change rate ($\Delta R/R$) of reflection intensity surely falls in the proper range.

Instead of the optical monitor system shown in FIG. 24, the present embodiment can also use the optical monitor system shown in FIG. 8 according to the second embodiment, the optical monitor system shown in FIG. 11 according to the third embodiment, the optical monitor system shown in FIG. 12 according to the fourth embodiment, and the optical monitor system shown in FIG. 14 according to the fifth embodiment.

In the optical monitor system used in the present embodiment, measurement light of a wavelength of 600 nm or less is preferably supplied to the semiconductor region by selecting a light source for the measurement light or by attaching a filter. Since light of a wavelength in such a range enters the semiconductor region to reach a point at a depth of several tens of nanometers at most, optical evaluation can be performed with high sensitivity based on the difference between the intensities of reflected light from a surface region susceptible to the influence of trapped electrons contained in an insulating film such as a silicon oxide film.

(Ninth Embodiment)

Figure 30A:
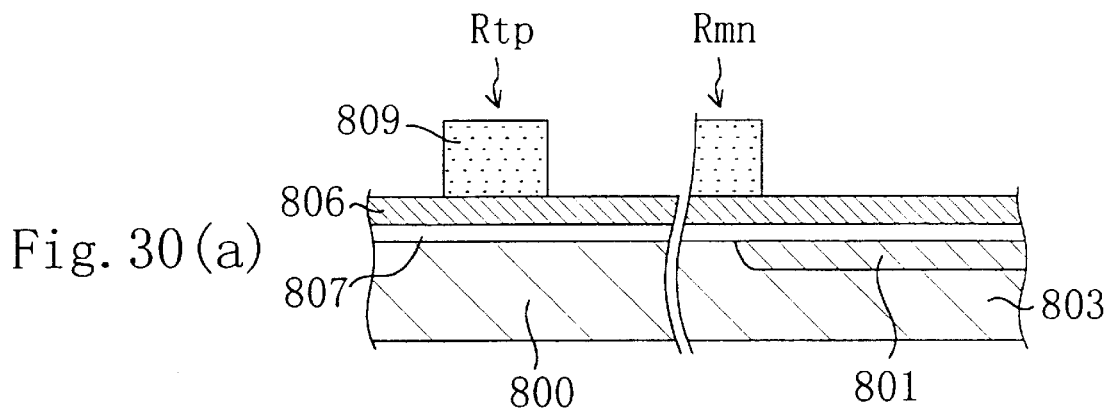
FIGS. 30(a) to 30(c) are cross-sectional views of a wafer during the process of manufacturing a semiconductor device according to a ninth embodiment.
Figure 30B:
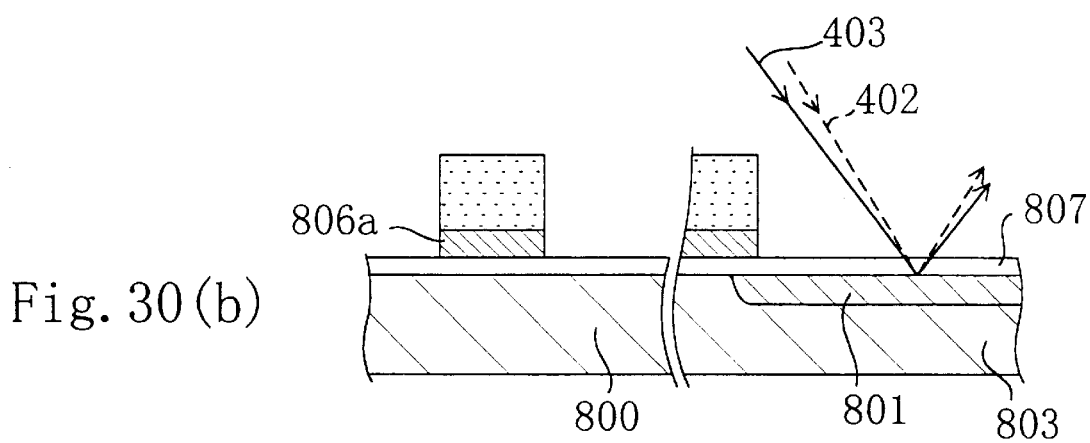
Figure 30C:
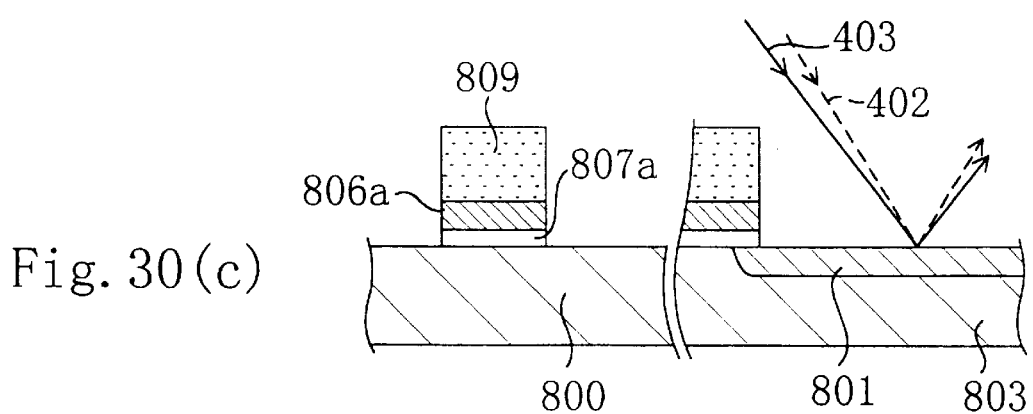

A ninth embodiment of the present invention will be described. FIGS. 30(a) to 30(c) are cross-sectional views of a wafer in the process of patterning a gate electrode and a gate oxide film. However, the present embodiment assumes the use of the etching apparatus shown in FIG. 4 according to the first embodiment to pattern the gate electrode and the gate oxide film.

First, an impurity at a concentration for threshold control has been introduced into a chip region Rtp provided in the top surface of a wafer 803 to form a first semiconductor region 800 prior to the step illustrated in FIG. 30(a). A MOS transistor as a semiconductor element is formed in the first semiconductor region 800. On the other hand, an n-type impurity has been introduced into a region for monitoring Rmn having an area of 13×13 $\mu m^2$ and provided in the top face of the wafer 803 to form a second semiconductor region 801 (with a resistivity of about 0.02 Ωm). A gate oxide film 807 with a thickness of, e.g., 6 nm and a gate electrode film 806 made of polysilicon have been deposited over the entire surface of a substrate. On the gate electrode film 806, there has been formed a photoresist mask 809, in a pattern for forming a gate electrode. The photoresist mask 809 has several openings including one corresponding to the second semiconductor region 801.

In the step illustrated in FIG. 30(b), the gate electrode film 806 is removed by dry etching (plasma etching) using the photoresist mask 809 to form a gate electrode 806a. After the gate electrode film 806 is removed from the second semiconductor region 801, the gate oxide film 807 is exposed in the second semiconductor region 801.

At this stage, the exciting light 402 and the probe light 403 are supplied to the second semiconductor region 801 through the gate oxide film 807. As for the exciting light 402, it is supplied intermittently. Then, as described above, a reflection-intensity monitor system 220 shown in FIG. 4 calculates the change rate (ΔR/R) of reflection intensity by dividing the difference ΔR between respective reflection intensities of the probe light 403 in the presence and absence of the exciting light 402 by the reflection intensity R in the absence of the exciting light 402. The foregoing arrangement monitors variations in the change rate of reflection intensity.

Next, in the step illustrated in FIG. 30(c), the patterning of the gate oxide film 807 is completed with the gate oxide film 807a remaining immediately under the gate electrode 806a. The present embodiment has been implemented by focusing attention on the fact that the change rate (ΔR/R) of the reflectance of the probe light in the second semiconductor region 801 is larger at the completion of etching than at the time shown in FIG. 30(b).

Figure 31:
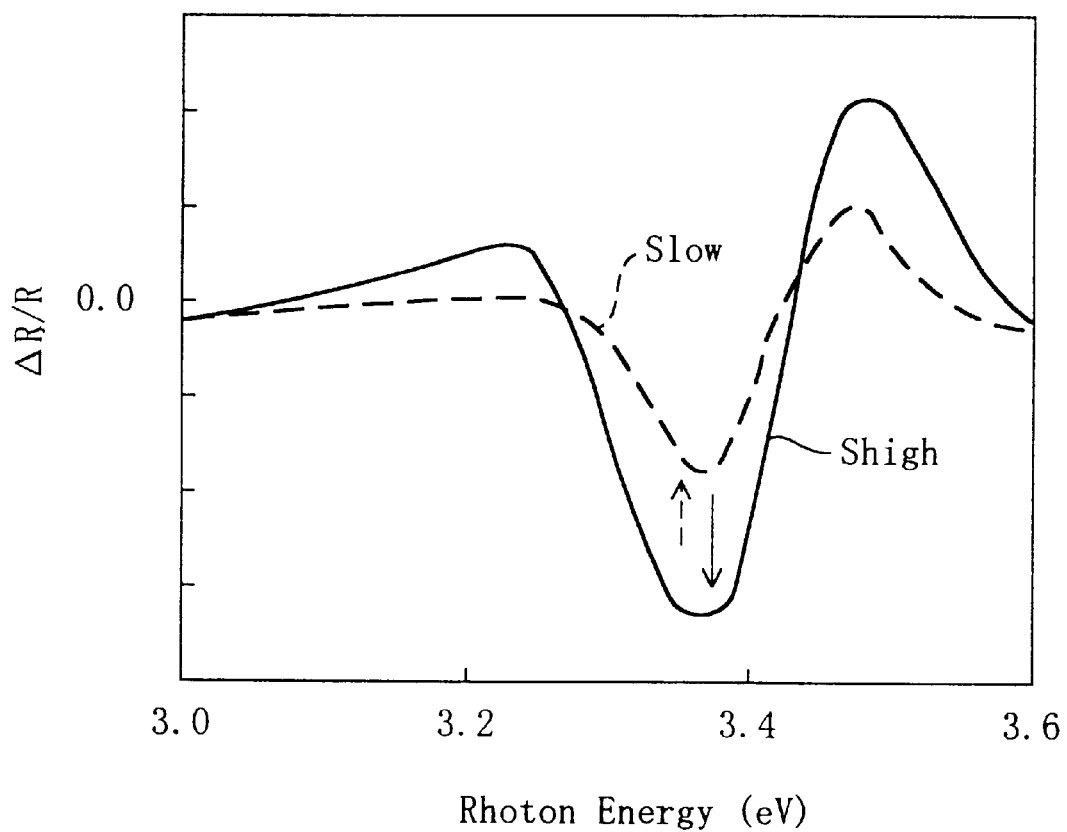
FIG. 31 shows different spectral lines each representing the change rate of the reflectance of measurement light in the ninth embodiment.

FIG. 31 shows spectral lines indicative of the change rate (ΔR/R) of the reflectance of the probe light during the process of removing the gate oxide film. When the gate oxide film is present as shown in FIG. 30(b), a spectral line having a peak value which is large in absolute value is obtained due to trapped electrons contained in the gate oxide film. However, as the removal of the gate oxide film proceeds, a spectral line having a peak value which is smaller in absolute value (such as the spectral line $S_{low}$ shown in FIG. 31) is obtained. When the removal of the gate oxide film further proceeds, the absolute value of the peak value is increased conversely since the number of trapped electrons is minimized and the damaged layer is barely left in the silicon substrate. At the time at which the removal of the gate oxide film is completed as shown in FIG. 30(c), the spectral line $S_{high}$ having a large peak value is obtained. By thus monitoring the change rate (ΔR/R) of the reflectance of the probe light, it becomes possible to detect the time at which the substrate has a minimum amount of damage and the removal of the gate oxide film is completed. This achieves control over the dry-etching process such that it is terminated at the time at which the removal of the gate oxide film is completed, resulting in minimum damage to the silicon substrate.

The method of controlling an etching process according to the present embodiment is not only applicable to an etching process for removing the gate oxide film but also to an etching process for removing another insulating film unless the thickness of the insulating film to be removed is so large that effective sensitivity is not achieved.

(Tenth Embodiment)

A tenth embodiment of the present invention will be described. The present embodiment is applicable to the process of impurity introduction for forming source/drain regions in a first semiconductor region 800 at a stage as shown in FIG. 30(c) according to the ninth embodiment, though the drawing of a wafer is omitted.

Figure 32:
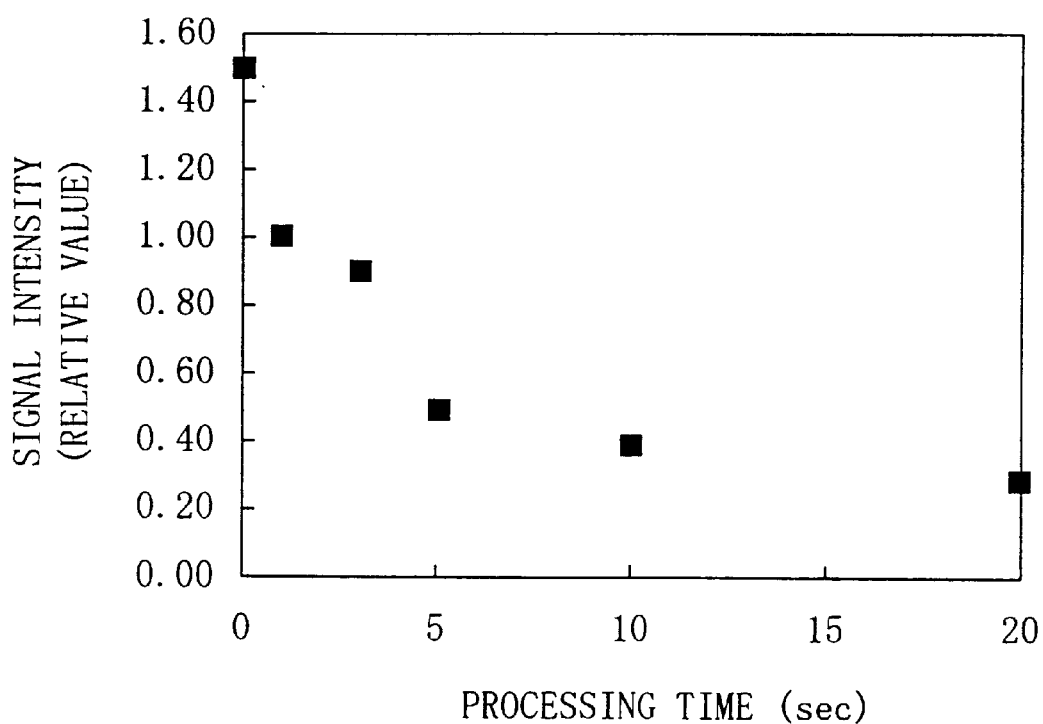
FIG. 32 shows the relationship between a processing time for plasma doping and the peak intensity of the change rate of the reflectance of measurement light in a tenth embodiment.

FIG. 32 shows the result of monitoring a change rate (ΔR/R) of the reflectance of probe light in the process of introducing an impurity into a semiconductor region by performing plasma doping using a gas mixture of $BF_2$ and He under a pressure of 10 mTorr. In the drawing, the horizontal axis indicates the processing time and the vertical axis indicates the signal intensity (relative value) of the minimal peak value expressed in absolute values. As shown in the drawing, the signal intensity is gradually lowered as the introduction of the impurity proceeds, which indicates defects produced in the semiconductor region by impurity introduction. The impurity can be introduced at a desired concentration by terminating the introduction of the impurity at the time at which the change rate (ΔR/R) of the reflectance of the probe light has been reduced at a predetermined rate or has become smaller by a specified value than the initial value or by obtaining a signal intensity corresponding to the desired impurity concentration by preliminary experiment and halting the introduction of the impurity at the time at which the signal intensity is reached.

The introduction of the impurity by plasma doping or ion implantation is followed by heat treatment. The impurity concentration after the heat treatment is provided by optical-modulation reflectance spectrophotometry performed subsequently to the heat treatment with a view to obtaining the change rate (ΔR/R) of the reflectance of the measurement light. As a result, it becomes possible to determine the conditions for impurity introduction (such as the dose for ion implantation, energy for ion implantation, and RF power used for plasma doping) in advance by preliminary experiment and thereby achieve the proper impurity concentration. In particular, if the impurity concentration of the semiconductor region prior to impurity introduction is measured in advance by in-line optical-modulation reflectance spectrophotometry, the impurity can ben introduced with higher precision.

It is to be noted that a region for monitoring for optical evaluation can also be provided in a region other than a region to be formed with a semiconductor element in the present embodiment.

(Other Embodiments)

The Xe lamp, polarizer, detector, and the like of the optical monitor system used in each of the foregoing embodiments may be constituted by the components of an ellipsometric spectroscope currently used to measure the thickness of an oxide film. In this case, optical evaluation according to the present invention can be performed by additionally providing the Ar ion laser, the chopper, and the control system.

Although each of the foregoing embodiments has described the case of forming the MOS transistor by way of example, the present invention is also applicable to the case of forming other devices such as a bipolar transistor and a MESFET to be formed on a compound semiconductor substrate.

We claim:

1. A semiconductor device comprising:

a substrate having a semiconductor layer;

a first impurity diffusion layer including a dopant, which is formed in said semiconductor layer as a part of a semiconductor element;

an interlayer insulating film formed on said semiconductor layer;

a contact hole passing through said interlayer insulating film, which reaches said first impurity diffusion layer;

a second impurity diffusion layer including a dopant having the same conductivity as the dopant of said first impurity diffusion layer, said second impurity diffusion layer configured to allow for optical monitoring thereof so as to provide for monitoring of the physical state of said first impurity diffusion layer during the formation of said contact hole; and an opening passing through said interlayer insulating film which reaches said second impurity diffusion layer and which is formed simultaneously with said contact hole, wherein said second impurity diffusion layer is provided in a region other than a region to be formed with a semiconductor chip including said semiconductor element, and said second impurity diffusion layer has an impurity concentration which is greater than an impurity concentration of said first impurity diffusion layer.

2. A semiconductor device according to claim 1, wherein said second impurity diffusion layer is composed of a semiconductor material to be used for monitoring by optical-modulation reflectance spectrophotometry.

3. A semiconductor device comprising:

a substrate having a semiconductor layer;

a first impurity diffusion layer including a dopant, which is formed in said semiconductor layer as a part of a semiconductor element;

an interlayer insulating film formed on said semiconductor layer;

a contact hole passing through said interlayer insulating film, which reaches said first impurity diffusion layer;

a second impurity diffusion layer including a dopant having the same conductivity as the dopant of said first impurity diffusion layer, said second impurity diffusion layer configured to allow for optical monitoring thereof so as to provide for monitoring of the physical state of said first impurity diffusion layer during the formation of said contact hole; and an opening passing through said interlayer insulating film which reaches said second impurity diffusion layer and which is formed simultaneously with said contact hole, wherein said second impurity diffusion layer is provided in a region to be formed with a semiconductor chip including said semiconductor element, and said second impurity diffusion layer has an impurity concentration which is greater than an impurity concentration of said first impurity diffusion layer.

4. A semiconductor device according to claim 3, wherein said second impurity diffusion layer is composed of a semiconductor material to be used for monitoring by optical-modulation reflectance spectrophotometry.

5. A semiconductor device comprising:

a substrate having a semiconductor layer, said substrate having a first section and a second section;

a first impurity diffusion layer including a dopant, which is formed in said first section of said semiconductor layer as a part of a semiconductor element;

an interlayer insulating film formed on said semiconductor layer;

a contact hole passing through said interlayer insulating film, which reaches said first impurity diffusion layer;

a second impurity diffusion layer including a dopant having the same conductivity as the dopant of said first impurity diffusion layer, said second impurity diffusion layer formed in said second section of said substrate, said second section of said substrate configured to allow for optical monitoring of said second impurity diffusion layer so as to provide for monitoring of the physical state of said first impurity diffusion layer during the formation of said contact hole; and an opening passing through said interlayer insulating film which reaches said second impurity diffusion layer and which is formed simultaneously with said contact hole, wherein said second impurity diffusion layer has an impurity concentration which is greater than an impurity concentration of said first impurity diffusion layer.

6. A semiconductor device according to claim 5, wherein said second impurity diffusion layer is composed of a semiconductor material to be used for monitoring by optical-modulation reflectance spectrophotometry.

* * * * *